(12) United States Patent
Bayindir et al.

(10) Patent No.: US 8,098,966 B2
(45) Date of Patent: Jan. 17, 2012

(54) THERMAL SENSING FIBER DEVICES

(75) Inventors: Mehmet Bayindir, Ankara (TR); Fabien Soren, Cambridge, MA (US); Ayman F. Abouraddy, Winter Park, FL (US); Ofer Shapira, Cambridge, MA (US); Jerimy R. Arnold, Cambridge, MA (US); Yoel Fink, Brookline, MA (US); John D Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/818,233

(22) Filed: Jun. 18, 2010

(65) Prior Publication Data

US 2010/0316088 A1     Dec. 16, 2010

Related U.S. Application Data

(60) Division of application No. 12/380,929, filed on Mar. 5, 2009, now Pat. No. 7,805,029, which is a division of application No. 11/529,111, filed on Sep. 28, 2006, now Pat. No. 7,567,740, which is a continuation-in-part of application No. 10/890,948, filed on Jul. 14, 2004, now Pat. No. 7,295,734.

(60) Provisional application No. 60/721,277, filed on Sep. 28, 2005, provisional application No. 60/758,427, filed on Jan. 12, 2006, provisional application No. 60/487,125, filed on Jul. 14, 2003, provisional application No. 60/539,470, filed on Jan. 27, 2004.

(51) Int. Cl.
*G02B 6/00* (2006.01)
*G02B 6/12* (2006.01)
*G02B 6/44* (2006.01)

(52) U.S. Cl. ............................. 385/12; 385/14; 385/101

(58) Field of Classification Search .............. 385/12–14, 385/101
See application file for complete search history.

(56) References Cited

U.S. PATENT DOCUMENTS 3,877,912 A    4/1975    Shiraishi et al.
(Continued)

FOREIGN PATENT DOCUMENTS

DE    4123870 A1    1/1993
(Continued)

OTHER PUBLICATIONS

Miyagi et al., "Fabrication of germanium-coated nickel hollow waveguides for infrared transmission," Appl. Phys. Lett., V. 43, N. 5, pp. 430-432, Sep. 1, 1983.

(Continued)

*Primary Examiner* — Rhonda Peace
(74) *Attorney, Agent, or Firm* — Therese A. Lober

(57) ABSTRACT

There is provided a thermal sensing fiber grid, including a plurality of rows and columns of thermal sensing fibers, each of which includes a semiconducting element that has a fiber length and that is characterized by a bandgap energy corresponding to a selected operational temperature range of the fiber in which there can be produced a change in thermally-excited electronic charge carrier population in the semiconducting element in response to a temperature change in the selected temperature range. There is included at least one pair of conducting electrodes in contact with the semiconducting element along the fiber length, and an insulator along the fiber length. An electronic circuit is provided for and connected to each thermal sensing fiber for producing an indication of thermal sensing fiber grid coordinates of a change in ambient temperature.

19 Claims, 20 Drawing Sheets

U.S. PATENT DOCUMENTS

| | | | |
|---|---|---|---|
| 3,901,996 | A | 8/1975 | Hasegawa et al. |
| 4,381,141 | A | 4/1983 | Sakuragi et al. |
| 4,410,345 | A | 10/1983 | Usui et al. |
| 4,614,024 | A | 9/1986 | Davis |
| 4,890,898 | A | 1/1990 | Bentley et al. |
| 4,978,377 | A | 12/1990 | Brehm et al. |
| 5,006,671 | A | 4/1991 | Boeke |
| 5,042,903 | A | 8/1991 | Jakubowski |
| 5,043,369 | A | 8/1991 | Bahn et al. |
| 5,127,928 | A | 7/1992 | Farries et al. |
| 5,144,690 | A | 9/1992 | Domash |
| 5,158,588 | A | 10/1992 | Pauling |
| 5,200,390 | A | 4/1993 | Howng |
| 5,215,565 | A | 6/1993 | Urano et al. |
| 5,229,357 | A | 7/1993 | Onishi et al. |
| 5,248,656 | A | 9/1993 | Nagesh et al. |
| 5,483,414 | A * | 1/1996 | Turtiainen .................... 361/282 |
| 5,551,967 | A | 9/1996 | Urruti |
| 5,557,698 | A | 9/1996 | Gareis et al. |
| 5,655,046 | A | 8/1997 | Todoroki et al. |
| 5,726,232 | A | 3/1998 | Egami et al. |
| 5,815,627 | A | 9/1998 | Harrington |
| 5,925,159 | A | 7/1999 | Geisel |
| 6,078,707 | A | 6/2000 | Yamamoto et al. |
| 6,080,690 | A * | 6/2000 | Lebby et al. .................. 442/209 |
| 6,110,592 | A | 8/2000 | Grizante et al. |
| 6,111,999 | A | 8/2000 | Espindola et al. |
| 6,189,342 | B1 | 2/2001 | Berkey |
| 6,198,377 | B1 | 3/2001 | Yamazaki et al. |
| 6,239,422 | B1 | 5/2001 | Vang et al. |
| 6,259,830 | B1 | 7/2001 | Bhagavatula |
| 6,317,531 | B1 | 11/2001 | Chen et al. |
| 6,381,482 | B1 * | 4/2002 | Jayaraman et al. ........... 600/388 |
| 6,418,248 | B1 | 7/2002 | Hayes |
| 6,498,652 | B1 * | 12/2002 | Varshneya et al. ............ 356/477 |
| 6,573,813 | B1 | 6/2003 | Joannopoulos et al. |
| 6,671,097 | B2 | 12/2003 | Fink et al. |
| 6,756,576 | B1 | 6/2004 | McElroy et al. |
| 6,856,733 | B2 | 2/2005 | Zheng |
| 6,984,598 | B1 | 1/2006 | Hilton, II |
| 7,054,513 | B2 | 5/2006 | Herz et al. |
| 7,292,758 | B2 * | 11/2007 | Bayindir et al. .............. 385/101 |
| 7,295,734 | B2 * | 11/2007 | Bayindir et al. .............. 385/101 |
| 7,463,040 | B2 * | 12/2008 | Qi et al. ........................ 324/693 |
| 7,567,740 | B2 * | 7/2009 | Bayindir et al. .............. 385/101 |
| 7,805,029 | B2 * | 9/2010 | Bayindir et al. ................. 385/12 |
| 2002/0022829 | A1 | 2/2002 | Nagase et al. |
| 2002/0081714 | A1 | 6/2002 | Jain et al. |
| 2002/0084901 | A1 * | 7/2002 | Mantyjarvi et al. ........ 340/573.1 |
| 2002/0185968 | A1 | 12/2002 | Ohkubo |
| 2003/0049003 | A1 | 3/2003 | Ahmad et al. |
| 2003/0231846 | A1 | 12/2003 | Fajardo et al. |
| 2004/0179796 | A1 | 9/2004 | Jakobsen et al. |
| 2004/0179806 | A1 | 9/2004 | Block et al. |
| 2004/0223715 | A1 | 11/2004 | Benoit et al. |
| 2004/0258376 | A1 | 12/2004 | Fokine et al. |
| 2005/0024512 | A1 | 2/2005 | Moini et al. |
| 2005/0040374 | A1 | 2/2005 | Chittibabu et al. |
| 2005/0081913 | A1 * | 4/2005 | Ebbesen et al. ................ 136/291 |
| 2005/0157997 | A1 | 7/2005 | McCarthy et al. |
| 2005/0211294 | A1 | 9/2005 | Chittibabu et al. |
| 2006/0042323 | A1 | 3/2006 | Kornreich et al. |
| 2006/0201206 | A1 | 9/2006 | Benoit et al. |

FOREIGN PATENT DOCUMENTS

| | | | |
|---|---|---|---|
| WO | WO 2004/052078 | A2 | 6/2003 |
| WO | WO 02/061467 | A2 | 9/2003 |
| WO | WO 03/079073 | A1 | 9/2003 |
| WO | WO 03/093884 | A2 | 11/2003 |
| WO | WO 2005/049513 | A2 | 6/2005 |
| WO | WO 2006/014360 | A2 | 2/2006 |

OTHER PUBLICATIONS

Matsuura et al., "Hollow glass waveguides with three-layer dielectric coating fabricated by chemical vapor deposition," J. Opt. Soc. Am. A, V. 14, N. 6, pp. 1255-1259, Jun. 1997.

Van Eijkelenborg et al., "Recent progress in microstructured polymer optical fibre fabrication and characterisation," Optical Fiber Tech., V. 9, pp. 199-209, 2003.

Large et al., "Microstructured optical fibres: why use polymers?" Proc. 29th European Conf. on Opt. Comm. (ECOC '03 Rimini, Italy), pp. 1014-1017, 2003.

Bayindir et al., "Metal-insulator-semiconductor optoelectronic fibres," Nature, V. 431, pp. 826-829, Oct. 14, 2004.

Patent Abstracts of Japan, vol. 005, No. 154, p. 82, Jul. 15, 1981.

Szukwei et al., "Crystallization behaviour of chalcogenide glasses containing Sn," Jnl. of Non-Crystalline Solids, vol. 112, Nos. 1/3, pp. 204-206, Oct. 1, 1989.

Popescu, "Structure Modeling of Chalcogenide vitreous films by computational chemistry program," Internet Article, XP002360983, URL: http://www.mir.acad.md/abstract/mjps2002,v1,nr2/abs130.html, p. 1 of 1, 2002.

Kanamori et al., "Chalcogenide Glass Fibers for Mid-Infrared Transmission," Jnl. of Lightwave Technology, vol. LT-2, No. 5, pp. 607-613, Oct. 1984.

Monro et al., "Chalcogenide Holey Fibers," Electronic Letters, vol. 36, No. 24, pp. 1998-2000, Nov. 2000.

Croitoru et al., "Mechanical and Optical Properties of the Chalcogenide Glass System As2Se (3-x)Tex," Jnl. of Lightwave Technology, vol. LT-5, No. 11, pp. 1637-1641, Nov. 1987.

Hogan, "A lighter approach to computer control," New Scientist, http://www.newscientist.com/article/dn6530, pp. 1-2, Oct. 13, 2004.

Dume, "Composite fibres light up," http://www.physicsweb.org, and http://physicsworld.com/cws/article/news/20528, pp. 1-2, Oct. 13, 2004.

Venema, "A light fabric," Nature, vol. 431, p. 749, Oct. 14, 2004.

Thomson, "MIT's novel fabrics see the light," MIT Tech Talk, p. 5, Oct. 20, 2004.

Sealy, "Shedding light on smart fabrics," Materials Today, p. 9, Dec. 2004.

Overton, "Optoelectronic fibers transmit photons and electrons," Laser Focus World, pp. 15 & 18, Dec. 2004.

Bayindir et al., "Fiber Photodetectors Codrawn From Conducting, Semiconducting, and Insulating Materials," Optics in 2004, Optics & Photonics News, p. 14 & 24, Dec. 2004.

Sorin et al., "Metal-insulator-semiconductor optoelectronic fibers," Presentation Slides, American Ceramic Society, Baltimore, MD, pp. 1-6, Apr. 12, 2005.

"Photodetecting Fiber Webs," MIT RLE Progress Report, No. 146, pp. 31-1-31-2, Feb. 2005.

Lide, Handbook of Chemistry and Physics, 79th Edition, CRC Press, New York, NY, p. 12-127, 1998.

Swager, "Polymer Light-Emitting Devices: Light from Insulated Organic Wires," Nature Materials, vol. 1, pp. 151-152, Nov. 2002.

El-Sayed, "Far-infrared Studies of the Amorphous SbxGe28-xSe72 Glassy Semiconductor," Semiconductor Science and Technology, vol. 18, pp. 337-341, Mar. 3, 2003.

Bayindir et al., "Novel Optoelectronic Fibers Codrawn from Conducting, Semiconducting, and Insulating Materials, " 2005 Conference on Lasers & Electro-Optics (CLEO), vol. 3, pp. 1686-1687, May 22-27, 2005.

PCT/US2004/022501, International Search Report and Written Opinion of the International Searching Authority, Form PCT/ISA/210: First Sheet and Continuation of First Sheet (2)-(3), Form PCT/ISA/210: Second Sheet and Continuation of Second Sheet, PCT/ISA/210: Further information, Sheet 1-Sheet 2, PCT/ISA/210: patent family annex sheet, Form PCT/ISA/237: cover sheet, Form PCT/ISA/237: Sheet 1-Sheet 2, Form PCT/ISA/237: (separate sheet) sheet 1-sheet 2, May 20, 2005.

PCT/US2005/023556, International Search Report and Written Opinion of the International Searching Authority, Form PCT/ISA/210: First Sheet and Form PCT/ISA/237: cover sheet, Form PCT/ISA/237: Sheet 1-Sheet 3, Form PCT/ISA/237: (separate sheet) sheet 1-sheet 6, Apr. 7, 2006.

PCT/US2006/037983, International Search Report and Written Opinion of the International Searching Authority, Form PCT/ISA/210: First Sheet and Continuation of First Sheet (3), Form PCT/ISA/210: Second Sheet and Continuation of Second Sheet, PCT/ISA/210: patent family annex sheet, Form PCT/ISA/237: cover sheet, Form PCT/ISA/237: Sheet 1-Sheet 2, Form PCT/ISA/237: (separate sheet) sheet 1-sheet 3, Feb. 14, 2007.

Benoit et al., "Static and Dynamic Properties of Optical Microcavities in Photonic Bandgap Yarns," Advanced Mater., vol. 14, No. 24, pp. 2053-2055, Dec. 2003.

Bayindir et al., "Integrated fibres for self-monitored optical transport," nature materials, vol. 4, pp. 820-825, Nov. 2005.

Bayindir et al., "Thermal-Sensing Fiber Devices by Multimaterial Codrawing," Advanced Mater., vol. 18, pp. 845-849, 2006.

Hart, "Multilayer Composite Photonic Bandgap Fibers," Ph.D. Thesis, Massachusetts Institute of Technology, Cambridge, MA, pp. 1-124, Jun. 2004.

Bayindir et al., "Kilometer-Long Ordered Nanophotonic Structures by Preform-to-Fiber Fabrication," IEEE Jnl. of Selected Topics in Quantum Electronics, vol. 12, Issue 6, pp. 1202-1213, Nov. 2006.

* cited by examiner

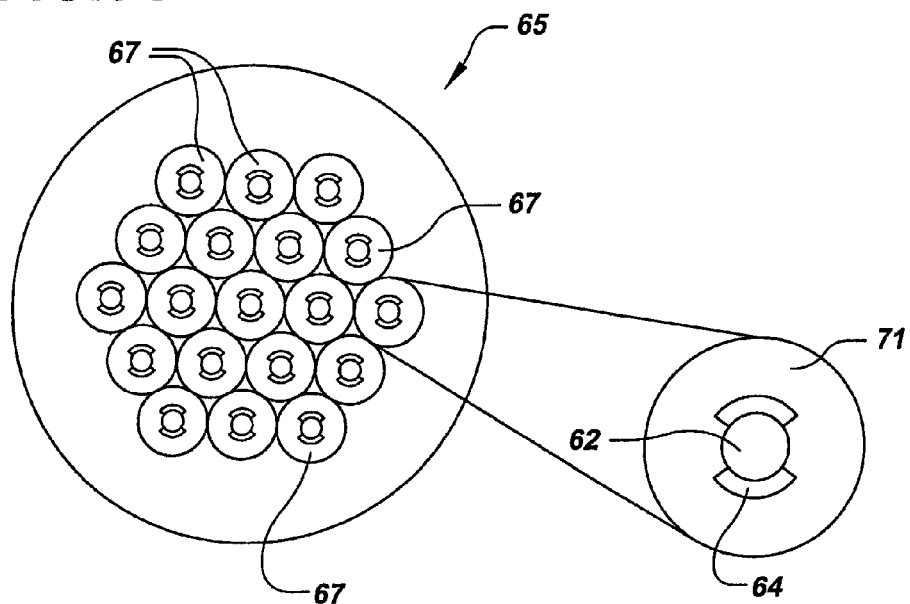
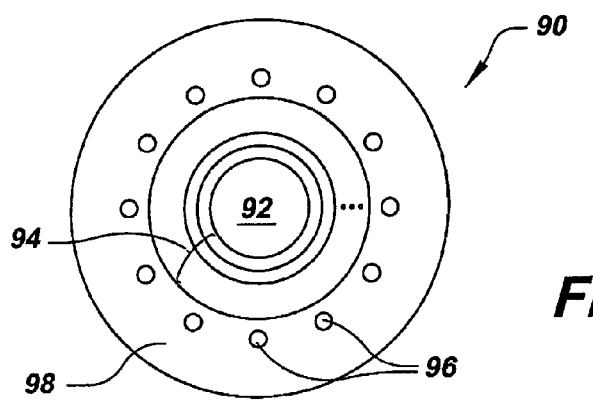
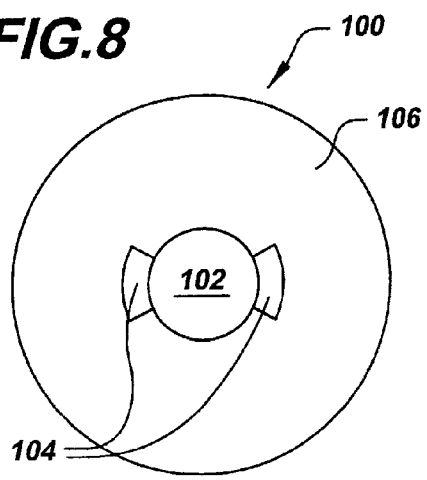

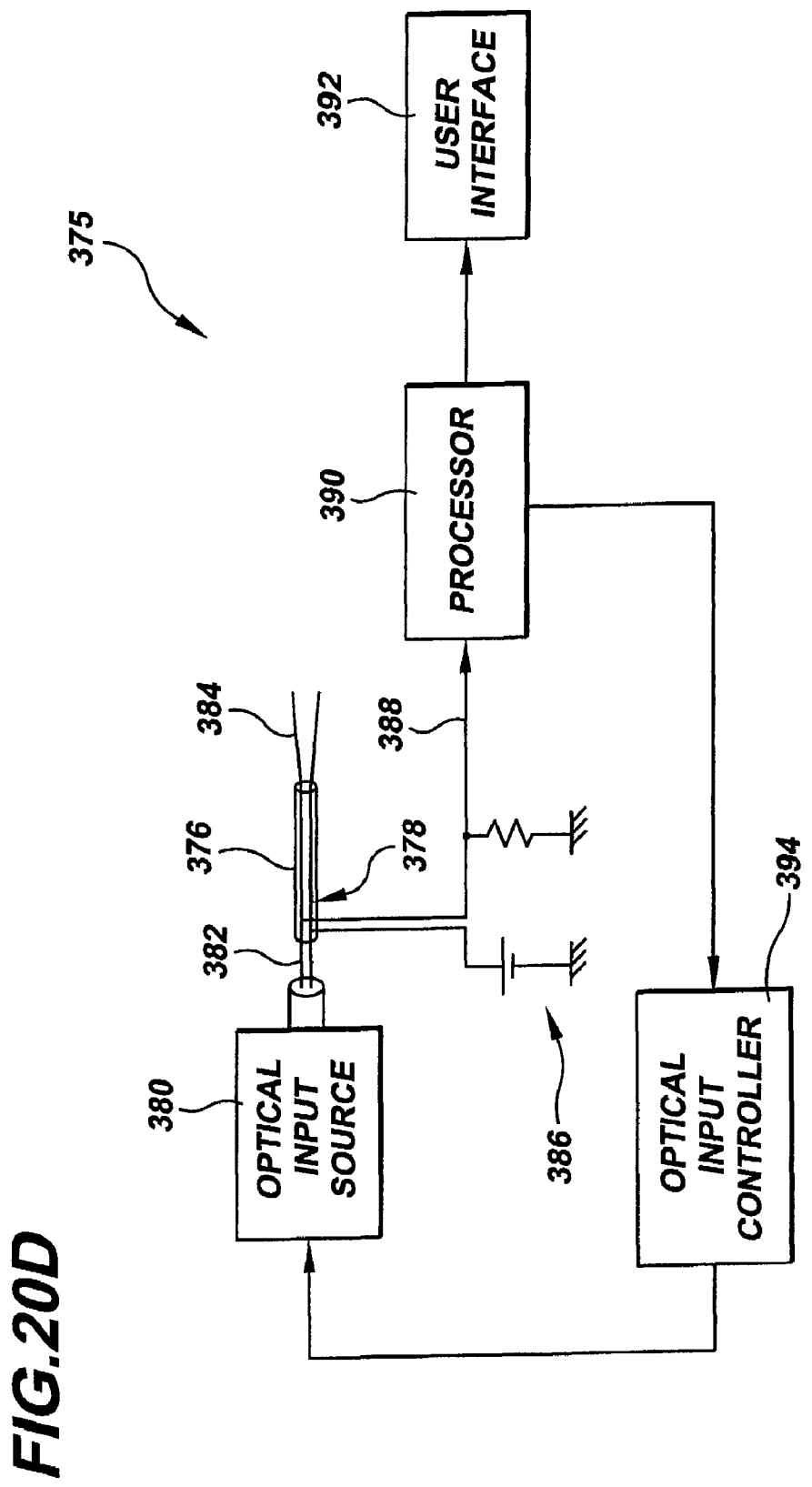

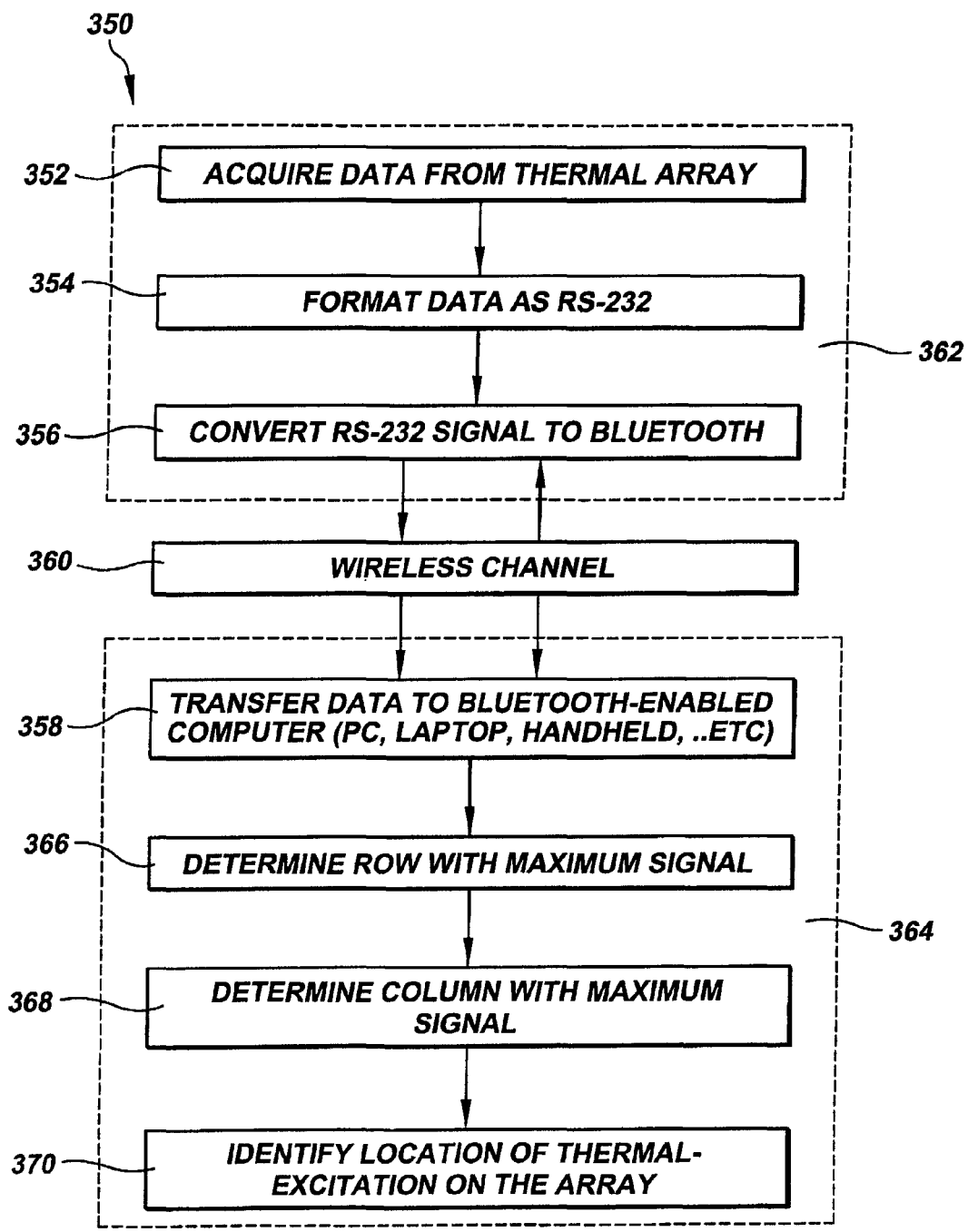

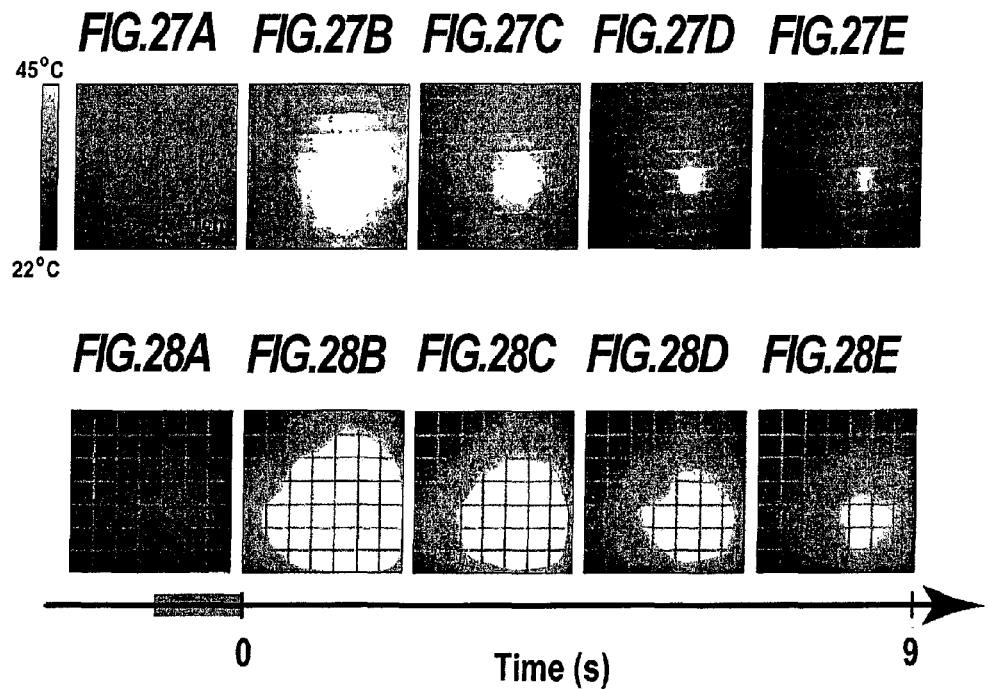
FIG.27A FIG.27B FIG.27C FIG.27D FIG.27E
FIG.28A FIG.28B FIG.28C FIG.28D FIG.28E
Time (s)
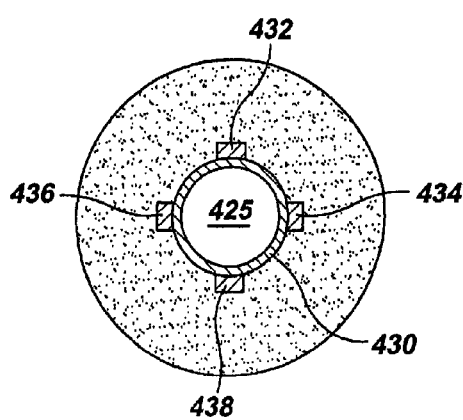
FIG.29

THERMAL SENSING FIBER DEVICES

CROSS-REFERENCE TO RELATED APPLICATIONS

This application is a divisional of copending application U.S. Ser. No. 12/380,929, filed Mar. 5, 2009, with in turn is a divisional of copending application U.S. Ser. No. 11/529,111, filed Sep. 28, 2006, now U.S. Pat. No. 7,567,470, all of which are hereby incorporated herein by reference. U.S. Ser. No. 11/529,111, claims the benefit of U.S. Provisional Application No. 60/721,277, filed Sep. 28, 2005, and U.S. Provisional Application No. 60/758,427, filed Jan. 12, 2006, the entirety of both of which are hereby incorporated herein by reference. U.S. Ser. No. 11/529,111, in turn is a continuation in part of copending U.S. application Ser. No. 10/890,948, filed Jul. 14, 2004, now U.S. Pat. No. 7,295,734, which in turn claims the benefit of U.S. Provisional Application No. 60/487,125, filed Jul. 14, 2003, and U.S. Provisional Application No. 60/539,470, filed Jan. 27, 2004, the entirety of both of which are hereby incorporated by reference. This application is related to U.S. application Ser. No. 11/173,827, filed Jul. 1, 2005, now U.S. Pat. No. 7,292,758, the entirety of which is hereby incorporated by reference.

STATEMENT REGARDING FEDERALLY SPONSORED RESEARCH

This invention was made with Government support under Contract No. DAAD19-03-1-0357, awarded by the Army Research Office, under Contract No. DMR 02-13282 awarded by the NSF, and under Contract No. DE-FG02-99ER45778 awarded by DOE. The Government has certain rights in the invention.

BACKGROUND OF INVENTION

This invention relates generally to optical fibers, optical devices, electronic devices and optoelectronic devices, and in particular relates to fiber materials selection, fiber structure design, and fiber drawing techniques for producing a fiber with desired functionality.

A combination of conducting, semiconducting, and insulating materials in well-defined geometries, prescribed micro- and nano-scale dimensions, and with intimate interfaces is essential for the realization of virtually all modern electronic and optoelectronic devices. Historically, such devices are fabricated using a variety of elaborate microfabrication technologies that employ wafer-based processing. The many wafer-based processing techniques currently available enable the combination of certain conducting, semiconducting, and insulating materials in small feature sizes and high device packing densities. But in general, microfabrication techniques are restricted to planar geometries and planar conformality and limited device extent and/or materials coverage area. Microfabricated devices and systems also in general require packaging and typically necessitate very large capital expenditures.

Conversely, modern preform-based optical fiber production techniques can yield extended lengths of material and enable well-controlled geometries and transport characteristics over such extended lengths. In further contrast to wafer-based processing, fiber preform drawing techniques are in general less costly and less complicated. But in general, preform-based optical fiber production has been restricted to large fiber feature dimensions and a relatively small class of dielectric materials developed primarily for enabling optical transmission. A wide range of applications therefore remain to be addressed due to the limitations of both conventional fiber preform-based drawing technologies and conventional microfabrication technologies.

One example of such an application is thermal sensing and thermography. Thermal sensing and thermography can yield important information about the dynamics of many physical, chemical, and biological phenomena. Spatially-resolved thermal sensing can enable failure detection in technological systems where the failure mechanism can be correlated with localized changes in temperature. Indeed, infrared imaging systems have become ubiquitous for applications where line-of-sight contact can be made between an object to be measured and a measuring camera lens.

But many critical applications do not lend themselves to radiative infrared imaging due to the subterranean nature of the monitored surface, spatial constraints, or cost considerations. The challenge of monitoring the skin temperature beneath the thermal tiles on the space shuttle represents a good example in which high-spatial-resolution information is required on very large surface areas and where the monitoring cannot be performed using traditional thermal imaging systems. The problem of continuously monitoring and detecting a thermal excitation on very large areas (100 m$^2$) with high resolution (1 cm$^2$) is one that has remained largely unsolved, not being well-addressed by conventional microfabricated systems or conventional fiber-based systems.

SUMMARY OF THE INVENTION

There is provided thermal sensing fiber configurations and manufacturing processes that enable thermal detection and thermal mapping. In an example thermal sensing fiber grid, there is included a plurality of rows of thermal sensing fibers and a plurality of columns of thermal sensing fibers. Each thermal sensing fiber includes a semiconducting element that has a fiber length and that is characterized by a bandgap energy corresponding to a selected operational temperature range of the fiber in which there can be produced a change in thermally-excited electronic charge carrier population in the semiconducting element in response to a temperature change in the selected temperature range. There is further included at least one pair of conducting electrodes in contact with the semiconducting element along the fiber length, and an insulator along the fiber length. An electronic circuit is provided for and connected to each thermal sensing fiber for producing an indication of thermal sensing fiber grid coordinates of a change in ambient temperature.

The thermal sensing fiber grid can spatially localize the sensing of a thermal excitation in the ambient environment of the array or grid and can be configured in a range of geometries. Other features and advantages of the invention will be apparent from the following description and accompanying figures, and from the claims.

BRIEF DESCRIPTION OF THE DRAWINGS

FIGS. 3A-3G are schematic cross-sectional views of example fiber geometries enabled by the processes of the invention;

FIG. 4 is a schematic cross-sectional view of a fiber provided by the invention for optical and electrical transmission;

FIG. 8 is a schematic cross-sectional view of a fiber provided by the invention for photodetection;

FIG. 20D is a schematic diagram of a feedback control system for a self-monitoring thermal sensing fiber of the invention;

FIG. 23 is a flow chart of steps of a method provided by the invention for identifying the location of a thermal excitation at the thermal sensing array of FIG. 21;

FIGS. 27A-27E are sequential thermal images of the thermal sensing fiber array of FIG. 24A before, during, and after heat from a heat gun was momentarily directed at the array;

FIGS. 28A-28E are sequential thermal maps produced based on data from the thermal sensing fiber array of FIG. 24A and corresponding to the time-sequence thermal images of FIGS. 27A-27E; and FIG. 29 is a schematic view of a further thermal sensing fiber configuration provided by the invention.

DETAILED DESCRIPTION OF THE INVENTION

Figure 1A:
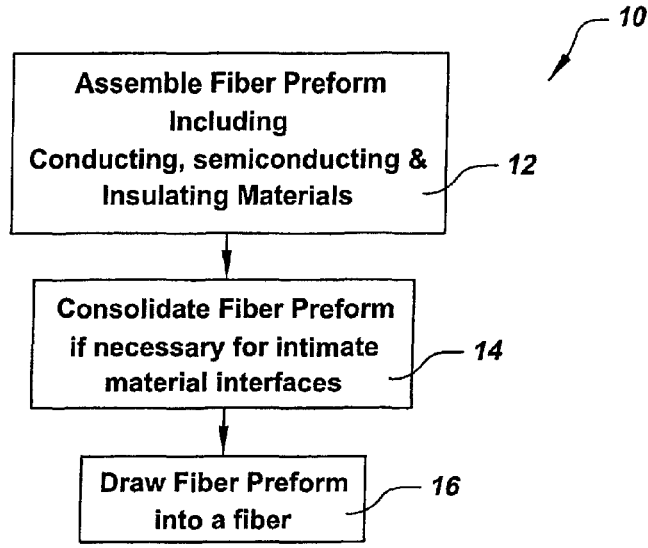
FIGS. 1A-1B are flow charts of processing steps of the fiber preform assembly and draw processes provided by the invention.

Fibers produced in accordance with the invention are three-dimensional, unsupported physical objects for which one dimension, defined as the longitudinal dimension, is substantially larger than the other two dimensions, defined as the cross sectional dimensions, and are fabricated by, e.g., the production sequence 10 outlined in the flow chart of FIG. 1A. In a first example sequence step 12, conducting, semiconducting, and insulating materials are assembled into a fiber preform. The preform includes the selected materials arranged in a macroscopic geometric configuration corresponding to, though not necessarily equivalent to, the desired geometry of the fiber. The preform is characterized by a ratio of longitudinal to cross sectional dimensions that is typically between about 2 and about 100. Once assembled, the preform can be consolidated 14 in a next process step. The consolidation process, carried out under selected temperature and pressure conditions as described below, is employed when necessary for producing intimate material interfaces in the preform and to ensure element shape integrity throughout the draw process. The preform is then drawn 16 into a fiber that preserves the cross sectional geometric configuration of the macroscopic preform while reducing preform feature sizes to smaller scales and producing extended fiber lengths of uniform cross section.

Figure 2:
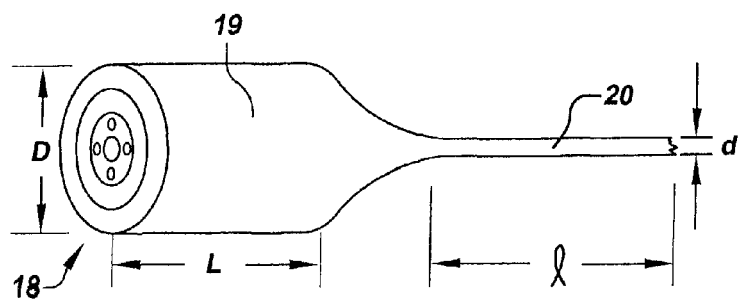
FIG. 2 is a schematic representation of a fiber preform and the corresponding fiber produced by drawing the preform in accordance with the invention.

These striking dimensional shifts produced by the fiber drawing process are schematically illustrated in FIG. 2. A macroscopic assembly 18 of conducting, semiconducting, and insulating materials is arranged as a preform 19 having a diameter, D on the order of about 10 mm to about 100 mm and a length, L, on the order of centimeters, e.g., less than 100 cm or less than 50 cm. The structured preform 19 is then subjected to heating and deformation under fiber drawing conditions to produce a fiber 20.

The resulting fiber 20 has a length, l, on the order of meters, e.g., 10 m, 20 m, 50 m, 100 m, or longer, and a diameter, d, on the order of between about 50 µm and about 2000 µm, resulting in a longitudinal-to-cross sectional ratio that can be above 1000, a length that can be more than 100 times greater than that of the preform, and a diameter that can be 10 times less than the diameter of the preform. Within the fiber, feature sizes on the order of 10's of nanometers can be produced. The fiber drawing process of the invention thereby preserves the preform's element organization along its length while forming intimate material interfaces and reducing element sizes to the micro- and nano-scale along extended fiber lengths.

As a result, the invention enables the production of extended-length fiber for combined optical and electrical transmission, as well as micro-scale microelectronic and optoelectronic device operation along the fiber axial length and/or across the fiber's cross-section, without employing wafer based microfabrication techniques. Macroscopic assembly of a preform is in general convenient and does not require exotic process techniques or equipment. The invention is not limited to a particular preform configuration or preform assembly technique. Any preform configuration and preform assembly techniques that employ conducting, semiconducting, and insulating materials that are compatible for co-drawing, as explained below, can be utilized.

Figure 3A:
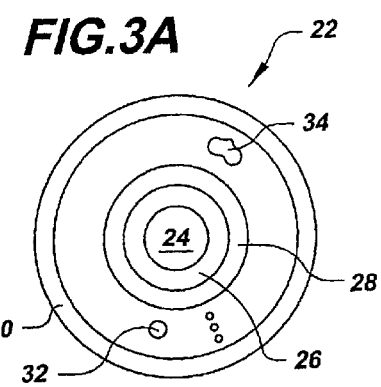

FIG. 3A is a cross-sectional view of a first example fiber configuration 22 that can be produced in accordance with the invention. While this example fiber is shown having a circular cross section, such is not required; any suitable cross sectional geometry, e.g., rectangular, can be employed for the fiber as well as the elements included in the cross-sectional fiber arrangement. In the example fiber there is provided a fiber core region 24 around which are provided a number of layers 26, 28 ranging in number from one to any selected number, with a final layer 30 at the surface. The fiber core region 24 can be provided as an air core or as a solid of conducting, semiconducting, or insulating material. For example, the core region can be provided as a semiconducting or insulating material for optical transmission, with one or more outer layers 26, 28 provided as conducting materials for electrical transmission. One or more outer layers can also or alternatively be provided as semiconducting and insulating, for optical transmission, electrooptical device operation, and for electrical and optical isolation, and the core region, in concert with one or more outer layers, can provide optoelectronic device operation.

Also as shown in FIG. 3A, there can be included in the fiber 22 one or more strands 32, and other geometric elements 34 of conducting, semiconducting, or insulating materials provided along the axis of the fiber. Such elements can be incorporated in one or more layers of the fiber and can be arranged around the fiber circumference. This arrangement can be extended as shown in the example configuration 37 shown in FIG. 3B, with an array of strands 36 provided around a portion or the entire circumference of the fiber, and arranged in a desired configuration with other fiber elements, e.g., surrounding a core region 38, and optionally including one or more layers 39, 40 surrounding the core and the strands 36. The invention is not limited to a particular configuration of strands or other elements. As shown in the example fiber 31 of FIG. 3C, a multi-dimensional array of strands 35 can be provided about a core region 33 or other selected preform element. Each of the strands can be provided as conducting, semiconducting, or insulating materials.

Figure 3B:
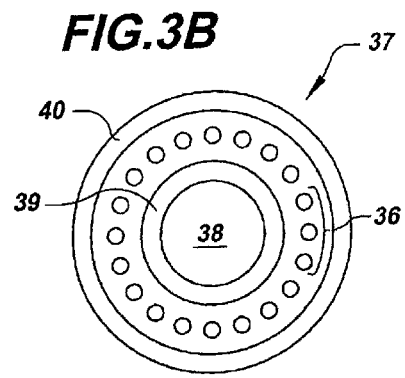
Figure 3C:
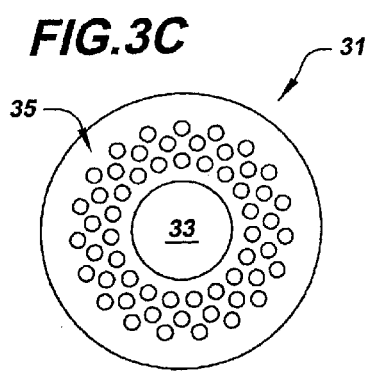
Figure 3D:
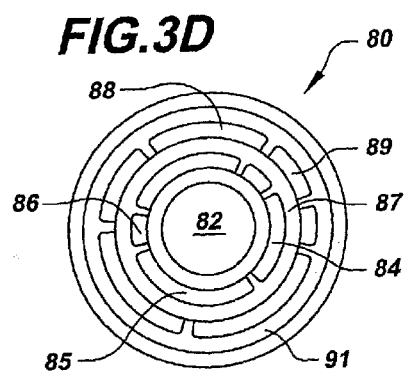

As shown in the example fiber configuration 80 of FIG. 3D, the material layers provided about a core region 82 or other fiber geometry can be discontinuous, i.e., multiple distinct layer regions 84, 85, 86, 88, 89 can be provided as an alternative to a continuous layer. Such distinct layer regions can be provided adjacent to continuous layer regions 87, 91, and can be provided at multiple locations across the fiber cross section, and can be provided as any of conducting, semiconducting, or insulating materials.

Figure 3E:
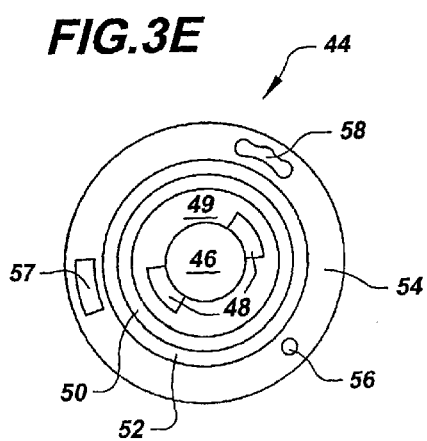

The invention contemplates fiber geometries in which arrangements of conducting, semiconducting, and insulating elements are provided in intimate interfacial contact that enables optoelectronic device operation. For example, as shown in FIG. 3E, there can be provided a fiber configuration 44 in which a core region 46 is adjacent to and in contact with one or more regions that can be provided as conducting electrodes 48. While the illustrated example shows two electrodes, it is to be recognized that any number of electrodes can be included. In this example, discussed in detail below, the core region 46 can be provided of a material, such as an insulator or semiconductor, that is selected for interaction with and/or control by the adjacent electrodes 48. The core region 46 and adjacent regions 48 thereby are provided as optoelectronic device elements within the fiber.

The region 49 directly surrounding the electrodes can be provided as a suitable material, e.g., an insulating material. Indeed, the various preform regions and elements 46, 48, 49 can be provided of any of conducting, semiconducting, and insulating materials. As shown in FIG. 3E, additional layers of material 50, 52, 54 can be included around the core region and electrodes. Additionally, one or more strands 56 of material can be incorporated in one or more of the layers, and one or more electrodes 57 and/or other elements 58 can similarly be incorporated in the layers.

Figure 3F:
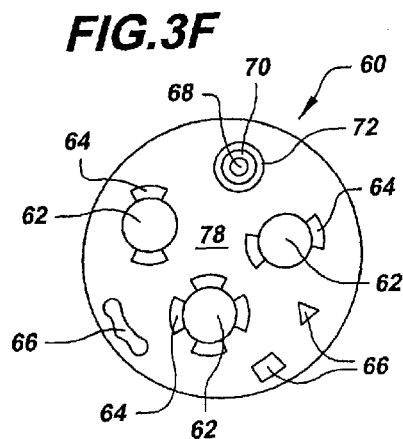

Turning to FIG. 3F, in a further example fiber configuration 60 provided by the invention, multiple cores 62 and/or strands and other elements 66, 68, of arbitrary geometry, can be included in the fiber in a desired arrangement across the fiber cross-section. Multiple core regions 62 and/or strands can be provided with adjacent regions 64, e.g., electrodes, in any desired arrangement, e.g., as one or more pairs of electrodes. The fiber strands 68 as well as the core regions can also be individually axially surrounded by additional material layers 70, 72 or by other fiber elements. Finally, if desired, the fiber can include one or more material layers that surround a material region 78 in which the various elements are provided. No particular symmetry is required between the various cores, strands, and other elements included in the fiber.

The examples of FIGS. 3A-3F demonstrate several particular advantages of the fiber and fiber drawing processes of the invention. Conducting, semiconducting, and insulating materials can be disposed in selected configurations that enable the production of optical and electronic functional elements, e.g., optoelectronic device elements, within the fiber cross section. The fiber can include hollow regions or can be characterized by an all-solid cross section, i.e., a cross section having no hollow regions. The fiber elements do not need to display the symmetry of the fiber outer perimeter or if hollow, the fiber inner perimeter. The fiber can further be characterized by cylindrical asymmetry. The fiber can include elements that have a perimeter that is a closed loop which does not contain a characteristic center of a cross section of the fiber.

There is no requirement as to the ordering of materials within the fiber of the invention, with the caveat that metal regions be geometrically confined in the manner described below. Having no such ordering requirement, the fiber of the invention can provide one or more material interfaces and/or material composition discontinuities along a path, around a cross section of the fiber, that conforms to a fiber perimeter. In other words, along a path around the fiber cross section that is a fixed distance from the fiber periphery at all points of the path, material interfaces and/or material composition discontinuities can be provided. For specific geometries, such a path can be considered a circumferential path. This condition enables a wide range of fiber geometries, including, e.g., conducting electrodes at locations of the fiber cross section, across which can be sustained an applied voltage.

The fiber configuration of FIG. 3F can be adapted, however, with a selected symmetry and fiber element configuration. For example, as shown in the fiber configuration 65 of FIG. 3G, fiber elements can be arranged with a particular symmetry, e.g., in a two-dimensional sub-fiber array that can incorporate previously drawn fiber elements. In the example fiber of FIG. 3G, a number, e.g., 1000, of individually drawn sub-fibers 67, each having a selected cross section geometry that can be substantially similar or dissimilar from the other sub-fibers, are arranged as a hybrid fiber. In the example shown, each sub-fiber 67 in the hybrid fiber 65 is provided with a core region 62 and electrodes 64 adjacent to and in contact with the core region, and having an outer region 71 about the electrodes and core region. It is to be recognized that any geometry can be selected for each individual sub-fiber in the hybrid fiber, however. Additionally, the functionality of each sub-fiber in the hybrid fiber array can be selected to complement that of the other sub-fibers, and elements of the sub-fibers can be electrically or otherwise interconnected to form an integrated circuit hybrid fiber in which devices are provided across the various sub-fibers in the array.

The example fibers of FIGS. 3A-3G are provided to demonstrate the wide range of fiber configurations contemplated by the invention. Features shown in one or more of the example fibers can be selectively included in a customized fiber configuration that provides desired functionalities of optical transmission, electrical transmission, and/or optoelectronic device operation. Because the fiber configuration enables isolated arrangement of selected materials as well as intimate contact between materials, optical and electrical transmission can occur simultaneously yet separately, and in parallel with optoelectronic device operation. The materials selected for various fiber elements can be customized for a given application, with conductor-semiconductor, conductor-insulator, and semiconductor-insulator interfaces occurring throughout the fiber cross section and around the fiber circumference.

The direction of electron transmission, if such is accommodated by the fiber geometry, can coincide with or be counter to a direction of photon transmission through the fiber, if such is also accommodated by the fiber geometry. In general, the direction of electron and photon transmission can be longitudinal, i.e., along the fiber axial length, and/or radial, from a center region radially outward or from an outward region radially inward. The thicknesses of the materials included in a given fiber configuration are therefore preferably selected based on the particular fiber application and the desired direction of electronic and photonic transmission, as discussed in detail below.

Whatever fiber configuration is selected, in accordance with the invention the configuration includes conducting, semiconducting, and insulating materials arranged as layers, regions, and/or elements, with selected material interfaces, that enable desired optical and/or electrical functionality for the fiber. The conductivity of each material can be selected based on the functionality specified for that material. For example, suitable conducting materials can be characterized by a conductivity greater than about $10^2$ $1/\Omega \cdot cm$; suitable semiconducting materials can be characterized by a conductivity less than about $10^2$ $1/\Omega \cdot cm$ but greater than about $10^{-12}$ $1/\Omega \cdot cm$; and insulating materials can be characterized by a conductivity less than $10^{-12}$ $1/\Omega \cdot cm$. This example characterization of materials highlights the particular advantage of the invention in its ability to intimately incorporate materials having over ten orders of magnitude disparity in conductivity. It is to be recognized that there does not exist a well-defined, i.e., absolute, boundary in conductivity values between conductors, semiconductors, and insulators. These example values are provided as a general aid in characterizing suitable conducting, semiconducting and insulating materials for optical and electrical fiber functionality.

As explained above, the various selected materials are first assembled in a macroscopic preform and then drawn to a final fiber geometry. The thermal deformation conditions inherent in the fiber drawing process require that the conducting, semiconducting, and insulating materials selected for a given fiber configuration be compatible for co-drawing.

For clarity of discussion, it is convenient to first describe the properties of compatible semiconductor and insulating materials to be co-drawn in accordance with the invention. In general, it is recognized that materials which are amorphous and glassy are particularly well suited to be drawn from a preform into a fiber structure. The term amorphous here refers to a material morphology that is a continuous atomic network in which there is no repeating unit cell or crystalline order; a glassy material typically is not easily crystallized at high processing temperatures. For many applications, it can be preferred to select semiconducting and insulating fiber materials that are glassy to enable fiber drawing at a reasonable speed while self-maintaining structural integrity and regularity. Such can be achieved with glassy materials because the viscosity of a glassy material varies quasi-continuously between solid and liquid states, in contrast to a crystalline material. By employing a glassy material, it is ensured that the fiber structure will remain amorphous, i.e., not crystallize, when cycled through softening and drawing temperatures.

Considering the viscosities of candidate glassy semiconducting and insulating materials, suitable materials for co-drawing are those having compatible viscosities at the fiber drawing temperatures of interest. More specifically, the materials should both be above their respective softening points at an overlapping draw temperature to enable their co-drawing. Precise viscosity matching between fiber materials is not required; specifically, the materials need not have the same viscosity at the draw temperature, but rather all should flow at that common temperature. It is further understood that for some material combinations, high viscosity in one or more materials that comprise the majority of the volume of the fiber preform is sufficient to enable structural integrity of all co-drawn materials. Suitable materials additionally are preferably characterized by good surface adhesion and wetting in the viscous and solid states without cracking even when subjected to thermal quenching.

There have been identified in accordance with the invention a class of insulating materials, namely, amorphous thermoplastic polymeric insulating materials, that are particularly well-suited to the fiber co-drawing process of the invention. High glass-transition-temperature polymeric insulators are an example of such; a wide variety of amorphous high glass-transition-temperature polymer materials are available and can be processed with a range of techniques to form various material configurations that are characterized by excellent mechanical toughness. Examples of high glass-transition-temperature polymers that can be employed include poly-ether imide (PEI), poly-sulfone (PS), poly-ether ether ketone (PEEK), and poly-ether sulfone (PES).

There also can be employed as an insulating material liquid crystal polymers (LCP's), low glass transition polymers such as poly-methyl methacrylate (PMMA), polycarbonate (PC), poly-ethylene (PE) and other such thermoplastic polymers. Poly-tetrafluoroethylene (PTFE or Teflon™) and other fluorinated polymers or copolymers can also be employed in configurations in which their characteristically poor surface adhesion properties can be accommodated. While it is preferred that amorphous polymer materials be employed, it is also recognized that some semicrystalline polymers, e.g., branched PTFE, can be employed. A necessary condition for any suitable polymeric material is that there exist a fiber draw temperature at which the polymer can be drawn into a fiber at a reasonable speed, e.g., greater than about 1 mm/minute, without decomposition.

Considering candidate semiconductor materials for the fiber co-drawing process of the invention, amorphous semiconductors are preferred, given their low glass transition temperatures and stability with respect to oxidation. Amorphous semiconductors are also preferred for their good wetting properties, defined by the contact angle between the semiconductor and polymer materials at the draw temperature; a contact angle of less than about 150 degrees can be preferred. Further, amorphous semiconductors generally are characterized by a viscosity value that is similar to that of the polymers described above at polymer draw temperatures. Both organic semiconductors, such as PPV, or poly thiophene, as well as inorganic semiconducting materials can be employed.

The class of semiconducting chalcogenide glasses are particularly well-suited to the co-drawing process of the invention. Chalcogenides are high-index inorganic glasses that contain one or more of the chalcogen elements of sulfur, selenium, and tellurium. In addition to the chalcogen element, chalcogenide glasses can include one or more of the following elements: boron, aluminum, silicon, phosphorus, sulfur, gallium, germanium, arsenic, indium, tin, antimony, lithium, thallium, lead, bismuth, cadmium, lanthanum, and the halides fluorine, chlorine, bromide, and iodine. There is a very wide variety of different compositions within the family of chalcogenide glasses and thus the properties of a given composition can be tailored through compositional adjustment. For example, a composition of $(As_{40}Se_{60})_{1-x}Sn_x$ can be employed to obtain a desired characteristic.

For many applications, the semiconducting material is best selected based on its material characteristics for enabling photonic conduction and optoelectronic device operation. For example, the amorphous semiconducting material can be compositionally tailored to achieve desired optical, thermal, and/or mechanical properties. In one example scenario, the semiconducting material is selected in combination with the insulating material to produce a multilayer photonic bandgap structure for conduction of photons through a hollow fiber core around which are provided alternating semiconducting and insulating layers. Such a configuration is described in U.S. patent application Ser. No. 10/733,873, entitled "Fiber Waveguides and Methods of Making Same," filed Dec. 10, 2003, now U.S. Patent Application Publication US20040223715A1, published Nov. 11, 2004, the entire contents of which are hereby incorporated by reference. In this example, chalcogenide semiconducting materials such as $As_2Se_3$; $(As_2Se_3)_xM_{1-x}$, where M is In, Sn, or Bi; $(As_2Se_3)_{1-x}Sn_x$; As—Se—Te—Sn, or other chalcogenide materials are employed with PES, PEI, or other suitable amorphous polymer to produce the desired bandgap structure. It is to be recognized that a wide range of polymers can be paired for co-drawing with a chalcogenide material; e.g., both high and low glass-transition-temperature polymers can be employed in conjunction with low glass-transition-temperature chalcogenide glasses.

The conducting material to be employed in the fiber of the invention is selected based on its compatibility for co-drawing with the selected semiconducting and insulating materials. At a selected fiber draw temperature, the selected conducting material should be molten or sufficiently ductile to enable thermal deformation. For many applications, it can be preferred to employ a conducting material having a melting temperature that is below a desired fiber draw temperature. It additionally is preferred that the conducting material sufficiently wet the surfaces of the semiconductor and insulating materials such that the contact angle between the conducting material and these materials is less than about 150 degrees, at the fiber draw temperature, for the case of a bare-surfaced conducting material, without inclusion of an adhesion promoter.

Given a selection of a high glass-transition-temperature polymeric insulating material and a chalcogenide semiconducting material, a low melting-temperature metal or metal alloy can be a preferable conducting material selection. For example, tin, indium, bismuth, cadmium, lithium, or other low melting-temperature metal is particularly well suited for the material trio, as well as Sn-based or other selected alloys. In addition, a selected metal alloy can be synthesized to provide desired melting temperature, electrical conductivity, and other properties. For example, Sn—Ag, Sn—Sb, Sn—Cu, and other alloys can be employed. Further, there can be employed suitable amorphous glassy metals, or other suitable metal composition.

With these considerations and examples, it is to be understood that some experimental verification may be required to confirm the co-drawing compatibility of various candidate materials. Once the drawing temperature of each material of interest is determined, and assuming that the materials can be drawn within a common temperature range, it can be prudent to examine the viscosities of the materials across the selected drawing temperature range to ensure that the viscosities are compatible. As stated above, it is not required that the viscosities of the various materials be the same at the fiber draw temperature, but rather that all materials should at least flow at the draw temperature, with conducting materials preferably molten at the draw temperature. Also, as stated previously, it is understood that it can be preferred that the material which comprises the majority of the volume of the fiber preform be characterized by the highest viscosity.

For example, a reasonable criteria for a material trio including a high glass-transition-temperature polymer, a chalcogenide semiconductor, and a metal is that all materials have viscosities lower than about $10^6$ Poise at the selected draw temperature, with metals preferably being molten at the selected draw temperature. If, e.g., the polymer material constitutes the majority of the fiber preform volume, then a polymer viscosity of between about $10^1$ Poise and about $10^6$ Poise can be acceptable, with a viscosity of between about $10^4$ Poise and about $10^6$ Poise preferred for the polymer, all at the fiber draw temperature. In this example scenario, a viscosity of less than about $10^6$ can be acceptable for the semiconducting and conducting materials included in the fiber preform, with a viscosity no greater than about $10^5$ more preferred. In general, one of the semiconducting, conducting, and polymer or other insulating materials is preferably characterized by a viscosity that is greater than about $10^4$ Poise but less than the upper boundary just given, with the majority-volume material, such as the polymer described above, more preferably having a viscosity that is greater than about $10^4$ Poise.

It is to be recognized that the fiber of the invention is not limited to a single conducting material selection, a single semiconducting material selection, or a single insulating material selection. Rather, any number of co-drawing compatible materials from the three material classes can be employed as necessary for a given fiber configuration and application. In addition, distinct material layers, regions, and elements can be included all of distinct thicknesses, dimensions, and composition. For example, various materials can be included to tailor optical signal transmission rates. In one such scenario, the inclusion of optical defect layers adjacent to optical transmission layers, and the tailoring of the thicknesses of such layers, can be employed to achieve a photonic propagation rate that is commensurate with the rate of electron propagation through other elements of a fiber.

Similarly, various conducting materials can be included with their dimensions tailored for a specific operation. For example, given a metal layer or strand incorporated into a fiber for electron conduction, the metal is preferably of sufficient thickness to achieve meaningful electrical conductivity for a given application, at reasonable applied voltage biases. The thickness of the metal is preferably selected based on a given application and the direction of required electronic conductivity. Recall that the resistance, R, in ohms, of a conductor is proportional to the conductor resistivity, $\rho$, length, l, and is inversely proportional to the conductor cross sectional area, A, as $R=\rho l/A$. Thus if an electrical potential difference is applied across a metal layer of the fiber in the radial direction, for radial conduction, a very thin metal layer can be sufficient to conduct large currents, while if conduction is to be in the axial direction, along the fiber length, then a metal layer as thick as 25 microns may be required for reasonable conduction along, e.g., a 10 m fiber section. In general, whatever conductor configuration is selected, it preferably is characterized by a resistance per unit length of less than about 1 k$\Omega$/cm to enable effective electronic conduction. Various conducting material compositions and geometric combinations can be employed to tailor the conducting properties for a given application.

Assembly of materials into a fiber preform is carried out employing processes that are compatible with the selected materials to produce desired material configurations based on the considerations described above. No particular preform assembly technique is required by the invention. Rather, a range of techniques can be employed to produce a preform having a configuration corresponding directly to the desired post-draw fiber.

In accordance with the invention a variety of preform elements can be provided and/or produced separately for incorporation together into a preform arrangement. Considering first conductive materials, commercially available rods, strands, foils, sheets, and other articles of conducting material can be employed. Thermal evaporation, E-beam evaporation, sputtering, chemical vapor deposition (CVD) and other physical deposition techniques can be employed for coating preform elements with a conducting material layer or layers. It is to be recognized, however, that depending on a particularly selected deposition technique and the deposition parameters, not all deposited films may be compatible with a fiber co-drawing process; e.g., the deposited conducting material must be sufficiently thick as well as ductile to accommodate the drawing process.

Whatever conducting material geometry is employed, if the conducting material is a metal or metal alloy that will melt at fiber draw temperatures, then in accordance with the invention, the metal or alloy is arranged in the preform such that it is confined geometrically by materials in the preform that will not melt at the draw temperatures. This metal confinement ensures that the draw process retains the desired metal configuration in the fiber even while the metal is in a fluid state.

In addition, it is recognized in accordance with the invention that conducting materials can oxidize readily at elevated temperatures, including preform consolidation and fiber draw temperatures. Oxidized conducting materials may not melt or may flow nonuniformly, resulting in nonuniform or even inoperable conducting elements in the drawn fiber. To eliminate this condition, it can be preferred in accordance with the invention to inhibit and/or remove oxide from conducting element surfaces for various preform geometries.

The invention provides a range of techniques for inhibiting oxidized conducting materials in a drawn fiber. In a first example technique, an antioxidizing, or oxide inhibiting, agent that preferably is a surface wetting promoter is incorporated into the preform at interfaces surrounding the conducting material, e.g., surrounding metal elements in the preform. This can be achieved by, e.g., physically applying an oxidation inhibitor to the conducting material surfaces during the preform assembly. A particularly well-suited oxidation inhibitor is a flux; fluxes in general are synthetic carboxylic acid-containing fluids or natural rosin fluxes. These compounds serve to enhance and promote the wetting of the preform materials by the metal or other conducting material so as to prevent capillary breakup of the conducting material. This enables the use of conducting materials that may not normally exhibit the required surface wetting condition. Example suitable fluxes include Superior No. 312 flux, or Superior 340 flux, both from Superior Flux and Mfg. Co., Cleveland, Ohio. The flux can be applied directly to the conducting material surfaces, and can alternatively or in addition be applied to surfaces of other materials that in the preform configuration are to be adjacent to conducting material surfaces.

In a further technique for inhibiting oxidized conducting elements in a drawn fiber, an oxidation inhibitor can be applied to one or more preform elements by adding it to the elements. For example, an oxidation inhibitor can be added to a polymer material that is to be located adjacent to a conducting material element. The oxidation inhibitor constituent preferably segregates to or is naturally located at the surface of the polymer for application interaction with adjacent conducting materials. Alternatively, a polymer, semiconductor, or other material that itself has oxidation inhibition or oxide growth suppression properties can be selected for use in the preform adjacent to conducting elements. Oxidation inhibiting and/or growth suppression buffer layer materials can also be included between a conducting element and an adjacent material. Whatever oxidation inhibition technique is employed, it is preferred that the oxide inhibitor does not decompose at the preform consolidation temperature or the fiber draw temperature.

Considering the need to encapsulate metal preform elements and inhibit oxide of such elements, in one example for encapsulating metal strands, polymer-coated metal strands are produced from commercially-available metal wires. In one such scenario, Sn wires, e.g., 5 mm in diameter are coated with a layer of flux, such as that described above, and then wrapped with a layer of PES film, e.g., 7.5 mm-thick PES film commercially available, e.g., from Westlake Plastics Co., Lenni, Pa. Alternative wire coating techniques can be employed, such as dip coating. The ends of the wrapped wires are then coated with a polymer material, e.g., by dip-coating. For this application, a polymer solution, e.g., 20% PES, 80% N,N-Dimethylacetamide, can be employed. The polymer solution is then solidified on the wire by heating the structure, e.g., at 180° C., or by subsequent consolidation of the structure. Consolidation of the polymer-wrapped wires can be preferred for ensuring intimate contact between the metal and polymer materials, and can be carried out in a vacuum oven at, e.g., 260° C.

The heating step or consolidation process results in the polymer solution being solidified and the wires thereby encapsulated with a polymer layer. The polymer-wrapped wires can at this point be drawn to form metal strands of a desired diameter, if a reduced diameter is desired for a given application. For the example of PES-coated Sn wires, a draw temperature of about 305° C. in a vertical tube furnace produces polymer-coated metallic strands having an outer diameter between about 500 μm and about 1.5 mm, depending on draw conditions. The metallic strands can then be incorporated in a fiber preform arrangement in the manner described below. It is to be recognized, however, that if desired for some applications, as described below, metallic wires or other elements can be drawn to a desired diameter without encapsulating the elements in a polymer or other insulating material.

Considering insulating fiber preform elements, due to the relative ease of preform assembly and drawing of polymer materials, compared with other glassy insulating materials, polymeric insulating materials can be preferred for many fiber applications. Polymeric insulating materials can be readily obtained commercially or produced in a desired configuration. For example, commercially available polymer rods, tubes, sheets, and films from, e.g., Westlake Plastics Co., can be employed. Polymer rods and tubes can also be produced by thermal consolidation of a rolled polymer film. Polymer layers can be produced by chemical vapor deposition techniques such as plasma enhanced chemical vapor deposition, by spin-coating, dip-coating, as described above, by roll-casting, extrusion, and other techniques. Liquid polymer can be applied, as described above, for coating preform core materials, strands, wires, rods, layers of other material, and preform elements.

Chemical and physical deposition techniques can be employed for producing non-polymeric insulating material preform elements. The invention does not limit insulating materials to polymeric materials. So long as a candidate insulating material is characterized by a morphology that is compatible with fiber drawing, such can be employed in addition to or as an alternative to polymeric materials.

Similarly, chemical and physical deposition techniques can be employed for producing amorphous semiconducting material preform elements. As explained above, for many applications, chalcogenide glass semiconductors can be preferred for their co-drawing compatibility with polymeric insulators. Rods, tubes, sheets, films, and other semiconducting structures can be employed in the fiber preform. A wide range of semiconducting glass structures can be obtained commercially, e.g., from Alfa Aesar, Ward Hill, Mass., and also can be synthesized as a particularly desired composition and geometry.

For example, in accordance with the invention, chalcogenide glass structures can be chemically synthesized using sealed-ampoule melt quenching techniques. In one example scenario, pure elements such as As and Se are placed in a quartz tube under a nitrogen atmosphere. The tube is initially maintained open at one end. A vacuum line is connected to the open end of the tube and the tube is preheated under vacuum to melt the elements and remove trapped gasses and surface oxide. Heating to 330° C. for one hour at a heating ramp rate of about 1° C./min and thereafter cooling to room temperature at a ramp down rate of 1° C./min is sufficient. An oxygen gettering agent such as Mg can be added to the tube to reduce the partial pressure of oxygen within the tube.

The tube is then sealed under a vacuum of, e.g., $10^{-5}$ Torr, using, e.g., a high-temperature torch. The sealed tube is then heated in a rocking furnace for physically mixing the elements during a prescribed heating schedule corresponding to the elements included. For example, the As—Se mixture can be heated to 800° C. at a rate of about 2° C./min, while held vertical, for twenty four hours, and then rocked for six hours to increase mixing and homogenization. The glass liquid is then cooled, e.g., to 600° C., in the furnace, and then quenched in water. Subsequently, the mixture is annealed for one half hour to the glass transition temperature, e.g., about 180° C., before being cooled gradually to room temperature. Using this synthesis technique, mechanically strong semiconducting structures can be fabricated as, e.g., rods, tubes, and other structures. Once the glass is synthesized, it is no longer sensitive to oxygen at room temperature. It therefore can easily be handled in ambient atmosphere for incorporation into a preform or employed for further processing.

In addition to conducting, semiconducting, and insulating preform elements, sacrificial elements can be included in a preform to aid in defining a preform shape, and then removed prior to drawing of the preform into a fiber. For example, quartz tubes or rods can be included in a preform at locations for which a hole is desired, and then chemically etched away after consolidation of the preform. Similarly, Teflon™ rods or tubes can be included in a preform and mechanically removed from the preform after consolidation. This technique provides a particularly elegant method for defining gaps and spaces in a preform assembly prior to fiber drawing.

With preform building blocks like the examples described above, and with suitable fabrication processes, like those described above, a wide range of preform geometries can be assembled for enabling optical and electrical functionality, including transmission and device operation, in a final fiber structure. Semiconducting, insulating, or conducting rods, strands, and other geometric elements can be coated with selected material layers. Various material layers can be applied in any order, with the caveat that metals be geometrically confined by materials that will not melt at the draw temperature. Drilling, casting, injection molding, or other techniques can also be employed for defining the geometric relationship between material elements in a preform layer or region.

Considering now specific preform assemblies for producing fiber geometries like those corresponding to FIGS. 3A-3G, as described above, wires, strands, or rods of conducting material can be arranged in a preform. The conducting elements can be positioned on preform layers by employing, e.g., a liquid polymer solution that operates to "glue" the elements, particularly polymer-coated elements, to a layer or other element. Referring to FIGS. 3A-3C, individual strands or an array of strands can be positioned around an inner layer or other element by this technique. Given a PES insulating layer composition, a polymer solution of 20% PES, 80% N,N-dimethylacetamide, available from Alfa Aesar, as described above, can be employed as both an end-coating strand medium and the liquid attachment medium. As explained above, during a heating step or a thermal consolidation process, the liquid polymer solution solidifies to a solid PES region that is an integral part of the preform and fiber.

It is to be recognized that conducting strands, wires, rods, or other elements are not required to be covered with a polymer coating, but such can be a convenient technique for geometrically confining the conducting material within the preform assembly. Alternatively, uncoated conducting strands can be positioned around a layer, e.g., a polymer layer, with pieces of polymer film cut and fit between each strand, and a layer of polymer applied over the array of strands. Other materials can be employed for confining the metal so long as the materials cooperate with a desired fiber functionality and can geometrically confine the metal during a draw process.

For many applications, where a high glass-transition-temperature polymer is employed as an insulating material, it can be particularly advantageous to employ layers of polymer material in assembly of a preform structure. For example, for the photonic bandgap structure described previously, alternating layers of semiconducting and insulating materials can be produced by depositing a semiconductor layer on one or both sides of a polymer film and then rolling the film into a cylindrical multilayer structure. In addition, a polymer film can be rolled around individual preform elements, such as conducting strands, as described above, and further can be rolled around assemblies of elements like those shown in FIGS. 3A-3G to produce insulating fiber regions and outer layers.

Deposition of a semiconductor layer on one or both sides of a polymer film can be accomplished by thermal evaporation, chemical vapor deposition, sputtering, or other suitable deposition technique. Where a semiconductor such as a chalcogenide glass has been synthesized, e.g., by the chemical synthesis process described above, conventional thermal evaporation of a synthesized source material onto a polymer film can be a particularly convenient deposition technique. It is preferred that the polymer film be highly uniform in surface quality and thickness and be cleaned, e.g., with an alcohol, prior to the deposition process. Thermal evaporation can be carried out with conventional hot filament evaporation techniques, preferably at a pressure below, e.g., about $10^{-4}$ Torr. A conventional vacuum evaporator, e.g., a Ladd Research Industries Model 30000, can be employed. If desired, both sides of a polymer film can be coated with a selected material.

In order to assemble a layered preform structure of the polymer film and a material deposited on the film in the manner just described, the coated polymer film can be wrapped, or rolled, around a mandrel or other preform structure a number of times to produce a desired number of layers. For example, in production of a photonic bandgap structure for optical transmission, a PES film coated with $As_2Se_3$ can be rolled a number of times to produce a structure with 20 or more alternating semiconducting and insulating layers. In this scenario, the PES film and the $As_2Se_3$ layer thicknesses are selected specifically to achieve a maximal photonic bandgap at a desired wavelength of photon transmission. The desired thicknesses of the layers in the final fiber structure dictate the thicknesses of the materials in the preform, based on the selected draw conditions, as explained in detail below.

Where the photonic bandgap structure is to conduct photons through a central hollow core surrounded by the bandgap materials, the semiconductor-coated polymer film can be rolled around a sacrificial preform such as a glass rod, hollow glass tube, or Teflon™ rod or tube, or other structure that can be removed from the preform prior to the fiber drawing step. Where the coated polymer film is to be employed in an alternative configuration, the coated film can be rolled around other selected preform elements, e.g., polymer, semiconductor, or conducting rods, or other layers of preform materials, including metallic foils, semiconducting layers, or other preform elements. This enables the layered structures shown in FIGS. 3A-3G.

Also as shown in FIGS. 3A-3G, conducting elements can be configured in a preform directly adjacent to semiconducting elements, e.g., as electrodes 48 adjacent to a semiconducting core 46 shown in FIG. 3E. In one example preform assembly technique, the use of polymer films can be particularly advantageous for producing this structure. Considering a scenario in which a semiconductor core is to be contacted by metal electrodes, the semiconductor core can be obtained commercially or be chemically synthesized in the manner described above.

A PES or other polymer film is then provided, having any desired length, a width that corresponds to the length of the semiconductor rod, preferably slightly longer than the rod, and a desired thickness, e.g., 125 μm in thickness. It is preferred to clean the film, e.g., with alcohol, and bake the film, e.g., at 150° C. for 3 hours, to remove the alcohol.

The electrodes can be formed in conjunction with the polymer film using, e.g., tin foil, of a desired thickness, e.g., between about 25 μm and about 1 mm in thickness. Suitable foils can be commercially obtained, e.g., from Goodfellow Corporation, Devon, Pa., or can be produced by, e.g., pressing a metal rod to the desired foil thickness. The foil is preferably cleaned and dried in the manner of the polymer film. Additionally, it can be preferred to coat the foil with an oxide inhibitor, e.g., a flux, as described above.

The conducting electrodes are shaped by cutting the foil into desired electrode geometries. If, e.g., the electrodes are to be configured as rectangles extending along the fiber longitudinal axis, then rectangular tin foil pieces are correspondingly cut. It can be preferred to cut foil pieces that are slightly shorter than the semiconductor rod length to enable geometric confinement of the foil in the preform in the manner described below. The width of the foil pieces is set based on the particular functionality desired for the electrodes, e.g., a 5 mm-wide foil piece can be employed.

The foil pieces are assembled in a preform configuration by removing sections of the polymer film at film locations corresponding to the electrode geometry and the desired placement of the electrodes. The film sections can be removed through their entire thickness or a portion of the film thickness. Considering the placement of two electrodes equally spaced around a semiconductor rod, and given an electrode width, w, and the rod perimeter, $P=\pi d$, where d is the rod diameter, then the two electrodes are to be spaced a distance $(P-2w)/2$ apart on the film. Similar computations can be made to position any number of electrodes in a film to achieve a desired electrode configuration in a final fiber geometry. The foil electrodes are inserted into the film at the locations at which the film was removed, and if desired, an additional layer of film can be overlayed. The film-electrode assembly is then rolled around the rod or other element, taking care that the electrode foil material is contacting the rod.

If the polymer film is thinner than the metal foil or other conducting element, then it can be preferred to employ several layers of polymer film, with each of the layers having an appropriate amount of material removed at desired electrode locations. Alternative to the use of a polymer film, one or more polymer tubes or other structures can be employed for supporting electrode elements to be incorporated into a preform. For example, sections of a polymer tube can be removed for positioning foil pieces in the tube, with the tube then slid over a rod or other preform element. For many applications, the use of a polymer tube can be preferred for ease in positioning the metal electrodes and assembling the polymer-electrode configuration on another preform element.

Extended sections of foil or other conducting material can be applied to polymer films or other materials to be wrapped around preform elements in any geometry so long as confinement of conducting materials is achieved by the arrangement.

For example, in the semiconductor-metal-insulator arrangement just described and shown in FIG. 3E, the electrodes 48 are radially confined between a semiconducting material 46 and an insulating material 49. In the example fiber of FIG. 3D, discrete conducting layer segments 84, 85, 86, 88, 89 are confined between adjacent material layers 87, 91, as well as material regions located between each conducting segment. Such confinement can be enabled by the polymer film-foil assembly described above, with regions of polymer film removed at desired conduction segment locations and metal foil inserted into the film regions.

Further, it was suggested just above that the electrode foil not extend the entire length of a polymer film to ensure that the polymer confines the foil at the longitudinal ends of the electrodes. If this is not the case, then it is preferred that an encapsulating material be applied at the preform ends. As described previously, a particularly convenient technique for such encapsulation can be the application of a liquid polymer solution that is dried during a subsequent heating or thermal consolidation step.

Beyond conducting elements, additional preform elements can be added and arranged. For example, as shown in FIG. 3E, additional material layers 50, 52, 54, possibly including strands or other elements 56, 57, 58, 66, 68, cores 62, or other elements, can be incorporated in the preform. As shown in FIG. 3F, this arrangement can be extended to produce a preform that includes multiple rods 62 in a selected configuration, e.g., having a selected number of adjacent electrodes 64. Layers of polymer film can be wrapped around each rod-electrode combination, and employing, e.g., a liquid polymer solution like that described above, can be attached together and to, e.g., a central polymer support structure.

This preform assembly process can be extended to the arrangement of fiber elements in a preform for producing a hybrid fiber array like that shown in FIG. 3G. In this process provided by the invention, one or more preforms are assembled and drawn into one or more sub-fibers. The sub-fibers are then cut into fiber sections that are arranged in a desired array or other hybrid arrangement. This hybrid arrangement is then drawn into a hybrid fiber including the array elements.

Each of sub-fiber elements included in the hybrid fiber array can be produced in the manner described above, with various conducting, semiconducting, and insulating material elements arranged in a variety of selected preforms. The preforms are then drawn to sub-fibers, in the manner of the drawing processes described below. For the example fiber shown in FIG. 3G, a preform including a rod, e.g., a semiconducting rod, such as an $As_2Se_3$ rod, is arranged with metallic electrodes 64, e.g., Sn elements, provided adjacent to and in contact with the rod, with polymeric material 71, e.g., PES, about the rod and electrodes. The process described above for assembling Sn foil into apertures cut in a polymer film can here be employed. With the preform complete, such is then drawn into a sub-fiber of e.g., about several meters in length and cut into a number of sub-fiber sections, e.g., 1000 sections, each section having a length of, e.g., 15 cm.

In assembly of a preform for the hybrid fiber, each of the cut sub-fiber sections is arranged, e.g., in an array. In one example technique for producing such an array, the sub-fiber sections are inserted inside a hollow sacrificial tube element, e.g., a quartz or Teflon™ tube. Because in this example each sub-fiber section includes electrodes that extend to the end of the sub-fiber section, it can be preferred dip the tube of sub-fibers into, e.g., a liquid polymer solution to coat the ends of the electrodes such that they will be geometrically confined when the hybrid fiber is drawn. The arrangement is then consolidated, in the manner described below, if necessary, and the sacrificial quartz tube removed or etched from the preform by, e.g., a liquid HF etch process. As a result of a consolidation process, the arrangement of sub-fiber sections are fused together as a unitary hybrid structure and the electrodes are coated with a polymer at the sub-fiber ends.

The hybrid preform structure can then be drawn into a hybrid fiber structure under the draw conditions described below. In the current example of sub-fiber elements, each sub-fiber section in the fiber array is, e.g., about 400 µm in diameter after its first drawing. The hybrid fiber drawing process further reduces the diameter of each sub-fiber; for example, given a drawdown reduction factor of 20, the diameter of each 400 µm-diameter sub-fiber section is reduced to 20 µm. Thus, as a result of the dual draw processes employed in this method, very minute fiber features are produced in each of the sub-fiber sections included in the hybrid fiber.

In addition to the preform assembly techniques described above, the invention contemplates drilling, casting, molding, and other techniques for producing a preform. For example, holes can be drilled in a polymer body and conducting or semiconducting strands or other elements fitted into the drilled regions. Any preform assembly technique that accommodates all of conducting, semiconducting and insulating materials in an arrangement that enables co-drawing of the three materials can be employed.

Depending on the selected preform assembly technique and resulting arrangement, it can be preferred to thermally consolidate an assembled preform prior to the fiber drawing process. Consolidation is a process whereby under heat and vacuum conditions one or more of the preform materials are caused to fuse together, with air pockets in the preform being substantially eliminated. This results in a preform assembly that can produce intimate interfacial contact between adjacent material layers in the final fiber, and provides the preform with self-maintaining structural stability during the fiber draw process.

The specific conditions of the consolidation process are selected based on the particular materials incorporated into a given preform. If, e.g., a high glass-transition-temperature polymer is employed in the preform, then the consolidation temperature preferably is above the glass transition temperature of the polymer. The preform is maintained at the elevated temperature for a time sufficient to cause the polymer to fuse to adjacent elements included in the preform; the temperature is selected based on the preform diameter and its materials. Given a preform including PES polymer elements, $As_2Se_3$ semiconducting elements, and Sn metal elements, a consolidation temperature of between about 250° C.-280° C., e.g., about 260° C., at a pressure of about $10^{-3}$, sufficiently consolidates the structure.

For most consolidation temperatures, metal preform elements will be melted during the consolidation process but confined to their intended geometries by the arrangement of confinement layers described above. Depending on the consolidation temperature, semiconducting preform elements may soften or may remain solid. The inclusion of at least one material that can fuse to adjacent materials during consolidation is all that is required. In the PES-$As_2Se_3$—Sn example given above, the consolidation temperature is set to enable softening and fusing of the PES polymer to adjacent preform elements.

It can be preferred to carry out the consolidation process in a vertical rotating zone refinement furnace. In such a furnace, the preform longitudinal axis is held vertically and a zone refining heating process is carried out along the preform length. Preferably the consolidation is conducted from the preform bottom upward through the preform to its top. The heating time for each incrementally consolidated preform section along the preform length is determined based on the preform diameter and material elements as explained above.

As explained above, in construction of a preform there can be included one or more sacrificial elements that are incorporated in the preform solely to define spaces to be provided in a final fiber geometry. For example, a mandrel, rod, or tube can be included in a preform where a hollow fiber core or other region is desired. If a sacrificial element is included in a preform, it is preferred that the consolidation process be carried out at a temperature below the glass transition temperature of that element, so that structural integrity of the sacrificial element is maintained during the consolidation process and the preform does not collapse on itself.

For many preform material arrangements, a sacrificial element can be constructed that can withstand reasonable consolidation temperatures and pressures and can easily be removed from the preform after consolidation. For example, Teflon™ tubes, rods, or other elements can be readily incorporated into and removed from a preform. Any material that exhibits poor surface adhesion and can withstand the consolidation process is a good sacrificial element material. It is preferable to remove the Teflon™ or other sacrificial element immediately after the consolidation process, while the preform is hot and slightly expanded. This enables ease of removal. Once the preform cools and correspondingly shrinks, it can be difficult, if not impossible, to remove the element by simple mechanical force.

Alternatively, sacrificial elements which can be removed from a consolidated preform by chemical etching can be employed. For example, glass, quartz, or other etchable materials that can withstand the consolidation process can be employed. In such a scenario, after the consolidation process, the preform is exposed to a chemical etchant that selectively attacks the sacrificial elements. For example, hydrofluoric acid or other acid bath can be employed for wet chemical etching of sacrificial elements. Dry etch techniques, e.g., plasma etch techniques, can also be employed if such can be adapted to contact and selectively attack the sacrificial materials in a preform.

Once a preform has been consolidated, if necessary, and sacrificial elements removed from the preform, drawing of the preform into a fiber can proceed. Fiber drawing can be carried out in a fiber draw tower or other suitable draw apparatus. In such an apparatus, a top preform downfeed mechanism is provided for holding an end of the preform and lowering the preform into a furnace. It can be preferred to employ a vertical draw furnace enabling three temperature zones, namely, top, middle, and bottom temperature zones. Below the furnace is provided a capstan with spooler for spooling the drawn fiber. Measurement equipment, e.g., a laser diameter monitor, from Beta LaserMike, Dayton, Ohio; fiber tension measurement devices, e.g., Model SM9649P, from Tension Measurement, Inc., of Arvada, Colo., and other monitoring equipment can be included.

The draw furnace temperature zones, preform downfeed speed, and capstan speed are selected based on the preform materials and configuration to enable co-drawing of preform conducting, semiconducting, and insulating material elements into a desired fiber configuration. The top furnace zone temperature is selected to cause the preform materials to soften but not flow. The middle furnace zone temperature is selected as the draw temperature, to cause the preform to flow into a fiber form. As explained above, the draw temperature is selected to be above the glass transition temperature of the insulating and semiconducting materials, and for most material combinations, will be above the melting temperature of the conducting material. If an excessively high draw temperature is employed, the preform will catastrophically deform, while an excessively low draw temperature will cause preform distortion and expansion. The structural arrangement of the preform must be preserved at the draw temperature.

It is therefore to be recognized that some experimental testing of draw temperatures can be required for a given preform assembly. As explained above, a reasonable criterion for polymer, metal, and chalcogenide material draw temperatures is that all materials have a viscosity lower than about $10^6$ Poise, or more preferably about $10^5$ Poise, at the draw temperature and that the metal be molten at the draw temperature. Given a preform of PES polymeric insulating elements, $As_2Se_3$ semiconducting elements, and Sn conducting elements, a top zone temperature of between about 180° C.-250° C., e.g., 190° C.; a drawing zone temperature of between about 280° C.-315° C., e.g., 300° C.; and a bottom zone temperature that is unregulated, and therefore at, e.g., about 100° C., due to proximity to the draw zone, can be employed for successfully drawing the preform into a fiber.

For many applications, it can be preferred to ensure uniform heating of the preform during the drawing process. A uniformly heated furnace employing, e.g., distributed filament heating, is particularly well suited for the drawing process. It is further preferred that the preform be maintained laterally centrally in the drawing temperature zone. If the preform temperature distribution becomes nonuniform due to lack of furnace temperature control or lateral misalignment of the preform as it passes downward through the drawing zone, there could be produced local preform regions of differing temperature and differing viscosity. Local viscosity fluctuations in the preform could produce a capillary effect in which material, particularly molten metal, flows to other preform regions, and distorts the intended fiber geometry. The physical confinement of metal elements described above can be important for inhibiting such a condition, but in general, uniform preform heating is preferred for preserving an intended fiber geometry.

The combination of preform downfeed speed and capstan drawing speed determine the diameter of fiber produced by the drawing process for a given drawing temperature. A diameter monitoring system can be configured in a feedback loop to enable control of, e.g., the capstan speed, by the diameter monitors based on a diameter setpoint and control algorithm. For the drawing furnace zone temperatures recited above for drawing a PES-$As_2Se_3$—Sn preform of 20 cm in diameter and 30 mm in length, a downfeed speed of between about 0.002 mm/sec-0.004 mm/sec and a capstan speed of between about 0.7 m/sec-3 m/sec produces a fiber of a diameter between about 1200 µm and 500 µm and a length of several hundred meters. As can be recognized, a reduction in draw speed increases the resulting fiber diameter. Within the fiber, layers of the preform are reduced in thickness by a factor of ~20-100. In accordance with the invention, a preform can be drawn multiple times to reduce the final resulting fiber geometry correspondingly.

The drawdown ratio between a fiber preform and the resulting fiber is not precise; specifically, the preform layer thickness drawdown ratio does not always correspond precisely to the fiber's outer diameter drawdown ratio. This can be due to a number of factors, including, e.g., reduction of hollow core or other hollow spaces within the preform. The relationship between the layer and outer diameter drawdown ratios is found to be closer to 1:1 for large-diameter, low-tension draw procedures. High-temperature, low-tension draw procedures can tend to produce fibers having layers thicker than predicted by the outer diameter reduction ratio, due, e.g., to partial collapse of hollow regions. It is found, however, that such effects are fairly reproducible and can be predicted based on experimental history.

Upon completion of the fiber drawing operation, there is produced a fiber that can enable optical transmission, separate and independent electrical transmission, and optoelectronic device operation. The conducting and semiconducting fiber elements therefore are provided to be functional in at least one aspect of transmission or device operation and the insulating fiber elements can be provided for electrical and/or optical isolation as well as for functionality in at least one aspect of transmission or device operation.

It is to be recognized that while it can be preferred to employ conducting, semiconducting and insulating preform materials, the fiber that results from the draw process can exhibit altered material conductivities given the scale of feature sizes and cross-sectional element dimensions of the drawn fiber. For example, the conditions of the fiber drawing and/or the structural and dimensional changes that result from the drawing could render a semiconducting or metal preform material insulating, or an insulating preform material conducting. Further, the energy band structure of materials provided in a preform can be altered by the fiber drawing and/or resulting dimensional changes, and can change their conductivity correspondingly, given the scale of fiber feature sizes. In addition, it is recognized that one or more constituents can be incorporated into preform materials that adjust the materials' conductivity upon fiber drawing. For example, conducting filaments, such as carbon fibers, can be included in a preform material such as polymer whereupon drawing, the spacing between the fibers is reduced, leading to a change in polymer conductivity.

Figure 1B:
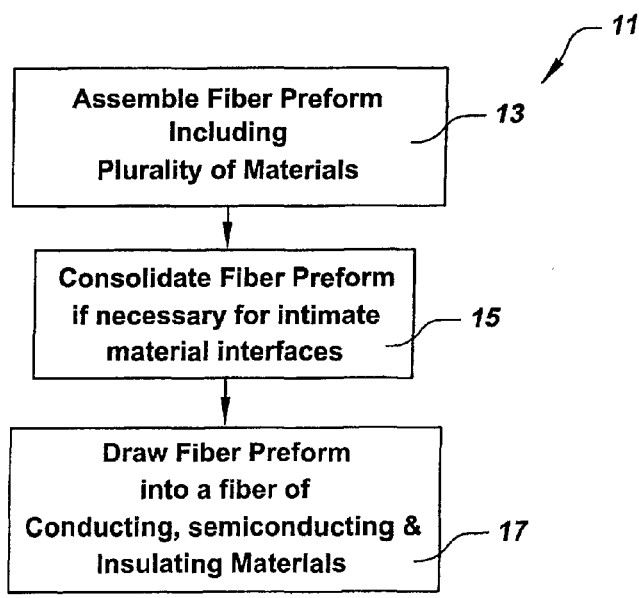

The invention contemplates employing these and other phenomena to produce a drawn fiber of conducting, semiconducting and insulating materials from a preform of materials that may not be conducting, semiconducting and insulating. A corresponding process flow 11 is described in the flow chart of FIG. 1B. In a first process step 13, a fiber preform is assembled to include a plurality of distinct materials. Then the assembled fiber preform is consolidated 15 if necessary for producing intimate interfaces as explained previously. Finally, the fiber preform is drawn 17 into a fiber of conducting, semiconducting, and insulating materials. In accordance with the invention, it is the conducting, semiconducting and insulating material properties of the drawn fiber that are to be achieved; and it is recognized that the preform need not provide a one-to-one correspondence in material conductivity with the fiber while still enabling this desired result. Shifts in the energy band structure of preform materials, dimensional, structural, and other changes in preform material constituents, and other such phenomena impacted by the fiber draw process can be employed to produce a conducting, semiconducting and insulating fiber geometry in accordance with the invention.

EXAMPLE I

Referring to FIG. 4, a fiber 90 for conducting both photons and electrons was produced in accordance with the invention. A photon conducting region was provided as a hollow fiber core 92 around which was provided a multilayer photonic bandgap structure 94 of alternating semiconducting and insulating material layers. The bandgap structure exhibited a photonic bandgap at the wavelength corresponding to photon transmission. Sixty cylindrical strands 96 each having an Sn core and polymer cladding were provided around the bandgap structure, and additional polymer reinforcement material 98 was provided around the strands.

While this example bandgap structure is an omnidirectional reflecting mirror, fibers of the invention are not limited to such; the bandgap structure need not be a multilayer or 1D photonic bandgap structure and instead can exhibit a 2D or 3D photonic bandgap employing structures having periodicities in more than one direction. In the bandgap structure shown, the wavelengths at which photons are transmitted are controlled by the period length of the dielectric mirror of the structure. A change in the period length thereby changes the transmission wavelength.

The fiber preform for this geometry was assembled by wrapping a PEI film, coated on both sides with a layer of $As_2Se_3$, around a Pyrex tube. Specifically, a 2.6 μm-thick layer of $As_2Se_3$ was evaporated onto both sides of a PEI film of 8 μm in thickness. The semiconducting material was chemically synthesized in the manner described previously. High purity As and Se elements were placed into a quartz tube under a nitrogen atmosphere. The tube was heated to 330° C. for one hour at a rate of 1° C./min under vacuum to remove surface oxide, $As_2O_3$, and then cooled to room temperature at 1° C./min. The tube was then sealed under vacuum of about $10^{-5}$ Torr. The resulting ampoule was heated to 700° C. at a rate of 2° C./min in a rocking furnace, held vertical for 10 hours, and then rocked for 12 hours to increase mixing and homogenization. The liquid was then cooled to 550° C., and quenched in air and water. It was then annealed for one half hour to about 180° C. and then gradually cooled to room temperature. The synthesized chalcogenide semiconductor was thermally evaporated onto both sides of the PEI film, the two semiconducting layers being ¼ the polymer film thickness.

The coated polymer film was then rolled around a Pyrex tube having an outer diameter of 16 mm. The diameter of the tube was selected in concert with the polymeric insulator and semiconductor layer thicknesses, the required fiber inner core diameter, and the desired bandgap wavelength. A PEI layer was provided as the outermost layer of the material pair. Eight pairs of $As_2Se_3$/PEI layers were wrapped around the tube. Polymer-coated Sn strands were then produced in the manner described above. 5 mm diameter Sn wires were each wrapped with a layer of 7.5 mm-thick PEI film. The ends of the wrapped wires were coated with a polymer solution of 20% PES, 80% N,N-Dimethylacetamide.

Each of the polymer-coated metal strands was then attached to the PEI layer by applying a polymer solution of 20% PES, 80% N,N-dimethylacetamide on the PEI film and sticking the strands to the film. Additional layers of PEI film were then wrapped around the metal strands. The resulting preform was then consolidated at a temperature of 260° C. and a pressure of $10^{-3}$ Torr. After consolidation, the preform was immersed in a liquid HF bath or 3 hours to selectively etch away the Pyrex tube.

With the sacrificial Pyrex tube removed, the finalized preform was then drawn under conditions with a top zone temperature of 192° C., a draw temperature of 302° C., a downfeed speed of 0.003 mm/min and a capstan speed of 1 m/min. This resulted in the preform being drawn down to a fiber including an $As_2Se_3$ layer thickness of 150 nm, a PEI layer thickness of 280 nm, and a Sn metal wire diameter of about 8 μm.

Figure 5:
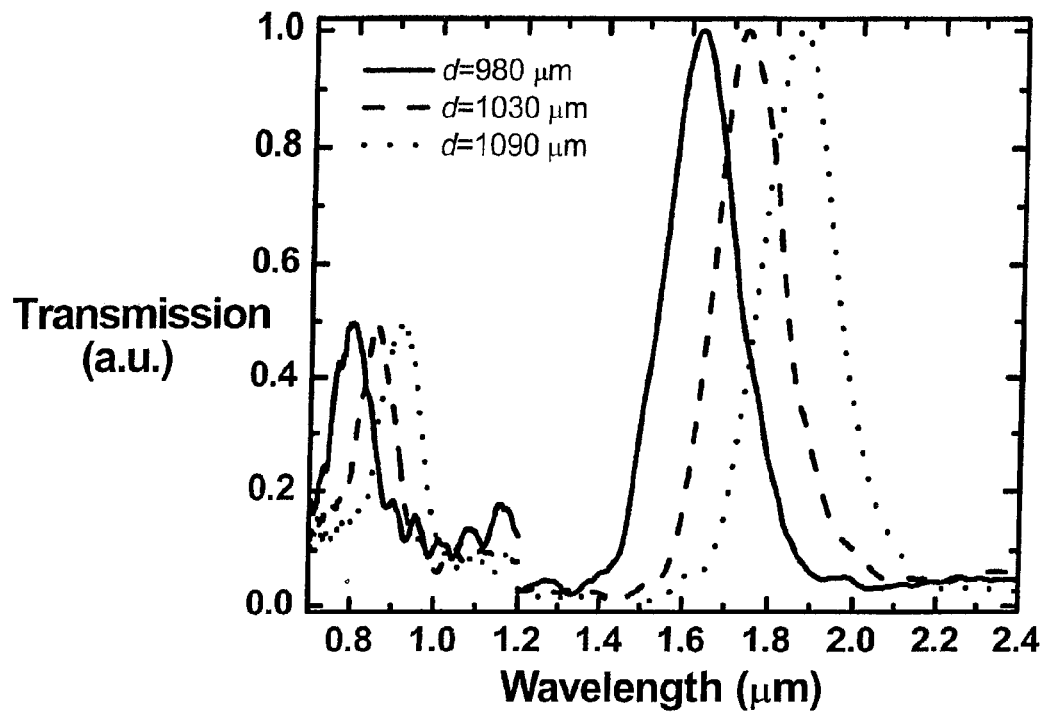
FIG. 5 is a plot of measured optical transmission as a function of transmitted wavelength for the fiber of FIG. 4.

FIG. 5 is a plot of experimentally measured optical transmission spectra of the dual electron-photon conducting fiber configuration of FIG. 4 for three different fiber outer diameters, namely, 980 μm, 1030 μm, and 1090 μm. Optical transmission measurements were performed using a Bruker Tensor 37 FTIR spectrometer with an InGaAs detector, in the near infrared region. Both ends of the fiber were coated with a thick layer of gold to ensure light coupling to the hollow core only, as well as to facilitate electrical conduction experiments. The fibers exhibited transmission peaks corresponding to the fundamental and second-order photonic bandgaps, which for the 980 μm-diameter fiber were located at 1.62 μm and 0.8 μm, respectively. As explained previously, the positions of the photonic bandgaps are determined by the lattice period of the layered mirror structure, which is in turn controlled by the final fiber diameter.

Figure 6:
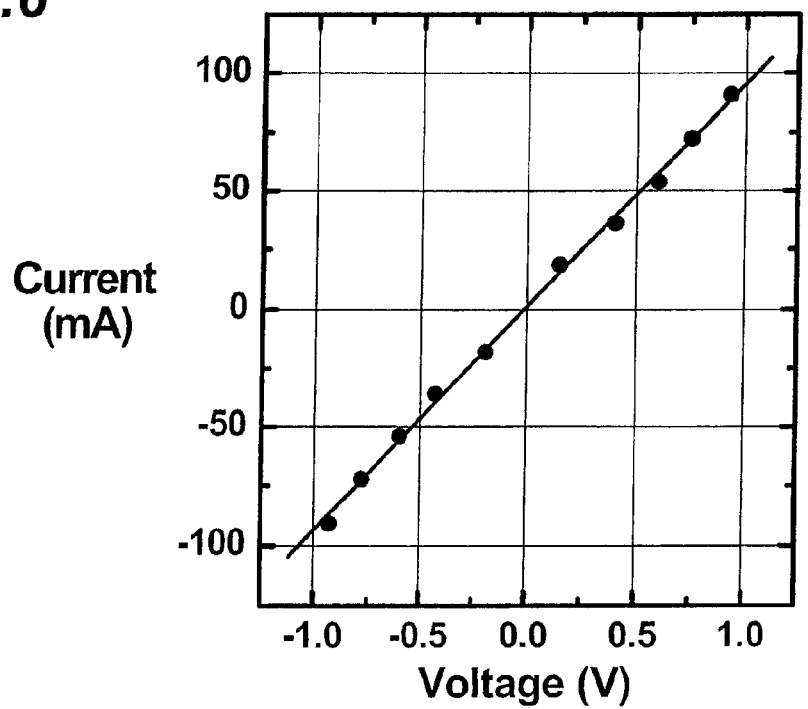
FIG. 6 is a plot of measured conducted electrical current as a function of applied voltage for the fiber of FIG. 4.

FIG. 6 is a plot of electrical current as a function of voltage applied across the metal strands of the fiber of FIG. 4. The electrical current of the strands was measured directly under the applied voltage. The electron transport properties of the fiber were found to be ohmic over the range of measurement. It was also found that electrical contact to the fiber could be achieved using conventional solder due to the high glass transition temperature of the PEI and PES polymers employed in the fiber structure.

Figure 7A:
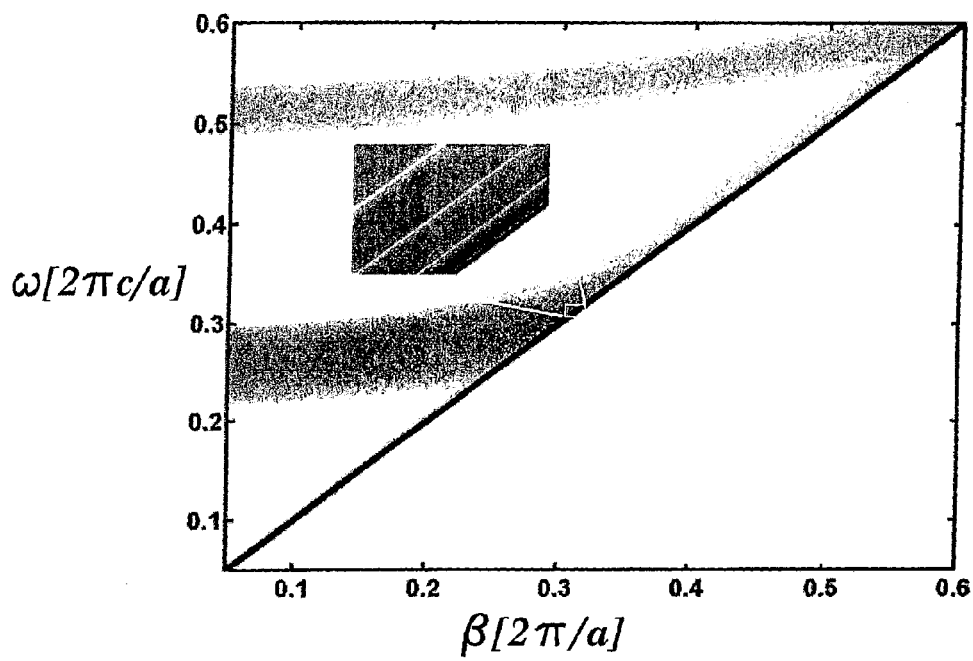
FIG. 7A is a plot of the calculated photonic band structure for the fiber of FIG. 4.

The photonic band structure and theoretical optical transmission of the fiber of FIG. 4 was predicted using a general expression for the radial outgoing flux from the cylindrical fibers. The plot of FIG. 7A represents the resulting band diagram. Darker shaded areas correspond to bandgap regions having decaying solutions for outgoing flux. Lighter shaded areas outside the bandgaps correspond to regions where light couples to radiating modes that are transmitted through the mirror structure and are therefore not localized for transmission within the hollow fiber core.

The optical transmission properties of these high overmoded fibers are set by the small intermodal separation, which is inversely proportional to the square of the fiber radius. Thus, a fiber core radius of 250λ, or 400 μm, is expected to have ~$10^5$ modes, making it difficult to observe the individual dispersion curves of the propagating modes in a full scale band structure. The inset image of the plot is a magnified segment of the guided modes near the light line, where the dispersion curves of the first three propagating fiber modes with angular momentum of 1 can be observed by the light colored stripes that indicate local minima in the outgoing flux, and therefore a strong confinement of the field within the hollow core.

Figure 7B:
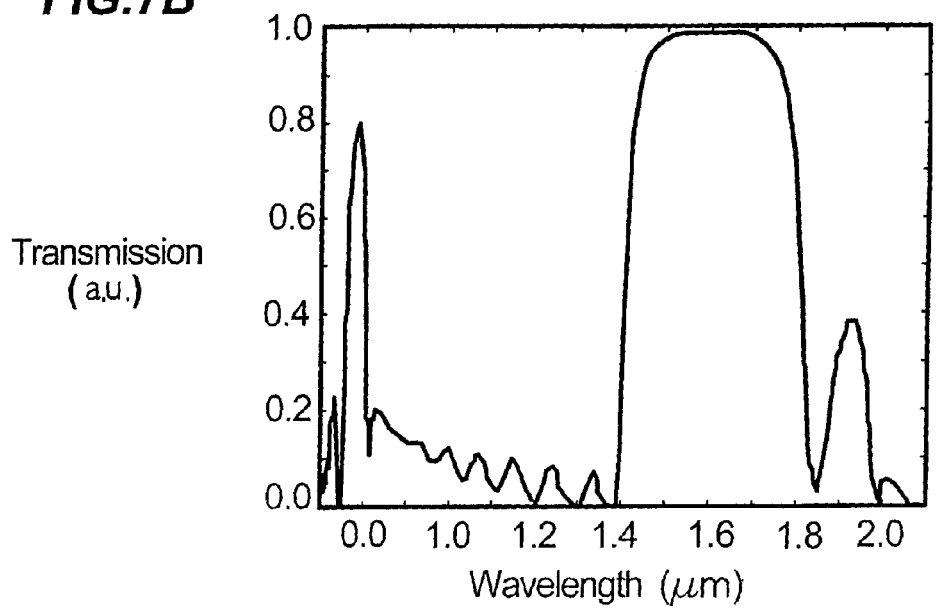
FIG. 7B is a plot of the calculated $HE_{11}$ mode transmission spectrum as a function of wavelength for the fiber of FIG. 4.

FIG. 7B is a plot of the calculated transmission spectrum for the fiber, based on the leaky mode technique. This calculated spectrum compares well with the measured spectra of the plot of FIG. 5, demonstrating high transmission at wavelengths corresponding to the first and second order photonic bandgaps.

EXAMPLE II

Referring now to FIG. 8, a fiber was produced in accordance with the invention configured with a 500 μm diameter semiconducting core region 102 of $As_2Se_3$ chalcogenide glass directly contacted by two Sn metal electrodes 104 of 65 μm in radial thickness and 180 μm in circumferential length, along the longitudinal length of the fiber. A layer of PES was provided around the metal electrodes.

The fiber preform was produced in the manner described previously, with the $As_2Se_3$ chalcogenide glass core chemically synthesized. The metal electrodes were formed of Sn foil cut into rectangles and inserted into regions cut into a PES film. The Sn-PES structure was then wrapped around the glass core, and additional PES layers were wrapped around the assembly.

The preform was consolidated at a pressure of $10^{-3}$ Torr and a temperature of 260° C. The preform was then drawn under conditions with a top zone temperature of between 190° C.-230° C. and a draw zone temperature of between 290° C. and 295° C. A downfeed speed of 0.003 mm/min and a capstan speed of 1 m/min were employed.

Under experimental testing, the electrical resistance of the fiber was found to decrease dramatically upon illumination, due to the photo-induced generation of electron-hole pairs at the surface of the semiconducting core 102. This demonstration verified the operation of fiber as a photodetector device. Once such charges are generated, they are separated by an electric field produced by a voltage applied between the metal electrodes and are swept towards opposing electrodes.

Figure 9A:
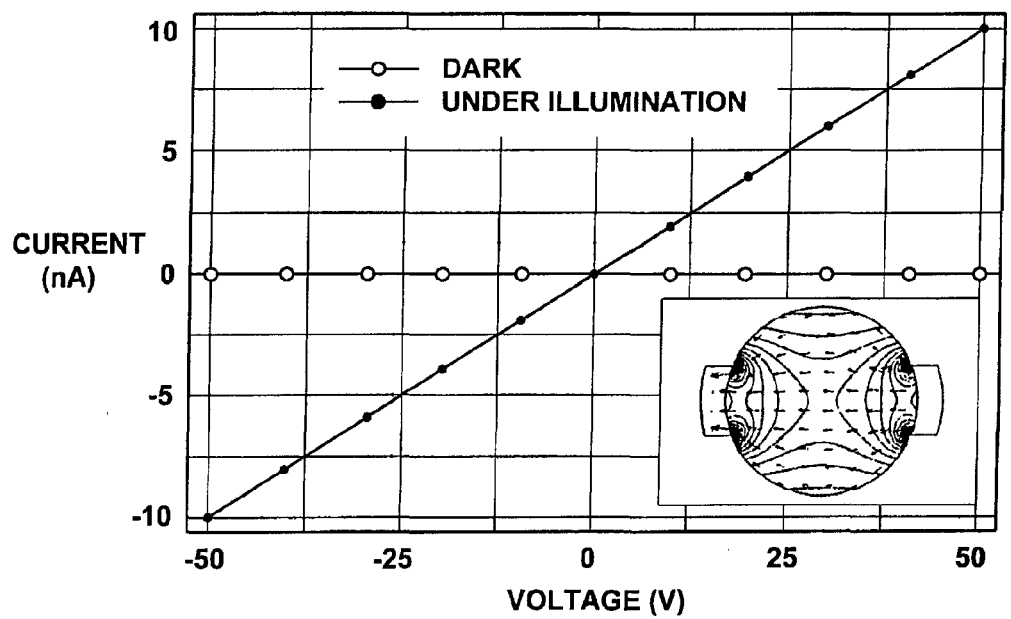
FIG. 9A is a plot of the measured current-voltage characteristics of the fiber of FIG. 8.

FIG. 9A is a plot of the photo-response of the photodetector fiber. This photo-response was measured using a Yokagawa pico-ampere meter and a Hewlett Packard 4140B DC voltage source. The fiber was illuminated using white light from a quartz-tungsten-halogen lamp, which was measured to produce a conductivity enhancement of up to two orders of magnitude. The linear behavior of the I-V plot of FIG. 9A is indicative of ohmic behavior in the structure; no Schottky effects at the metal-semiconductor junction were observed over the range of measurement. It is to be noted that the photodetector fiber could alternatively be operated in a capacitive rather than resistive detection mode.

Figure 9B:
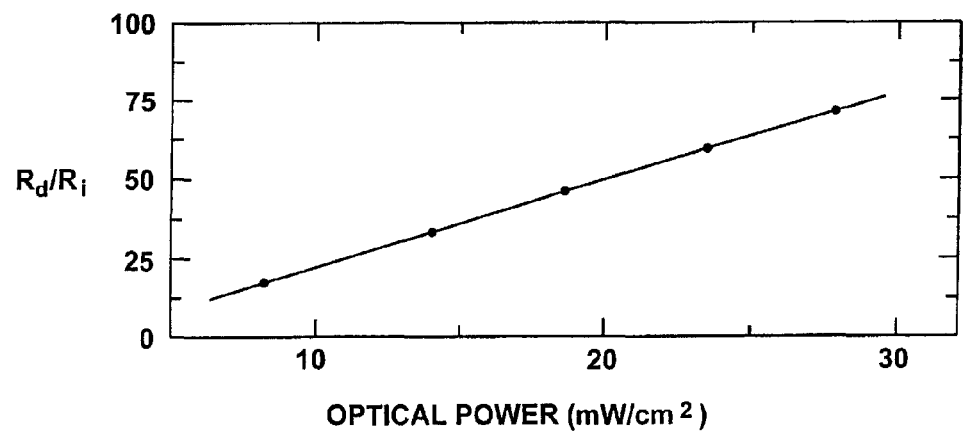
FIG. 9B is a plot of measured fiber resistance as a function of illumination intensity for the fiber of FIG. 8.

FIG. 9B is a plot the dependence of photodetector fiber's conductivity on optical illumination intensity, which was found to be linear over the range of measurement. The electric field lines produced by the applied voltage were simulated using finite element techniques and are shown in the inset of FIG. 9A.

The photodetector fiber response is reminiscent of a metal-semiconductor-metal photodetector (DMSM), and provides particular advantages over that structure. In particular, the invention enables adaptation of the photodetector fiber for a range of applications. For example, the hybrid fiber array of FIG. 3G can be configured as an array of photodetector fibers. Other configurations can also be arranged to enhance and/or exploit the photoresponse of the photodetector fiber.

Figure 10A:
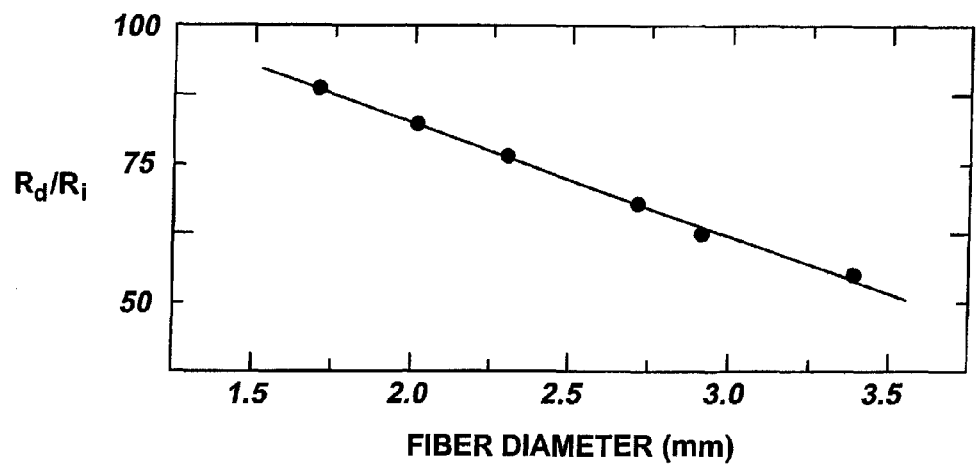
FIG. 10A is a plot of measured fiber resistance as a function of fiber diameter for a given fiber illumination, for the fiber of FIG. 8.

The photosensitivity of the photodetector fiber was found to scale inversely with its diameter, and thus fibers with smaller element diameters are understood to exhibit increased photosensitivity. FIG. 10A is a plot of photodetector fiber resistance, $R_f$, as a function of fiber diameter. It can be shown from simple scaling arguments that a reduction in fiber dimensions will not change the dark resistance, $R_d$. However, upon illumination, a conducting layer is formed along the circumference of the fiber having a thickness which is determined solely by the penetration depth of the illuminated light, which is independent of diameter. The resistance of this layer scales linearly with its length, which in turn is proportional to the fiber diameter, resulting in the observed linear dependence of the illuminated fiber's resistance diameter.

Figure 10B:
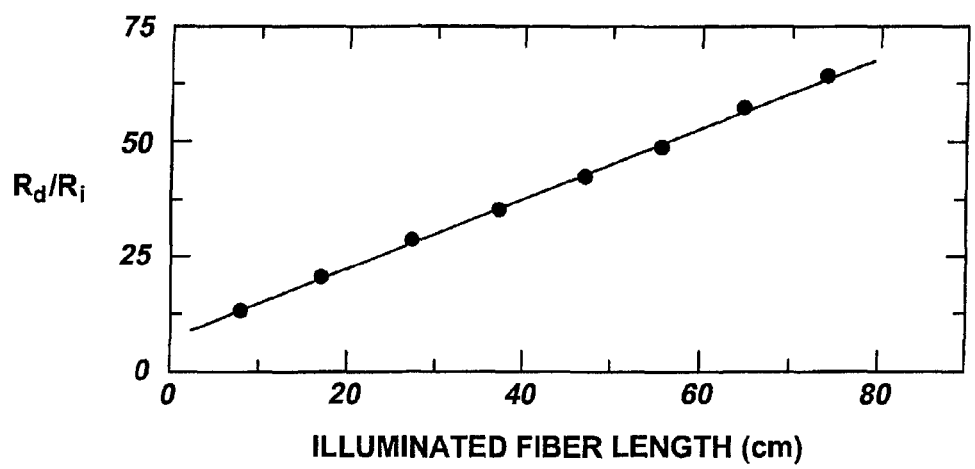
FIG. 10B is a plot of measured fiber resistance as a function of illuminated fiber length for a given fiber illumination, for the fiber of FIG. 8.

It was found that the photodetector fiber's photogenerated current also depends on the length of the illuminated portion of the fiber. FIG. 10B is a plot of resistance as a function of illuminated fiber length. This result demonstrates that the photodetector fiber exhibits truly distributed characteristics. The photodetection functionality is continuous along the photodetector fiber length, in contrast to conventional photodetecting elements that typically are point-like objects limited to the micron scale. The electronic mobility edge of $As_2Se_3$ glass corresponds to a wavelength of 650 nm, making this fiber configuration an efficient photo-detector over the visible range as well as near IR range. This detection range could be readily expanded through selective compositional changes to the core glass.

Thermal Sensing

The invention provides fiber configurations and manufacturing processes that enable thermal sensing using a single fiber and that enable thermography with an assembly of such fibers, e.g., in a woven mat, grid, fabric, or in three dimensional assemblies of fibers, or multiple arrangements of such. Each of these configurations provided by the invention will be described in detail below.

The thermal sensing fiber of the invention, also herein referred to as a heat sensing fiber, a thermistor fiber, or a fiber thermodetector, employs electrically conducting, semiconducting, and electrically insulating materials in a configuration that enables sensing of changes in temperature. Based on the configuration, the sensed temperature changes can be initiated in the ambient environment of the fiber, and/or can be a temperature change that is initiated in the fiber itself, whereby the fiber is thermally self-monitoring, as explained in detail below. In either case, optical and/or optoelectronic materials, elements, and devices can also be included in the fiber for optical transmission, electrical transmission, optical device operation, and/or electrical device operation, in the manner described above.

Figure 11:
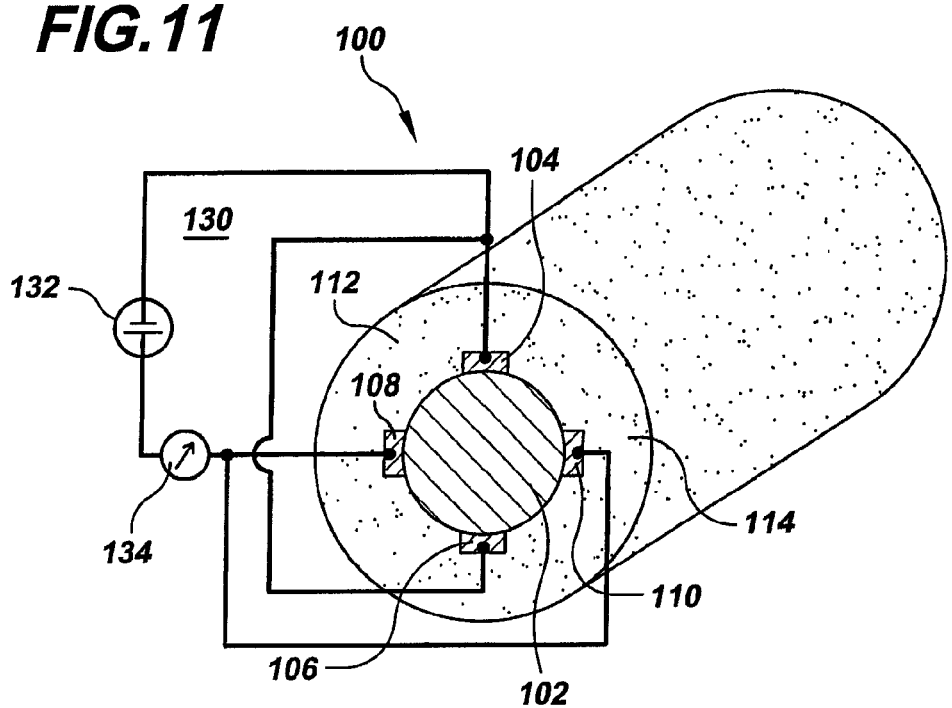
FIG. 11 is a schematic view of an example thermal sensing fiber provided by the invention.

A first example thermal sensing fiber 100 is schematically shown in FIG. 11, not to scale, for clarity of the features. The thermal sensing fiber includes a cylindrical region 102, that can be characterized as a solid, bulk rod, formed of a semiconducting material. Two or more electrically conducting regions, e.g., two electrode pairs provided by four conductors 104, 106, 108, 110, are each provided in direct contact with the semiconducting region 102. An electrically insulating region 112 surrounds the semiconducting region 102 and the electrodes 104, 106, 108, 110, with the electrodes being geometrically confined by the semiconducting element and the insulator.

This thermal sensing fiber 100 is produced in the manner described above, with co-drawing of a preform of conducting, semiconducting, and insulating materials to produce a final fiber geometry. Thus, the semiconducting cylindrical region 102 and the conductors 104, 106, 108, 110 each extend the full length of the fiber, such that the fiber is of uniform cross-section 114 along its length, as shown in FIG. 11. The fiber preform assembly techniques and fiber drawing processes described above are directly applicable to this thermal sensing fiber production, for producing hundreds of meters of thermal sensing fiber.

Reviewing the steps of one such example fiber production sequence, referring to FIGS. 12A-12D, a macroscopic preform is first assembled e.g., by forming a cylindrical shell 120 of a selected insulating material having an inner diameter corresponding to that desired for the cylindrical semiconducting region. For the 4-electrode example of FIG. 11, four slits of material are removed from the wall of the shell 120, and a selected conducting material 122 is placed in each of the slits. A rod 124 of selected semiconducting material is inserted into the insulating shell.

Figure 12A:
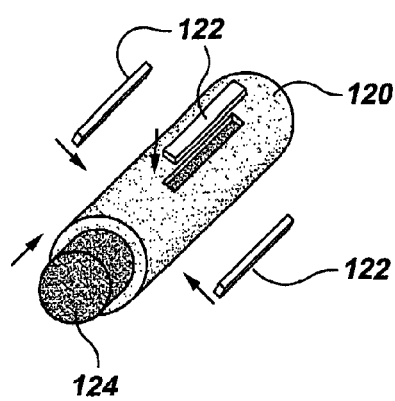
FIGS. 12A-D are schematic views of steps in preform assembly and drawing of the fiber of FIG. 11.
Figure 12B:
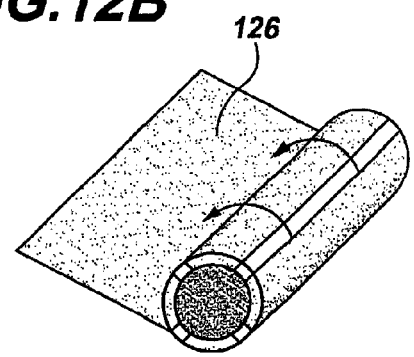
Figure 12C:
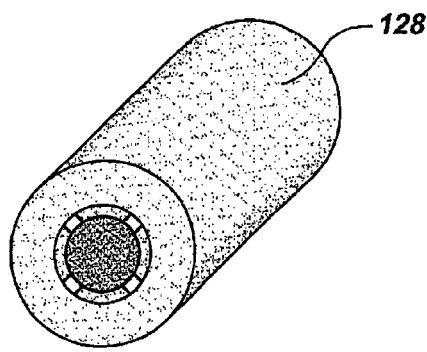
Figure 12D:
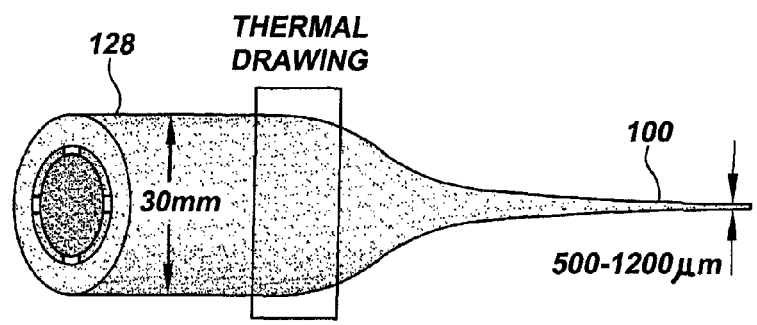

As shown in FIG. 12B, in one convenient preform assembly technique, a sheet of insulating material 126 is then rolled around the cylindrical assembly. The rolling is continued until a desired fiber cladding thickness is provided. The cylindrical preform 128, FIG. 12C, is then thermally consolidated, in the manner described above, and subsequently drawn in a fiber draw tower. As shown schematically in FIG. 12B, the fiber drawing maintains the geometry and structure of the macroscopic preform while reducing the dimensions of the preform cross section to that of a fiber. For example, a 30 mm-diameter preform cross section is reduced by the fiber draw process to a fiber having a diameter of between, e.g., about 500 µm-about 1200 µm.

Referring back to FIG. 11, in operation as a thermodetector, the thermal sensing fiber 100 is configured in an external electronic circuit 130 such that a voltage 132 is applied between electrodes of the fiber, and some means, e.g., an instrument, is included for measuring current 134 or some other parameter that can be associated with current in the circuit, such as the voltage drop across a series resistor in the circuit. In this arrangement, the electrodes cooperate with the semiconducting region to form a metal-semiconducting-metal (MSM) thermal sensing device in the circuit. Heat from an ambient environment in which the thermal sensing fiber 100 is disposed is conducted through the cladding region 114 to the semiconducting region 102. Thermally excited electronic charge carriers, electron-hole pairs, generated in the semiconducting region change the electrical resistivity of the semiconducting region, with the population of carriers affecting the resistivity. These changes in semiconductor resistivity in turn result in adjustments in the current in the external circuit 130 as the semiconductor region operates as a resistive element in an MSM device connected in the external circuit. The resistance of the circuit is therefore modulated as a function of heat that is transduced by the MSM device of the fiber; in other words, the MSM device transduces a change in temperature into a change in a measurable electrical parameter. This measurable electrical circuit parameter can also be selected as, e.g., voltage, and/or capacitance.

In general, the resistance, R, of the semiconducting region material can be given as:

$$R \propto \exp(\Delta E / k_B T), \quad (1)$$

where $k_B$ is the Boltzmann constant, T is the absolute temperature, and $\Delta E$ is the thermal activation energy that is characteristic of the particular semiconducting material employed in the thermal sensing fiber.

The equivalent conductance, $G_{Eq}$, of a length, L, of the fiber can then be modeled in terms of the local temperature distribution, $T(z)$, of the fiber, as:

$$G_{Eq} \propto \int_L \exp(-\Delta E / k_B T(z)) dz. \quad (2)$$

Based on these considerations, the semiconducting material to be used in the MSM device of the thermal sensing fiber preferably is characterized by a high electrical responsivity to a small change in temperature in the range of temperatures of interest for a given application. With this characteristic, the semiconducting material demonstrates a large change in resistance to a small change in temperature.

In addition, as explained in detail previously, the selected semiconducting material must be compatible with a selected insulating material and a selected conducting material for co-drawing of the three materials from an assembled preform into a thermal sensing fiber. The considerations described previously here apply; for example, all three materials should be characterized by a viscosity that is less than about $10^6$ Poise at the fiber draw temperature, with the material that constitutes a majority of the fiber material volume also characterized by a viscosity that is greater than about $10^4$ Poise.

Thus, for all three materials, the preform component that substantially supports the draw stress should be glassy, to enable fiber drawing at reasonable speeds in a furnace with self-maintaining structural regularity. The fiber structure can thus mechanically withstand the fiber draw process, characterized in that the fiber can support a mechanical load of greater than about 100 grams of force applied to the longitudinal axis of the fiber.

All three materials must be above their respective softening or melting points at the draw temperature to enable fiber co-drawing, and all three materials should exhibit good adhesion/wetting in the viscous and solid states without delamination even when subjected to thermal quenching. With these characteristics, the three materials all maintain their structural material integrity, and maintain their individual material properties, at a common fiber draw temperature, without material decomposition, as described previously. If material decomposition were to occur, such could render the properties of the materials nonfunctional for the intended thermal sensing fiber application.

As described in detail above, noncrystalline amorphous and glassy materials, as defined previously, are particularly well-suited to be co-drawn from a preform into fiber form using high speed drawing techniques. A non-composite, non-particulate, continuous, inorganic, non-crystalline, i.e., amorphous, semiconductor, and in particular the semiconducting chalcogenide glasses described above, can for many applications be a preferred semiconductor element material of the MSM device. It is here meant that the continuity and/or non-composite characteristic of the semiconductor be provided in at least one fiber direction, e.g., the circumferential or axial fiber direction. Homogeneous, inorganic semiconductors are particularly preferred. A wide range of such materials can be co-drawn with conducting and insulating materials.

In the class of semiconducting chalcogenide glasses described above, a preferable MSM semiconducting glass can be $Ge_{17}As_{23}Se_{14}Te_{46}$ (GAST), which is an optimization of the composition $Ge_xAs_{40-x}Se_yTe_{60-y}$, ($10<x<20$ and $10<y<15$) under constraints of compatibility of glass transition temperature, $T_g$, and viscosity with a co-drawn conducting material and co-drawn insulating material.

The amorphous semiconductor GAST is characterized by a relatively small bandgap energy, and such is advantageous because in general, the bandgap energy of a material is typically about twice the thermal activation energy, $\Delta E$, of that material. While the phrase "bandgap energy" is used herein, it is to be understood that for many semiconducting materials, and particularly glassy semiconducting materials, the phrase "mobility gap" can be more appropriate. The phrase "bandgap energy" is herein intended to refer to both characterizations of an energy gap.

The bandgap energy of GAST materials results in a GAST thermal activation energy that is about 0.5 eV. In general, a material that is characterized by a small $\Delta E$ tends to enhance electrical response to small change of temperature because the value of $\Delta E$ compared to the value of $k_B T$ is linked directly to the density of free carriers, i.e., carriers that participate in the conduction of current in the material at temperature, T. Therefore, a material that is characterized by a bandgap energy of, e.g., less than about 2 eV, more preferably less than about 1.5 eV, and more preferably less than about 1 eV, can be particularly well-suited for the MSM device of the thermal sensing fiber of the invention. Accordingly, the value $k_B T_0$, is preferably on the order of the semiconducting element bandgap energy, where $T_0$ is a reference temperature in a range of operational temperatures intended for the thermal sensing fiber for a given application.

To illustrate the effect of this thermal activation dependence on electrical sensitivity, consider operation of the MSM device at a reference temperature, $T_0$, and the change in resistance of the material when the temperature is adjusted to a new temperature, T. The change in resistance, $\Delta R$, resulting from the change in temperature, can be given as:

$$\Delta R \propto \exp(\Delta E/k_B T) - \exp(\Delta E/k_B T_0). \quad (3)$$

For a small change in temperature ($|T-T_0| \ll T_0$), this difference can be shown to be a maximum for $\Delta E = k_B T_0$. In other words, if the activation energy is large compared to $k_B T_0$, a small increase in temperature will generate only a small number of free carriers, which small number would be hard to detect, whereas if $\Delta E$ is small compared to $k_B T_0$, then the ambient temperature alone generates a relatively ample number of free carriers and a small change of temperature does not measurably impact that already large population of free carriers.

Considering a specific example, for a medical application in which the thermal sensing fiber is to be placed inside a human body, the temperature, T, of reference is then body temperature, about 37° C. Given a local increase in temperature of about 15° C.-20° C., then based on Expression (3) above the optimal thermal activation energy of the MSM semiconducting material is around 0.027 eV to maximize an electrical transconductance of a sensed change in temperature. The GAST materials just described are well-suited for this application; in addition, the semiconducting glasses $As_2S_3$ and $As_2Se_3$ are also candidate materials, having a thermal activation energy of around 1.1 eV and 0.8 eV, respectively. Other suitable glasses include, e.g., $As_{40}Se_{60-x}Te_x$ glasses, which are characterized by activation energies between about 0.6 eV and about 0.75 eV, and other similarly suited materials.

These example glassy semiconductors can be adapted to be optimized for the thermal sensing fiber of the invention by reducing the activation energy of the materials in an effort to come close to a desired activation energy, e.g., the optimal 27 meV activation energy for the example just above. Such can be achieved in accordance with the invention by, e.g., adding new elements, such as metals, to the semiconducting composition. But as the composition of the semiconductor is adjusted, the mechanical stability of the material must be maintained as must the ability to co-draw the material with the other fiber constituents. The GAST compositions described above are the preferred semiconducting material for the MSM device of the thermal sensing fiber because they exhibit very good thermal drawing compatibility with insulating and conducting materials and they exhibit the lowest thermal activation energy of the chalcogenide glass family. But in accordance with the invention, it can be preferred that there be employed any semiconducting material that meets the fiber co-drawing criteria of the invention and that is characterized by a relatively small electronic mobility gap, corresponding to a characteristically high electrical responsivity to small changes in temperature.

With this semiconductor selection, the considerations discussed previously for conducting and insulating material selection can be imposed. For many thermal sensing fiber applications, a polymer material like that described previously can be preferred; for example, a high glass-transition-temperature polymeric insulating material, such as polysulfone, poly-ether sulfone, poly-methyl methacrylate, or other selected insulator, can be employed as the insulating material of the thermal sensing fiber. The conducting material to be employed as the MSM electrodes of the fiber preferably is characterized by a melting temperature that is less than a selected fiber drawing temperature. Metals, such as Sn and alloys of such, e.g., Sn—Ag alloys, and other such metals are particularly well-suited as conducting materials for MSM device of the thermal sensing fiber. Strands of metal, bulk pieces of metal, or other metal geometry can be employed for the metal elements of the fiber, in the manner described above.

EXAMPLES III-IV

A rod of the chalcogenide glass $Ge_{17}As_{23}Se_{14}Te_{46}$ was formed having dimensions of 10 mm in diameter and 15 cm in length. The rod was prepared from high-purity (5-6N) Ge, As, Se and Te elements, from Alfa Easar, Ward Hill, Mass., using conventional sealed-ampoule melt-quenching techniques. In this process, the materials were weighed and placed into a quartz tube under a nitrogen atmosphere. The tube was heated to 330° C. for an hour at a rate of 1° C./min under vacuum in order to remove surface oxides.

An ampoule was formed by sealing the tube under vacuum at a pressure of ~$10^{-5}$ Torr. The ampoule was then heated to 950° C. at a rate of 2° C./min in a rocking furnace for 18 hours, while held vertical, and then rocked for 6 hours to increase mixing and homogenization. The resulting glass liquid was then cooled to 710° C. in the rocking furnace and then quenched in cold water. Subsequently, it was annealed for 30 minutes near the glass-transition temperature of the material, $T_g$ ~190° C., before being cooled gradually to room temperature.

A thermal sensing fiber in accordance with the invention was produced with this GAST rod by assembling a preform and drawing the preform into a fiber in the manner described above. The preform was assembled, 26 mm in diameter and 25 cm-long, in the manner of FIG. 12. The synthesized GAST glass core was contacted by four conduits of the alloy 96% Sn-4% Ag. This alloy is characterized by a melting temperature of between about 221° C. and about 229° C. The conduits and GAST rod were encapsulated in a protective cladding of Polysulfone from Ajedium Film Group LLC, Newark, Del. The preform was consolidated for 60 minutes at 230° C. under a vacuum of about $10^{-3}$ Torr in a three-zone horizontal-tube furnace while rotating the preform around its axis. Subsequently, the preform was drawn in a three-zone vertical-tube furnace with the top-zone temperature between 165° C. and 200° C., and the middle-zone temperature at 270° C.

The thermal response of the chalcogenide GAST semiconductor was characterized in two forms, namely, bulk form and fiber form. To obtain the bulk form, a bulk sample was prepared by cutting a disk of 6.5 mm in diameter and 1.3 mm in thickness from the synthesized GAST rod. Measurements on this sample were carried out to provide information relating to the intrinsic properties of the glass. To obtain the fiber form, a 9 cm-long fiber section, having a 1150 μm outer diameter, was cut from the drawn length of fiber. Measurements on the fiber section were carried out to provide information relating to properties of the glass as-incorporated into a fiber device after thermal drawing of the fiber.

Both cross-sectional faces of the bulk sample were polished and then coated with a silver paint for making electrical contact with the sample. The thermal sensing fiber was adapted for ease of experimental set up by exposing the longitudinal surface of the electrodes through the fiber cladding for making electrical contact with the electrodes. The fiber polymer cladding was removed at the location of the electrodes at an end of the fiber, and the electrodes were coated with silver paint.

Both the bulk sample and the fiber section were placed in a Pyrex tube surrounded by an electrical resistive heater. The temperature of the tube was measured by means of a K-type thermocouple placed inside the tube alongside the bulk sample and fiber section. Measurements below room temperature were carried out by placing the bulk sample, fiber section, and the thermocouple in cold water.

Figure 13A:
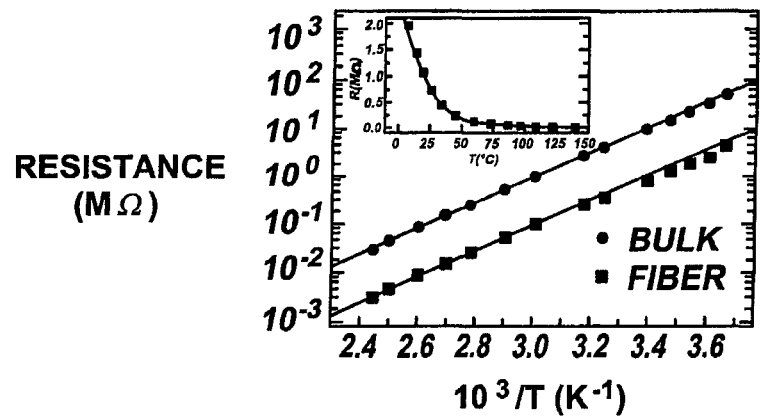
FIG. 13A is a plot of measured resistance as a function of temperature of a first experimental thermal sensing fiber like that of FIG. 11.

The electrical resistances of the two samples were measured as a function of temperature using a Keithley 2000 multimeter, from Keithley Instruments, Inc., Cleveland, Ohio. FIG. 13A is a plot of measured resistance as a function of temperature for the bulk GAST sample and the thermal sensing fiber section. The inset in the figure is a plot of resistance of the fiber sample as a function of temperature, plotted on a linear scale. It is clear from the curves of FIG. 13A that the resistances of the two samples are well-described by the exponential relation for resistance, R, given in Expression (1) above. This behavior was found to be maintained over almost 4 orders of magnitude of the resistance values. Measurements of the bulk sample yielded a room temperature resistivity of $2.3 \times 10^6$ Ω-cm for the synthesized GAST glass.

As explained above, the bandgap energy of a material is typically twice ΔE. The measurements yield a value of ΔE=0.58 eV for both the bulk sample and the fiber section. This indicates that the activation energy of the synthesized GAST chalcogenide glass was not changed by the thermal fiber drawing process. This measured value of ΔE is consistent with previously reported measurements for similar compositions of GAST glasses: $Ge_{15}As_{35}Se_{10}Te_{40}$ having ΔE=0.45 eV and $Ge_{15}As_{25}Se_{15}Te_{45}$ having ΔE=0.5 eV.

Figure 13B:
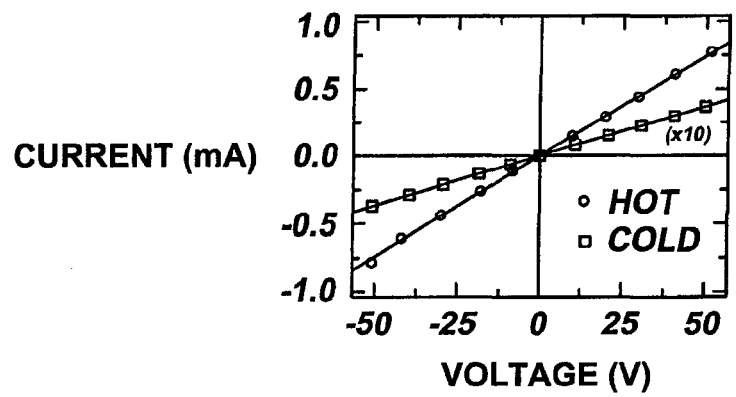
FIG. 13B is a plot of current as a function of voltage (I-V curves) for the first experimental fiber at two temperatures.

The electrical response of the fiber section was then measured. To this end the current-voltage (I-V) curve for the fiber section was measured below and above room temperature, at 11° C. and 58° C., respectively. The fiber section electrodes were connected in an electronic measurement circuit like that in FIG. 11, including a 50 V DC power supply and a 20 kΩ resistor. FIG. 13B is a plot of the measured I-V curves for the thermal sensing fiber section at the 11° C. fiber temperature (cold) and the 58° C. fiber temperature (hot). The measured I-V curves clearly indicate that the MSM device of the thermal sensing fiber is ohmic over the studied temperature range.

Figure 13C:
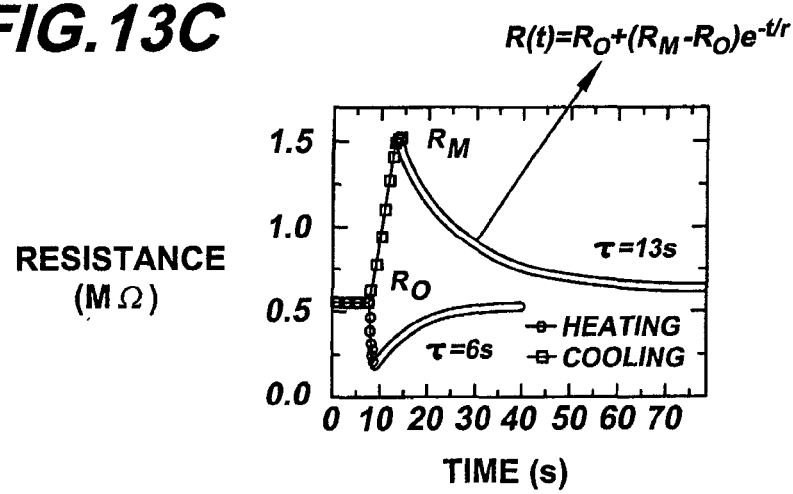
FIG. 13C is a plot of resistance as a function of time for the first experimental fiber.

The temporal response of the fiber section was then characterized after heating and cooling above and below room temperature. The fiber section was heated by dipping it in hot water, and was cooled by exposure to liquid nitrogen. FIG. 13C presents plots of the thermal sensing fiber resistance as a function of time after heating or cooling. In the plot, the relaxation of the fiber resistance to an equilibrium resistance value at room temperature after removal of the thermal excitation is fitted to an exponential curve with a characteristic time constant.

Fiber Self-Heat Monitoring

The example thermal sensing fiber of FIG. 11 and discussed in the Examples above provides a fiber device that enables sensing of changes in temperature in the ambient environment of the fiber. Such temperature changes are sensed in the fiber by thermal conduction of heat from the ambient environment through the fiber cladding to the MSM fiber device. This fiber design and operation can be adapted in accordance with the invention for monitoring heat that is generated within the fiber itself, instead of, or in addition to, monitoring of ambient environmental heat.

For many applications, optical transmission elements and electrical transmission elements included in a thermal sensing fiber can generate heat in the fiber during operation. In addition, defects and bends in a fiber can cause the generation of localized hot spots along the fiber during optical transmission. In particular, structural fiber perturbations such as fiber bends and defects can increase overall optical transmission losses that produce fiber heating. Here optical power that is radiated from an optical transmission element of the fiber is absorbed in the fiber cladding and transformed into heat. Similarly, electrical transmission elements in the fiber can generate heat that is absorbed in the fiber cladding.

In accordance with the invention, the thermal sensing fiber can include any selected configuration of optical and/or electrical transmission elements along with the MSM thermal sensing device. The MSM thermal sensing device of the fiber can here be employed to monitor temperature changes that originate at elements in the fiber itself. With this arrangement, the thermal sensing fiber is self-monitoring, and can be controlled to enable surveillance of the integrity of the fiber during fiber operation, and to signal detection of a mechanical fault or unacceptable fiber operating condition, as explained in detail below.

Figure 14A:
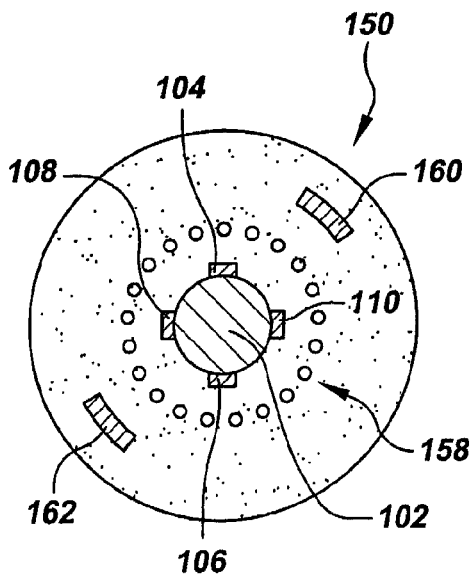
FIGS. 14A-14B are schematic cross-sectional views of two additional thermal sensing fibers provided by the invention, illustrating example elements that can be included thermal sensing fiber configurations in accordance with the invention.
Figure 14B:
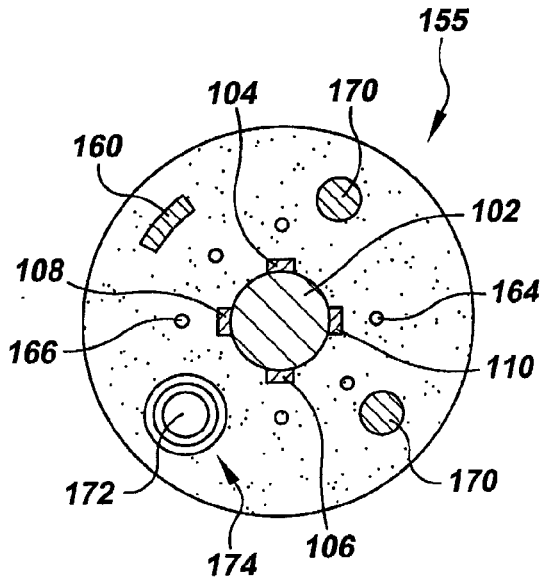

FIGS. 14A-14B are schematic cross-sectional views of thermal sensing fiber arrangements 150, 155 that can be employed for optical transmission, electrical transmission, and thermal sensing operations. In the arrangements, a semiconducting element 102 is in contact with electrodes 104, 106, 108, 110, for providing a MSM thermal sensing device like that described above and shown in FIG. 11.

There are further included in the fiber selected transmission elements arranged across the fiber cross-section in an arrangement desired for a given application. As shown in FIG. 14A, for example, an array 158 of conducting elements, such as metal strands, can be included in the fiber for electrical transmission. Bulk conducting elements 160, 162 can be arranged in the fiber cross-section also for electrical transmission. As shown in FIG. 14B, such bulk conducting elements 160 can be included with selected metal strands 164, 166. There can also be included one or more optical transmission elements, including, for example, solid semiconducting elements 170 and/or hollow optical transmission elements 172. Here, a photonic band gap structure 174 can be included, in the manner described previously, for optical transmission in conjunction with the hollow element 172. In general, selected various features previously described and shown in FIGS. 3A-3G and FIG. 4 can be incorporated in the thermal sensing fiber geometry, with the MSM thermal sensing device of the fiber included for sensing changes in ambient environmental temperature and/or changes in the temperature of the fiber due to events or conditions originating within the fiber itself.

Figure 15A:
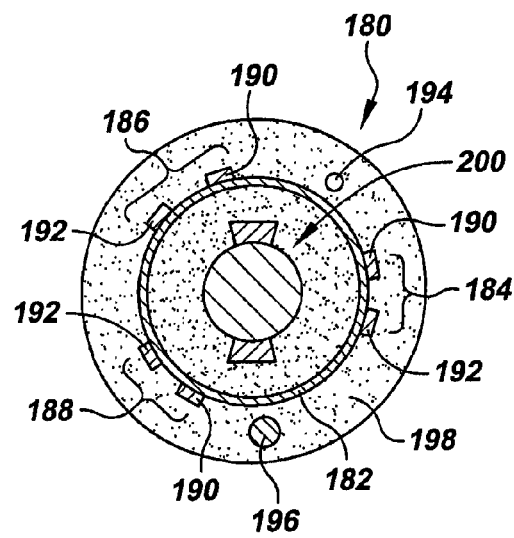
FIGS. 15A-B are schematic cross-sectional views of two additional thermal sensing fibers provided by the invention, illustrating example elements that can be included thermal sensing fiber configurations in accordance with the invention.
Figure 15B:
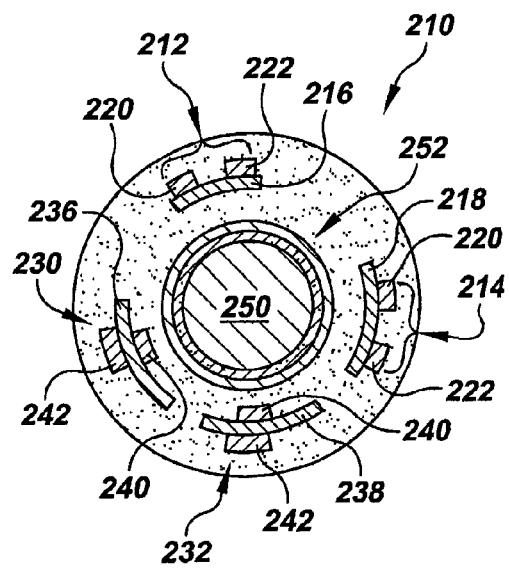

FIGS. 15A-15B are schematic cross sectional views of additional example thermal sensing fiber arrangements, here in which the MSM device of the fiber is not at a radially central location of the fiber cross section. The example fiber 180 in FIG. 15A includes a thin layer 182 of selected semiconducting material, here as a hollow rod of material, for forming a fiber MSM device. One or more MSM devices 184, 186, 188 are formed around the semiconducting layer by the positioning of pairs of electrodes 190, 192 in contact with and at locations around the layer 182. Three MSM devices are provided in the example fiber arrangement of FIG. 15A but such is not a requirement. The number of MSM devices is limited only by a requirement that the devices be spaced apart sufficiently to enable independent operation of each device. The distance between each electrode in a single MSM device can be specified based on, e.g., a desired device response speed; a shorter length of semiconducting material between two electrodes results in a faster device response.

With the MSM device arrangement of FIG. 15A, the fiber can be configured to include optical and/or electrical transmission elements as well as sensing elements, such as a photodetecting configuration. For example, conducting strands 194, semiconducting optical transmission elements 196, or other elements like that in FIGS. 14A-14B can be included in the cladding layer 198 radially outward of the MSM devices. These elements can also be configured radially inward of the MSM devices, and other bulk elements, such a photodetecting configuration 200 like that shown above in FIG. 11 and described in Example III, can be included radially inward or outward of the MSM devices. A full complement of optical transmission, electrical transmission, photodetection, and thermal sensing operations can then be carried out by a single fiber arrangement in the manner of the fiber 180 in FIG. 15A.

The circumferential spacing of multiple MSM devices across the thermal sensing fiber can be employed for discerning directionality of a heat source. For example, considering the arrangement of the fiber 180 of FIG. 15A, each MSM device 184, 186, 188 can be configured in a sensing circuit and the output of each circuit compared to identify a particular angular region of the fiber for which a temperature change is maximized. With this identification, the angular direction of an ambient heat source, or the location of a fiber defect or fault can be ascertained.

For applications in which it is preferred that the semiconducting layer 182 of the MSM devices in the fiber 180 not be continuous circumferentially, there can be employed an arrangement like that of the example fiber 210 in FIG. 15B. In this example, MSM devices 212, 214, are formed with discrete sections 216, 218 of a semiconducting material. Electrodes 220, 222 are formed in contact with each semiconducting section 216, 218. These MSM structures, like those in FIG. 15A, define a circumferential circuit path from a first electrode, through the semiconducting layer, to the second electrode. Alternatively, the MSM structure can also define a radial circuit path, as in the MSM devices 230, 232. Here a discrete semiconducting material section 236, 238 is bordered radially by electrodes 240, 242.

The example MSM device configurations of FIG. 15B are particularly well-suited for accommodating the use of distinct a semiconducting element material for each MSM device. As explained previously, the semiconducting material of an MSM device for the thermal sensing fiber is preferably selected such that the bandgap energy of the semiconducting material corresponds to a selected operational temperature range for the fiber in which there can be produced a change in thermally-excited electronic charge carrier population in the semiconducting element in response to a temperature change in the selected temperature range. The composition $Ge_xAs_{40-x}Se_yTe_{60-y}$ ($10<x<20$ and $10<y<15$) (GAST) is a particularly well-suited semiconducting material enabling this condition. As explained above, the composition of a semiconductor such as GAST can be adjusted so that the material is sensitive to temperature changes in a selected temperature range.

Each MSM device in the thermal sensing fiber can include a distinct semiconductor element material composition such that each MSM device is sensitive to temperature changes in a distinct temperature range. This condition enables the overall temperature range of operation of the thermal sensing fiber to be expanded beyond that of any single MSM device, and effectively extends the temperature range over which the fiber can carry out thermal sensing. For example, in the GAST composition, as the Te content is reduced and the Se content is correspondingly increased, the bandgap energy of the material is reduced and the temperature range at which the semiconductor is an effective temperature sensor is lowered. Thus, the GAST composition $Ge_{17}As_{23}Se_{14}Te_{46}$ is characterized by a higher temperature-sensing range than the GAST composition $Ge_{17}As_{23}Se_{24}Te_{36}$. Various semiconductor element compositions can in this manner be prescribed to achieve a corresponding temperature-sensing range for each MSM device and a combined temperature-sensing range for the thermal sensing fiber overall, under the constraint of co-drawing with a conducting material and an insulating material.

In FIG. 15B, each semiconducting element 216, 218, 236, 238, can be a distinct material having a corresponding temperature-sensing range. These various arrangements can be produced in the manner fully described previously, with a preform of selected semiconducting, conducting, and insulating elements assembled, consolidated, and drawn into fiber form. As shown in FIG. 15B, additional fiber elements, e.g., a semiconducting core element 250 and semiconducting layers 252 can be included in the thermal sensing fiber.

Figure 16A:
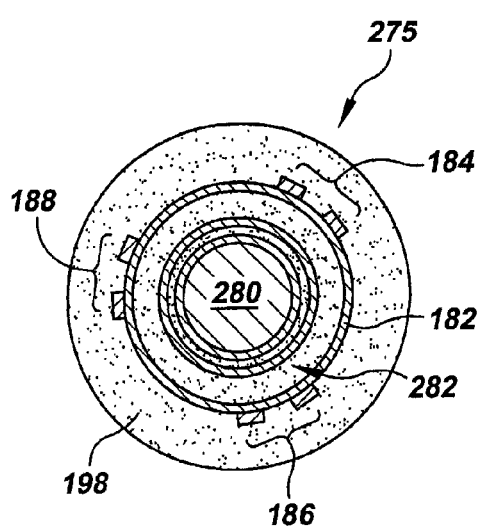
FIGS. 16A-B are schematic cross-sectional views of two additional thermal sensing fibers provided by the invention, illustrating example elements that can be included thermal sensing fiber configurations in accordance with the invention.

Turning now to FIG. 16A, there is shown a schematic cross-sectional view of a further example thermal sensing fiber 275. In this thermal sensing fiber there is provided a hollow core 280 surrounded by alternating layers of semiconducting and insulating material 282, not shown to scale, which together form a hollow-core photonic bandgap waveguide, as described previously and discussed in Example I above. One or more MSM devices 184, 186, 188 are formed circumferentially around a semiconducting layer 182 in an insulating layer 198.

Figure 16B:
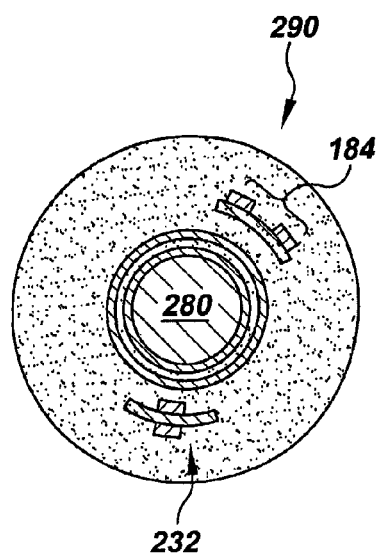

As shown in the arrangement of a thermal sensing fiber 290 in FIG. 16B, one or more circumferential-path MSM devices 184 can be included with one or more radial-path MSM devices 232. Here the semiconducting layer of the MSM device or devices can be circumferentially continuous, as shown in FIG. 15A and FIG. 16A, or can be provided as discrete semiconductor sections at the location of each MSM device, as shown in FIGS. 15B and 16B. Whatever arrangement of MSM device or devices is employed, such can be configured with selected fiber elements to provide optical transmission, electrical transmission, photodetection, or other optoelectronic functionality. For many applications, to fully exploit the self-monitoring capabilities of the fiber, it can be preferred to position the MSM device elements relatively closely to an optical transmission element of the fiber, based on an expectation that heat generated in the fiber will primarily be the result of dissipation of power delivered by the optical transmission element.

EXAMPLE V

A bulk GAST glass rod, 10 mm in diameter and 15 cm long, was prepared from high-purity (5-6N) Ge, As, Se and Te elements from Alfa Easar, Ward Hill, Mass., using a conventional sealed-ampoule melt-quenching technique. In this technique, the materials were weighed and placed into a quartz tube under a nitrogen atmosphere. The tube was heated to 330° C. for an hour at a rate of 1° C./min under vacuum in order to remove surface oxides. The ampoule was formed by sealing the tube under vacuum at a pressure of $\sim 10^{-5}$ Torr. The ampoule then heated to 900° C. at a rate of 2° C./min in a rocking furnace for 18 hours, while held vertical, and then rocked for 6 hours to increase mixing and homogenization. The glass liquid was cooled to 700° C. in the furnace and then quenched in cold water. Subsequently, it was annealed for 30 minutes near the glass-transition temperature of the material, $T_g=195°$ C., before being cooled gradually to room temperature.

A 10 μm-thick GAST film was deposited by thermal evaporation with a vacuum evaporator from Ladd Industries, Williston, Vt., on one side of a 50 μm-thick PES film. The evaporation rate was kept at less than about 3 nm/s in order to maintain stoichiometric deposition conditions. The film was then annealed for an hour at 30° C. below the glass transition temperature in a vacuum oven.

A macroscopic preform for producing the thermal sensing fiber configuration of FIG. 16A was prepared with the following steps. First an $As_2Se_3$-coated PES film was rolled around a 14.2 mm-thick Teflon™ FEP rod. The coated PES film was produced with a 13 μm-thick $As_2Se_3$ film uniformly deposited on both sides of a 50 μm-thick, 24 cm-wide and 1 meter-long PES film by thermal evaporation with a vacuum evaporation system. With the coated PES film rolled around the Teflon™ rod, then a buffer PES layer of several millimeters was formed by rolling an uncoated PES film around the coated PES film on the Teflon™ rod. A single GAST layer was then rolled around the PES layer.

This temperature sensitive GAST layer, designated as the semiconducting element of the fiber MSM devices, was contacted by six Sn metal conduits of 0.8 mm in thickness, 2.5 mm in width, and 15 cm in length to form three pairs of electrodes for three MSM devices. The conduits were positioned on the GAST layer to define the three MSM device geometries like that in FIG. 16A. A layer of protective PES cladding was then rolled around the assembly, and a layer of Teflon™ tape was rolled onto the outer surface of the PES layer to fixedly hold the assembly in the desired geometric arrangement.

The preform was then consolidated for 70 minutes at a temperature of 260° C. under a vacuum pressure of $\sim 10^{-3}$ Torr in a three-zone horizontal tube furnace while rotating the preform around its axis. The Teflon™ rod was removed from the core immediately after consolidation. The preform was then annealed for 1 hour at a temperature of 180° C. in a vacuum oven and then cooled gradually to room temperature. The preform was then heated and drawn into tens of meters of fiber in a draw tower from Heathway Products Division, Millville, N.J. The fiber was drawn at the central zone of a three-zone vertical tube furnace from Thermcraft, Inc., Winston-Salem, N.C., with the top-zone maintained at a temperature of 190° C. and the middle-zone maintained at a temperature of 295° C. The fiber diameter was monitored with laser diameter monitors and the target fiber diameter was determined by measuring broad-band Fourier transform infrared (FTIR) spectra during drawing. The drawn fiber was characterized by a diameter of 1270 μm.

The MSM devices of the drawn thermal sensing fiber were characterized by determining the fiber resistance as a function of temperature for a 10 cm-long length of fiber cut from the drawn fiber. One of the MSM thermal sensing devices of the fiber was connected to an external electronic circuit like that of FIG. 11 through its two electrodes, in the manner of the Examples above. The length of fiber was placed inside a hollow quartz tube, with the fiber's electrical connections maintained intact, and the fiber temperature was raised by a resistive heater. The temperature inside the tube was measured by a thermocouple and the electrical current was simultaneously measured using a Keithley 6487 picoammeter, from Keithley Instruments, Cleveland, Ohio. A 50 V DC voltage was applied across the electrodes.

Figure 17A:
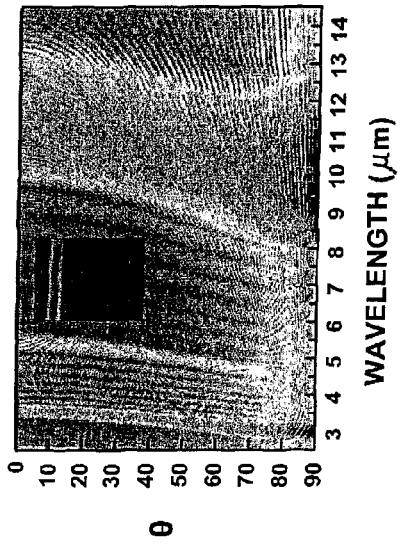
FIG. 17A is a plot of measured resistance as a function of temperature of a second experimental thermal sensing fiber like that of FIG. 16A.
Figure 17B:
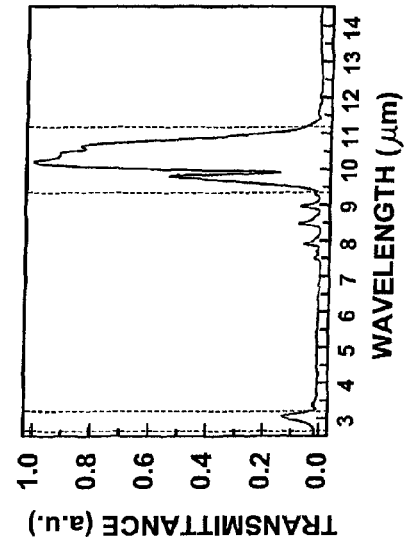
FIG. 17B is a plot of current as a function of voltage (I-V curves) for the second experimental fiber at two temperatures.

FIG. 17A is a plot of the MSM resistivity measured as a function of temperature. FIG. 17B is a plot of the MSM current as a function of temperature for a temperature of 22° C. and a temperature of 88° C. As shown in the plot of FIG. 17A, the measured resistivity of the GAST thin film as a function of temperature ranging from room temperature to 120° C. fits the exponential resistivity Expression (1) above with ΔE=0.495 eV. The resistivity was found to decrease more than two orders of magnitude for a temperature increase from room temperature to 120° C. The I-V curves in FIG. 17B indicate that the MSM semiconductor-metal junctions are characterized by ohmic behavior at both low and high temperatures.

Figure 18A:
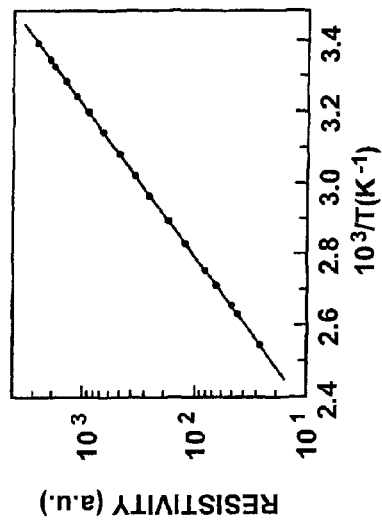
FIG. 18A is a plot of the photonic bandgap of the second experimental fiber.

Geometries of the drawn fiber length were measured, indicating a hollow core diameter of 560 μm. The multilayer semiconductor-insulator structure surrounding the hollow core consisted of 13 bilayers of alternating $As_2Se_3$ and PES having thicknesses of 1 μm and 1.9 μm, respectively. The refractive indices of $As_2Se_3$ and PES are 2.73 and 1.65 at 10.6 μm, respectively. The calculated PBG diagram of the drawn thermal sensing fiber is depicted in FIG. 18A. This structure results in an omnidirectional bandgap extending from 9.4 μm to 11.4 μm. Darker areas represent guided modes inside the core, while lighter areas correspond to regions where light is not guided, but instead radiates through the multilayer structure, as prescribed by the band diagram. The inset in FIG. 18A is a magnified segment of the PBG diagram detailing the guided modes near the light line) (θ=90°, where the dispersion curves of three modes appear as lighter stripes.

Figure 18B:
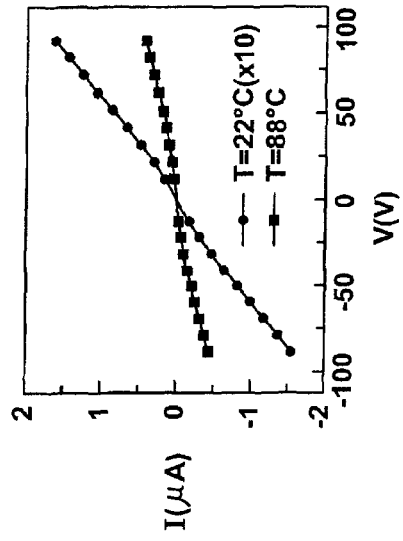
FIG. 18B is a plot of transmittance as a function of wavelength corresponding to the plot of FIG. 18A.

The transmission spectrum of a 1 m length of the drawn thermal sensing fiber was measured by a Fourier transform infrared (FTIR) spectrometer, a Tensor 37, from Bruker, Inc., Madison, Wis. FIG. 18B is a plot of this transmission spectrum, with transmittance as a function of wavelength. There is observed excellent agreement between the measured spectrum of FIG. 18B and the calculated spectrum of FIG. 18A.

Thermal Sensing of High-Power Fiber Transmission

In accordance with the invention, the thermal sensing fiber 275 of FIG. 16A, like other of the thermal sensing fiber configurations described above, can be employed for delivery of high-power electromagnetic radiation, e.g., laser light, through the fiber core, or other optical transmission element, while self-monitoring the temperature in the fiber for indications of mechanical failure or operational fault conditions. Fibers employed for, e.g., infrared laser beam delivery, regardless of the guiding mechanism or materials used, transport significant power densities through their core. Even a small defect nucleating within such a high power optical transmission line can result in unintentional energy release with potentially catastrophic consequences.

Heat generated in the insulating cladding region of the thermal sensing fiber during high-power transmission is predominantly due to either radiation leakage of guided modes into the cladding or is due to localized defect states at one or more points along the length of the fiber. Typical radiation lengths range from a few meters for low-order modes, to a few centimeters for higher order modes. However, structural perturbations such as fiber bends and defects tend to increase the overall losses due to coupling to both higher order propagating modes and due to localized defect states. In such cases the power radiated from, e.g., the multilayer PBG waveguide structure of the fiber is absorbed in the insulating material and transformed into heat, which can be sensed as a function of resistance, in the manner described above.

The ability of the thermal sensing fiber of the invention to guard against the failure of a high-power-transmission waveguide, e.g., a high-power laser system, by detecting temperature changes that can be directly attributable to defects, prior to a fiber failure, is particularly important for a wide range of critical applications. As explained just above, such failures can occur due to distortions in the waveguide structure, resulting in the appearance of localized defect states. High optical energy coupled from the optical transmission element, such as the fiber core, to localized defect states can cause extensive heat generation in the fiber. The ability to detect hot spots in the fiber can therefore prevent catastrophic fiber failures. Because the existence and location of defects are usually unknown a priori, monitoring of the fiber temperature along the entire fiber length, as achieved by the MSM devices of the thermal sensing fiber of the invention, can be employed during fiber operation to provide the high degree of monitoring confidence required for many applications.

Indeed, the ability of the thermal sensing fiber of the invention to integrate in a single common fiber both optical transport functionality and self-monitoring thermal sensing functionality for failure prediction is particularly important for enabling safe operation of high power optical transmission lines and for reliable operation of medical, industrial and defense applications. For example, the self-monitoring thermal sensing fiber of the invention can be employed for a wide range of surgical applications, such as in vivo endoscopic surgery, minimally invasive surgery. Such can be performed using the self-monitoring thermal sensing fiber of the invention, with the self-monitoring capability of the fiber providing a safeguard that is sufficient to enable the reliable and widespread clinical use of such fiber-based procedures.

EXAMPLE VI

A $CO_2$ laser, the GEM-25 DEOS laser from Coherent, Inc., Santa Clara, Calif., at 10.6 μm, was coupled to the hollow core of a 40 cm-long length of the thermal sensing fiber of Example V above. A 50 V DC voltage was applied across one MSM device of the fiber by connecting the MSM electrodes of the device to an electronic measurement circuit including the voltage source in the manner described above. The optical power input to the fiber core from the laser, and the output optical power of the fiber, as well as the measured electrical current through the MSM electrodes, were recorded. Also measured was the power radiated from the fiber outer surface along the fiber length. Power radiated from the fiber outer surface was found to be negligible relative to the overall power loss. This suggests that the difference in power between the fiber input and output is dissipated in the fiber cladding and is converted to heat, which can be sensed by the MSM devices of the fiber.

This heat dissipation was characterized using an infrared (IR) camera from FLIR Systems, Boston, Mass. The corresponding electrical current of the MSM device was measured as a function of the dissipated power in the fiber. Dissipated power, ΔP, is here defined as $\Delta P = P_{in} - P_{out}$, where $P_{in}$ is the measured input power and $P_{out}$ is the measured output power.

To analyze power loss and MSM operation, the length of fiber, with the laser input in place, was bent during operation, with several measurements carried out as the bend radius was decreased. The output fiber power, MSM device electrical current, and temperature distribution of the fiber at each bend radius were recorded for a fixed input power of 2 W.

Figure 19A:
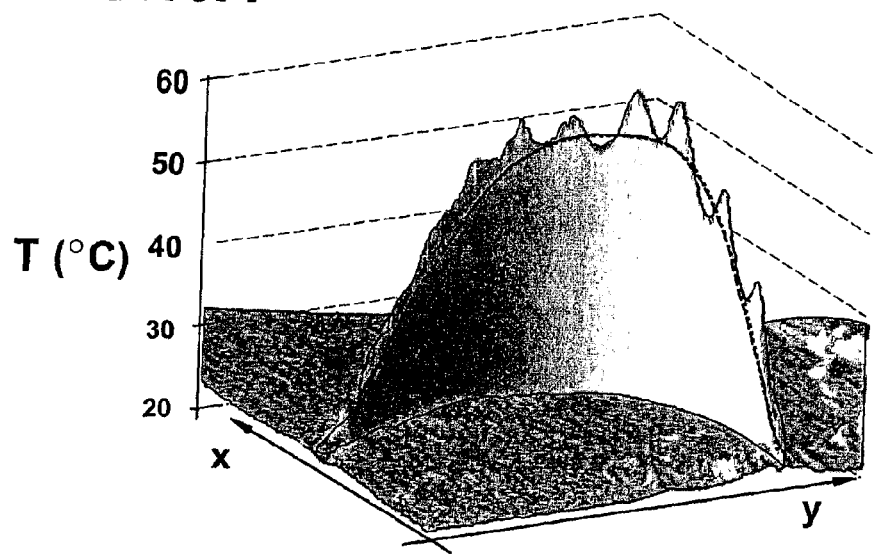
FIG. 19A is a plot of measured temperature distribution along the second experimental fiber for one fiber bend radius.

FIG. 19A is a plot of the measured temperature distribution along the fiber for one fiber bend radius. The x and y axes represent an arbitrary Cartesian coordinate system in the plane of the bend in the fiber. The temperature distribution has an oscillatory behavior due to mode-beating between modes coupled by the bend, with a Gaussian envelope centered midway on the fiber bend. Because the mode-coupling strength is inversely proportional to the square of the bend radius, an enhancement of the radiated power at the location of the bend is expected, with a corresponding rise in temperature of the fiber.

Figure 19B:
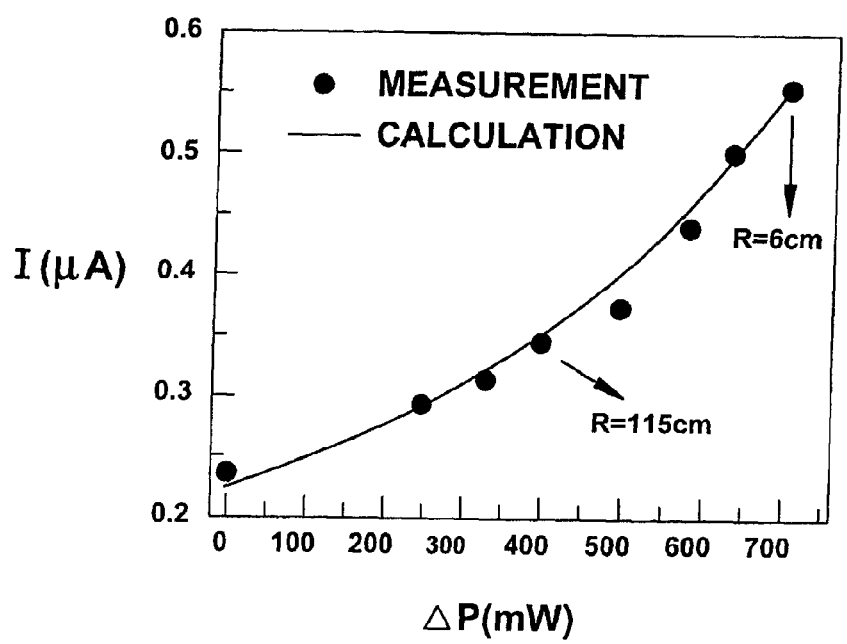
FIG. 19B is a plot of current measured as a function of dissipated power for the second experimental fiber.

FIG. 19B is a plot of measured MSM electrical current as a function of dissipated power, ΔP, for fiber geometries ranging from a straight fiber to a bent fiber having a radius, R, of 6 cm. The plotted measurements clearly demonstrate an increase in MSM current for higher dissipated power; more power is dissipated with a tighter fiber bend, corresponding to a lower bend radius. The equivalent resistance of the fiber was calculated as a function of fiber bend radius assuming a gaussian function for the temperature profile, T(z), as in the plot of FIG. 19A. As shown in the plot of FIG. 19B, there was good agreement between the measured values and the calculated response. It was thus demonstrated that the self-monitoring thermal sensing fiber of the invention successfully indicates, in real time, changes in fiber geometry by providing an electrical measurement that corresponds directly to fiber power dissipation resulting from the change in fiber geometry.

Fiber Self-Monitoring of Localized Temperature Changes

The thermal sensing fiber of the invention provides a particularly elegant MSM design in that the semiconducting and conducting MSM elements are each continuous along the full length of the fiber, i.e., each MSM device extends along the full fiber length. As a result, the MSM electrodes operate both as sensing elements and as electrical transmission elements for transducing a temperature change into an electrical signal and delivering that signal to an end of the fiber for signal measurement. The electrical signal at the end of the fiber is integrative; that is to say, the signal is proportional to the integral of the thermal excitation along the whole fiber length.

For many applications, particularly where the thermal sensing fiber is to be employed for sensing changes in the ambient environment temperature, this integrative functionality can be advantageous and can be particularly well-suited for making assessments of angular directionality of a temperature change, as discussed above. But for a self-monitoring fiber application in which the MSM devices of the thermal sensing fiber are to be employed for monitoring possible localized fiber defects or operating faults, this integrative functionality may not for all applications be optimal.

In accordance with the invention there is provided a method for analyzing a characteristic MSM electrical response from a thermal sensing fiber to identify one or more thresholds of measured MSM current that correspond to the occurrence of a localized fiber defect. This thresholding enables distinction of the MSM response for the occurrence of a localized defect from that for the occurrence of geometric fiber factors such as a fiber bend.

It is recognized in accordance with the invention that fiber defects that are relatively localized produce a higher fiber temperature than more diffuse fiber conditions such as a bend in a fiber. This higher fiber temperature at a localized defect results in a higher MSM device output current than that for a more diffuse fiber condition, for a given power dissipation in a fiber, because a point on a fiber having a temperature much higher than other fiber points is found to provide the dominant contribution to the MSM current. As a result, in accordance with the invention, a threshold can be identified that indicates the onset of a defect in a fiber.

EXAMPLE VII

From the experimental thermal sensing fiber of Example V, two 40 cm-long fiber lengths were produced, namely, a defect-free length of fiber and a defective length of fiber. The fiber defect was intentionally generated by burning a small spot on the fiber with a $CO_2$ laser beam. The laser of Example V was employed for high-power laser operation of the two fiber lengths. During operation, the temperature distribution along each of the fibers was recorded using the IR camera of the examples above for fixed dissipated power. The measured temperature was found to be low and almost constant along the defect-free fiber, while a high-temperature spot was observed at the location of the defect on the defective fiber.

Figure 20A:
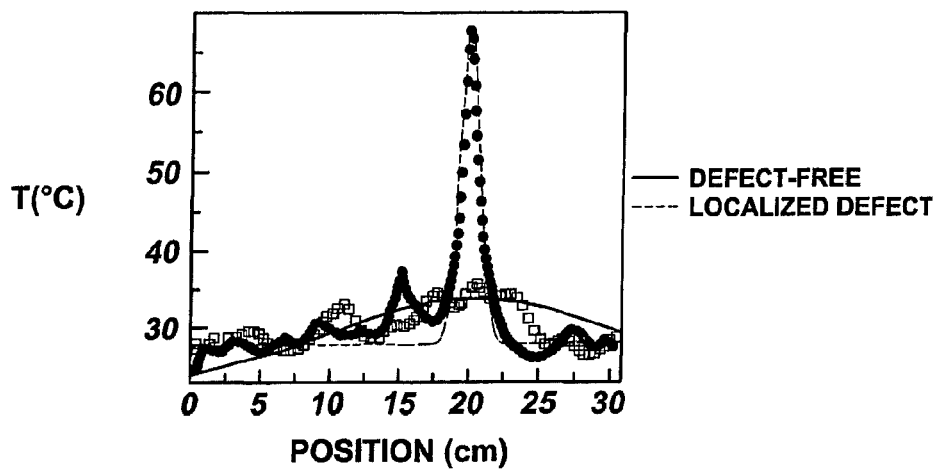
FIG. 20A is a plot of measured fiber temperature as a function of position along a fiber for two conditions of the second experimental fiber, namely, a defect-free condition and the condition of a localized defect.

FIG. 20A is a plot of the measured temperature profiles of the defect-free and the defective fibers, fitted to gaussian distributions and taken along a one-dimensional section of fiber. The areas under the two curves are equal as expected because the dissipated powers in both cases are equal. But the dramatic difference in the plotted profiles makes clear that for fixed dissipated power, i.e., equal areas of the gaussian thermal distribution, defects that are more localized correspond to temperature distribution widths that are more narrow, and have a higher peak temperature than that for a non-localized geometric factor.

This characteristic is a result of the highly nonlinear relation between fiber temperature distribution and measured MSM device electrical current. In accordance with the invention, this condition is exploited to ascertain whether a certain amount of power loss is attributed to a highly localized defect or a uniformly distributed loss. Because of this nonlinear relation, the MSM electrical currents generated in defect-free and defective cases are not equal, even though the amount of dissipated optical power is equal, and thus a current threshold can be set that corresponds to initiation of a high-current-producing fiber defect.

Figure 20B:
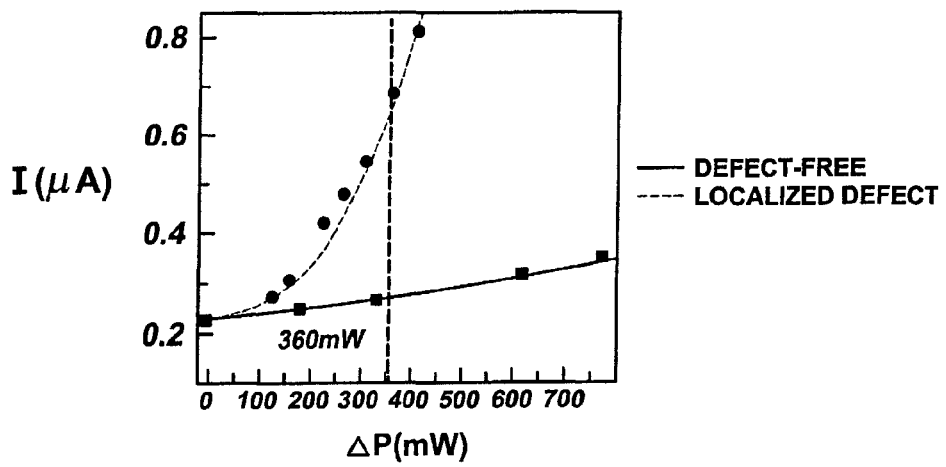
FIG. 20B is a plot of measured current for the two fiber conditions of FIG. 20A.

The MSM electrical current was measured, in the manner described above, as a function of dissipated power, ΔP, for the defect-free and the defective thermal sensing fiber lengths. FIG. 20B is a plot of measured current for the defect-free and defective fiber lengths as a function of dissipated power, ΔP. As shown in the plot, there is a dramatic divergence in the measured currents. Data for the solid line were calculated using the temperature data obtained by the IR fiber imaging and Expression (2) above for fiber conductivity. This model of the electrical response of the thermal sensing fiber MSM device indicates an exponential dependence of the local conductivity on temperature. This demonstrates that a point on the fiber having a temperature much higher than other fiber points provides the dominant contribution to the current. In fact, for a given dissipated optical power, the electrical current increases exponentially with increase in the peak temperature along the fiber.

These significant measurable differences between the defect-free and single-defect-containing fibers under a condition of identical dissipated power clearly demonstrate that a sufficient condition for identifying an onset of fiber failure based on electrical current measurements can be obtained, and a corresponding measured current threshold can be prescribed. Note that the case of a bent fiber is intermediate between these two extremes, and the curve for measured MSM electrical current as a function of dissipated power for a bent fiber, as shown in the plot of FIG. 19B, lies between the two curves plotted in FIG. 20B.

Figure 20C:
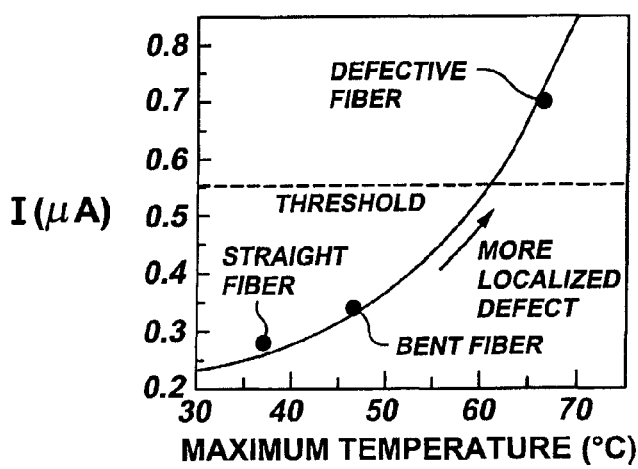
FIG. 20C is a plot of measured current as a function of maximum temperature along a fiber for the two fiber conditions of FIG. 20A.

This failure onset identification capability was invoked with measurement data produced by the experimental defect-free and defective fiber lengths. FIG. 20C is a plot of the MSM electrical current calculated as a function of the maximum measured temperature along a fiber, for a dissipated power of 360 mW. The solid curve in FIG. 20C represents the results of this calculation. In FIG. 20C are also plotted three experimental points corresponding to the defect-free straight fiber, the defect-free bent fiber, and the single-defect-containing straight fiber.

As shown in the plot, in the absence of a localized defect, the measured MSM current does not exceed a certain threshold value for straight and bent fiber configurations. The measured current for the defective fiber clearly passes a threshold corresponding to the onset of a defect. Based on this recognition, in accordance with the invention when a measured MSM electrical current from a thermal sensing fiber exceeds a critical value that has been set to correspond to the occurrence of a fiber defect, then given an unchanging input power level, the increase in current is most likely due to one or more heat-generated defects on the fiber.

With this recognition, the invention provides a technique for self-monitoring of a thermal sensing fiber for onset of a fiber defect. A selected thermal sensing fiber geometry, e.g. that of FIG. 16A, is characterized to calibrate measured MSM electrical current data with device geometries and localized defects. A defect onset threshold can then be prespecified for a given application and selected operating conditions. Then, during fiber operation, if real time MSM electrical current measurements exceed the prespecified threshold, a fault condition can be identified and, e.g., signaled to an operator to, for example, reduce the power input to the fiber, completely shut off the power input to the fiber, examine the fiber geometry for unintended bending, and/or examine the fiber for defects. This results in prevention of fiber failure by providing an ability to stop fiber operation before fiber heating at the site of a defect can damage the optical confining structure of the fiber and cause total failure of the fiber transmission capabilities.

This fiber self-monitoring for defect onset is particularly well-suited for enabling reliable fiber operation for high-power medical, industrial and defense fiber applications. For example, during laser surgery employing the self-monitoring thermal sensing fiber of the invention, automatic alarm signaling capability can be set up with dedicated hardware and/or computer control to ensure that high-power transmission is curtailed or inhibited when MSM current measurements indicate that the fiber integrity may be suspect. The procedure can accordingly be halted if there is evidence that safety may be at risk due to a possible fiber defect or failure.

An example of a feedback-controlled self-monitoring fiber system 375 is schematically shown in FIG. 20D. Here a thermal sensing fiber 376 is provided, having along the fiber length at least one MSM device 378, shown schematically at the fiber surface for clarity. The fiber also includes an optical transmission element, e.g., a PBG waveguide structure like that of FIG. 16A, for transmitting an optical signal. The fiber is connected to an optical input source 380 for inputting an optical input 382 to the fiber for transmission along the length of the fiber to an output 384 of the fiber.

The electrodes of the MSM device 378 of the fiber are connected in an electronic circuit 386 that is configured as-desired for producing an output signal 388 that is indicative of changes in electronic charge carrier population of the semi-conducting element in the fiber MSM device. The circuit output signal is processed by, e.g., a processor 390, to, e.g., compare the resulting fiber temperature indication from the circuit with a prespecified threshold value indicative of fiber defect conditions. The results of the processing can be provided to a user through, e.g., a user interface 392 with a display or other selected interface or device.

The processor is connected to an optical input source controller 394 for controlling the optical input source 380. Should processing of the electronic circuit output indicate that the fiber temperature is reaching unsafe levels or has surpassed a prespecified defect onset level, then the optical input controller can reduce or stop the optical input to the fiber. With this control, and based on a particular application, the fiber transmission can carried out within prescribed operational parameters and indications of fiber conditions that may subsequently lead to fiber failure are provided for safeguarding the fiber and its environment during fiber transmission.

Thermal Sensing Fiber Grid

The invention enables the production of spatially-resolved thermal mapping information with assemblies, grids, mats, woven fabrics, webs, and other arrangements of thermal sensing fibers of the invention. An array or grid of thermal sensing fibers can spatially localize the sensing of a thermal excitation in the ambient environment of the array or grid. As explained above, a thermal sensing fiber of the invention produces an electrical signal that is proportional to the integral of the thermal excitation along its whole length, and cannot itself provide spatially-resolved thermal measurements. But the thermal data produced by an array of the thermal sensing fibers can provide such spatial resolution.

Figure 21:
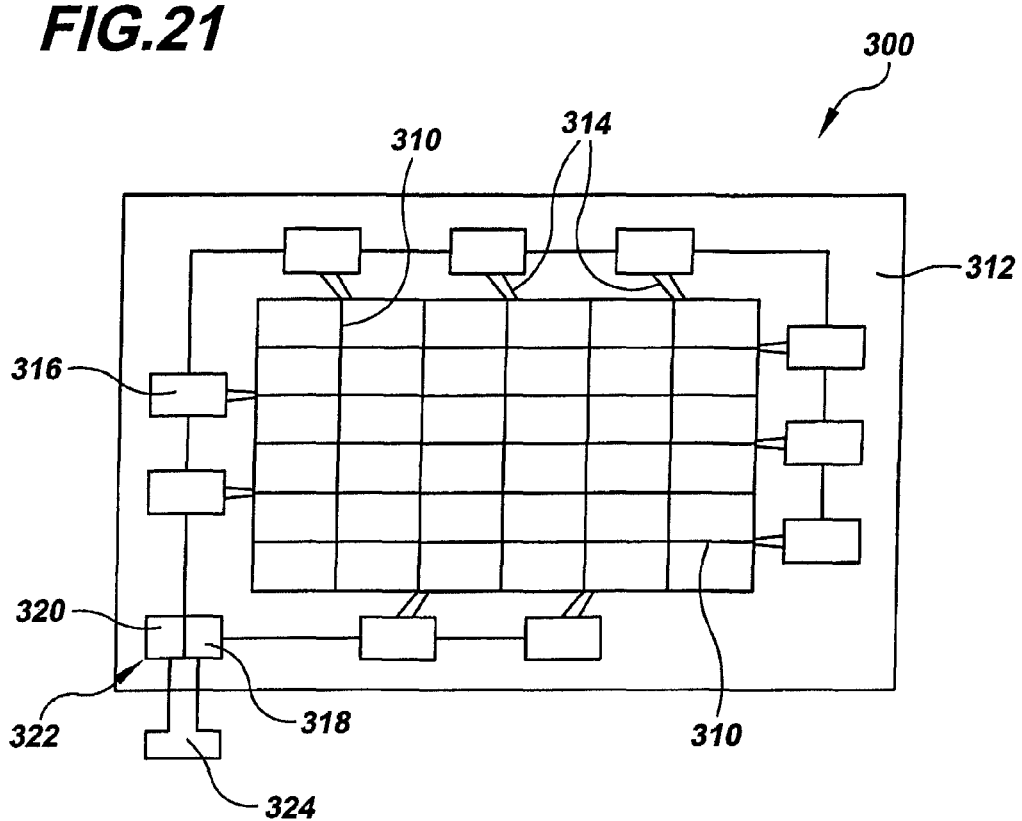
FIG. 21 is a schematic view of an example thermal sensing fiber array of the invention.

Referring to FIG. 21, there is shown an example of such a fiber configuration, here arranged as a two-dimensional thermal sensing fiber array, grid, or web 300. The fiber grid includes a number of individual thermal sensing fibers 310 arranged in rows and columns; in the example of FIG. 21 five fibers are arranged vertically and five fibers are arranged horizontally to form a 5×5 thermal sensing fiber grid. In response to changes in the temperature of the ambient environment of the grid, the grid produces fiber-specific electrical signals. As explained in detail below, a comparison of the thermal response of each of the fibers in the grid enables a determination of a grid coordinate of temperature change.

For many thermal sensing fiber grid applications, the thermal sensing fiber 100 of FIG. 11 can be a well-suited fiber configuration. Alternatively, the fiber configurations including elements like those in FIGS. 14A-B, FIGS. 15A-B, or FIGS. 16A-B can be employed. Hollow core fiber configurations are generally characterized by a degree of mechanical flexibility greater than that of solid core fiber photodetectors. Thus, in construction of an interleaved thermal sensing web or fabric it is particularly advantageous to make consideration for the flexibility of the fibers employed, with solid core fibers being woven less tightly than hollow core fibers. The weave pattern and spacing of the fibers in the pattern can be controlled to accommodate the flexibility of the fibers. If a hollow core fiber is preferred, the hollow core configurations of FIG. 16A or 16B can be employed, with the hollow core operating as an optical transmission element or alternatively provided solely to enhance fiber flexibility.

Turning now to details of the thermal sensing fiber array, a mechanically supportive border or frame 312 is provided for securing the edges of each thermal sensing fiber 310 to configure a desired fiber grid arrangement. The frame can be mechanically rigid or flexible. In either case, the frame preferably provides accommodation for electrical connection to and fastening of each fiber. The MSM device electrodes of each thermal sensing fiber can be electrically contacted using, e.g., conductive paint, to connect the electrodes with connecting wires 314 for connection with a corresponding external circuit 316, where in one example configuration each fiber is provided with a separate electronic measurement circuit. In one example configuration, each circuit can be provided on the frame 312, as shown in the figure. Alternatively, the connecting wires can connect each fiber to a circuit that is mechanically remote from the fiber grid.

Figure 22:
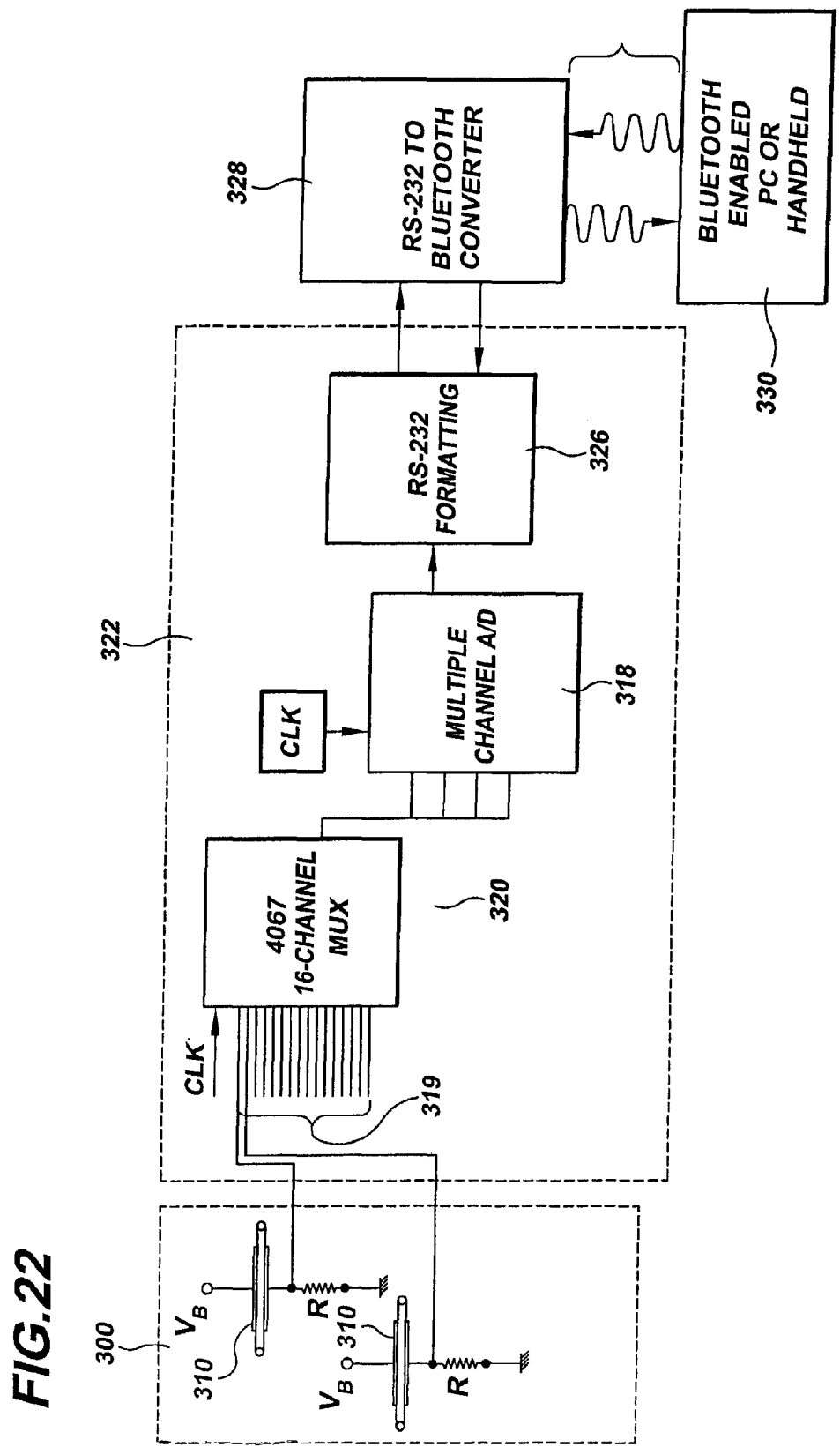
FIG. 22 is a block diagram of processing apparatus provided for operation of the thermal sensing fiber array of FIG. 21.

Referring also to FIG. 22, the MSM device electrodes of each thermal sensing fiber 310 can be connected in a measurement circuit like that described above, with the MSM device in series with a DC bias voltage, $V_B$, and a series resistor, R. In one example, a 50 V DC bias voltage and a 20 kΩ resistor are included in each MSM device measurement circuit. The voltage drop across the resistor is monitored with, e.g., an analog-to-digital (A/D) converter 318, such as a DAQCard-6062E, from National Instruments, Austin, Tex. Other electrical measurement parameter, e.g., current, capacitance, or other parameter, can instead be monitored. The acquired data 319 from the rows and columns of fibers can be first multiplexed by a multiplexer (MUX) 320, e.g., a CD 4067 16-channel MUX from Donberg Electronics, Donegal, Ireland. The data acquisition, multiplexing, and digitization can be carried out locally, e.g., on a microchip microcontroller 322, and then converted to a selected format, e.g., by RS-232 formatting 326.

Once formatted, the thermal sensing fiber data is then transmitted to a suitable processing device, e.g., a computer, for analysis, or provided to a local processing module. If desired for a given application, the thermal sensing fiber data can be converted to a wireless format, e.g., a Bluetooth format, by a corresponding RS-232 to Bluetooth converter 328. The signal is then transmitted, e.g., wirelessly, to a receiver, e.g., a Bluetooth-enabled computer receiver 330, such as a PC, laptop, handheld computer, or other processing device. At the processing device there is provided software for analysis of the data. Wireless transmittal of the data can be particularly preferred for applications in which it is not convenient to physically connect a processing module to the thermal sensing fiber array.

In operation of the thermal sensing fiber array, referring to the flow chart of FIG. 23, a method of spatially-localized thermal detection 350 is carried out with a first step in which thermal sensing data from the grid of thermal sensing fibers is acquired 352 by providing a bias voltage to each MSM electrode pair of each fiber and measuring the resulting voltage drop across a reference resistor, in the manner just described. The acquired electronic charge carrier data is processed and then formatted 354, e.g., as RS-232 data, and then converted 356 to, Bluetooth data for transfer 358 to, e.g., a computer, such as a Bluetooth-enabled laptop, handheld device, or other processing unit. Thus a wireless channel 360 can be employed for transferring the data from the thermal sensing fiber array and transmitting electronics 362 to a receiver and analysis and control systems 364. For applications in which wireless transmission is not desired, then wired connection between the thermal sensing fiber array and a processing unit can be implemented in a suitable manner.

Once at a selected processing unit, the thermal sensing data is processed, e.g., by a data acquisition card in a PC. A software program provided in the PC, e.g., Visual Basic®, from Microsoft, Redmond, Wash., LabVIEW, from National Instruments, Austin, Tex., or MATLAB®, from The MathWorks, Natick, Mass., can then be employed for analysis of the acquired data to determine localized temperature change coordinates. To make this determination, the measured signal of each horizontal thermal sensing fiber, i.e., each fiber row, is compared and the thermal sensing fiber row having the maximum thermal excitation signal is determined 366. Similarly, the measured signal of each vertical thermal sensing fiber, i.e., each thermal sensing fiber column, is compared and the thermal sensing fiber column having the maximum thermal excitation signal is determined 368. This knowledge of the thermal sensing fiber row and column having thermal excitation signal maxima directly indicates the corresponding horizontal and vertical grid coordinates, T(x, y), of localized temperature change in the ambient environment of the grid. In one example implementation, a two-dimensional outer product of one-dimensional vectors of thermal data is employed to identify the nearest fiber row-column cross-over point in the fiber array at which a thermal excitation occurred.

With this data analysis, the thermal sensing fiber array and electronics configuration of the invention provides the ability to monitor temperature across a very large surface area in a manner that precisely locates the deviations in temperature across the surface. Both temperature deviations and the location of such temperature deviations are identified for the surface. The thermal sensing fiber array therefore replaces an array of distinct, individually-controlled point detectors, such as thermocouples, that might conventionally be required to monitor temperature changes across a surface.

The limitations in thermal sensing inherent in thermal point detectors are substantially eliminated by the invention. The light weight, flexibility, and controllability of the thermal sensing fiber array of the invention, along with the wireless data transmission capabilities of the system, provide thermal sensing capabilities for surfaces not previously accessible to thermal monitoring. As discussed below, clothing and other flexible fabric can include a thermal sensing fiber array for, e.g., monitoring the temperature of a human or other body. In addition very large scale thermal monitoring and mapping can be carried out with a thermal sensing fiber grid; large objects such as automobiles, airplanes or other spacecraft, or other machinery can be covered with a thermal sensing fiber grid shaped to conform to the surface of the machinery or other equipment.

Ambient thermal excitation can be continuously monitored by the thermal sensing fiber array of the invention, for continuous thermal mapping. The speed at which sequential, distinct thermal excitation points can be ascertained is limited by the relaxation time of the fibers and the speed of the data acquisition electronics. Specifically, the speed at which collected charge can be fully conducted from a point of thermal excitation to the fiber ends by the fiber MSM electrode pairs, and the speed of electrical signal measurement and processing, sets the speed of the thermal sensing fiber grid.

Figure 24A:
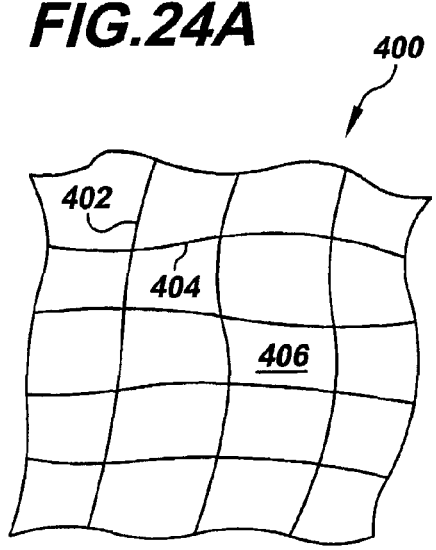
FIG. 24A is a schematic view of a thermal sensing fiber array of the invention woven in a square of fabric.

As explained above, the thermal sensing fiber array of the invention can be configured for a wide range of applications, and is particularly amenable to weaving with fabric. An example of such a woven thermal sensing fiber array 400 is schematically shown in FIG. 24A, with thermal sensing fibers 402, 404 arranged as a grid structure while embedded in a sheet of fabric 406. The invention does not require that the fibers be embedded in a fabric, however; the fibers can be configured in any suitable arrangement, with a supporting material if desired, that enables thermal sensing for a selected application. The flexibility of the fibers allows the grid or array to be deformed and thus to conform easily to curved surfaces that may be covered by fabric or other such flexible structure.

EXAMPLE VIII

Figure 24B:
FIG. 24B is a photograph of an experimental embodiment of the thermal sensing fiber array of FIG. 24A, positioned on a mannequin head.

A thermal sensing fiber array like that of FIG. 24A was formed by weaving thermal sensing fibers of the configuration 100 in FIG. 11, fabricated as in Example III above, in a square of fabric, with eight rows of thermal sensing fibers and eight columns of thermal sensing fibers woven in the fabric, with 1 cm resolution. FIG. 24B is a photograph of the experimental mesoscopic fiber fabric positioned on a mannequin head; the mechanical flexibility of the thermal sensing fibers allows the fabric to be deformed and thus to easily conform to a curved surface such as the head.

Figure 25A:
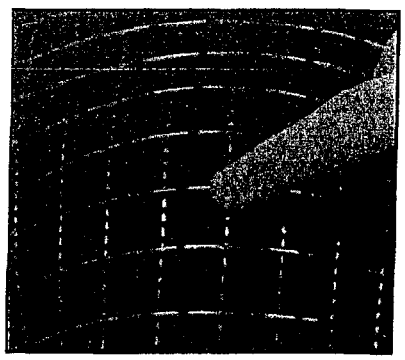
FIGS. 25A-C are a photograph, a thermal image, and a thermal sensing array map of a finger on the thermal sensing fiber array of FIG. 24A.
Figure 26A:
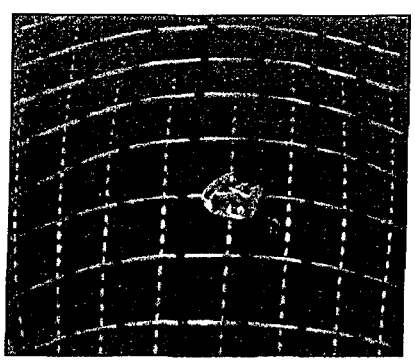
FIGS. 26A-C are a photograph, a thermal image, and a thermal sensing array map of an ice cube on the thermal sensing fiber array of FIG. 24A.

The thermal sensing fibers of the woven array were operated in the manner of the experimental examples above, and two thermal excitation stimuli were introduced separately to experimentally reconstruct thermal maps corresponding to the stimuli. The first thermal excitation was localized heating by the touch of a finger to the fabric, as shown in the photograph of FIG. 25A, and the second thermal excitation was localized cooling with an ice cube as shown in the photograph of FIG. 26A.

Figure 25B:
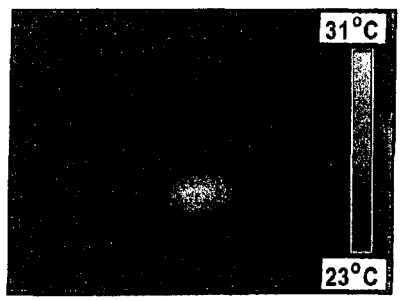
Figure 26B:
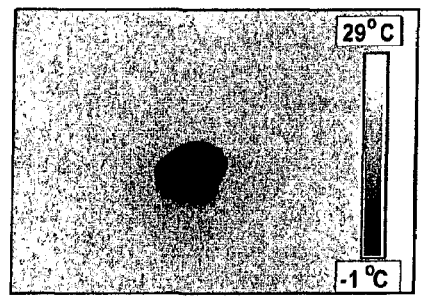
Figure 25C:
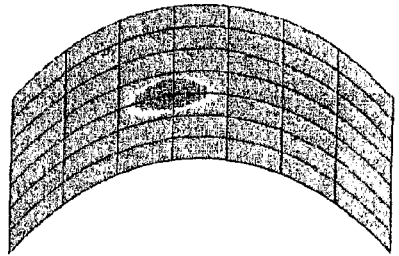
Figure 26C:
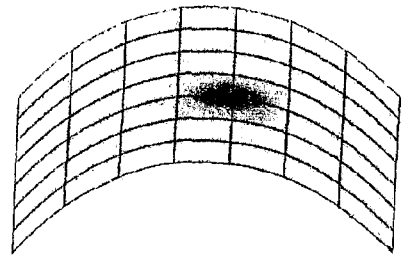

For each of these two excitation stimuli, a thermal IR image was produced with an IR camera, in the manner described above. FIG. 25B is the resulting thermal image of the finger heating, and FIG. 26B is the resulting thermal image of the ice cooling. Following the data process flow of FIG. 23, a thermal map was constructed for each of the two excitations based on data obtained from the fiber array. These thermal maps were corroborated by referencing them to the thermal images obtained by the thermal IR camera and calibrating the fiber-array response accordingly. FIG. 25C is the thermal map for the heating excitation, and FIG. 26C is the thermal map for the cooling excitation. If the maps are produced with color-referenced information, then areas of cooling and areas of heating can be distinguished across the array. The successful thermal mapping shown in the figures confirms the capability of the thermal sensing fiber array of the invention to localize a source of thermal excitation to within the resolution of the individual fiber position in the array.

In accordance with the invention, because the electrical signals from the thermal sensing fibers can be acquired in real time, then corresponding dynamic, time-dependent thermal maps can be produced. This dynamic thermal mapping was characterized by producing a 6×6 thermal sensing fiber array of fibers woven into a fabric square, with each fiber having the configuration 100 in FIG. 11, fabricated in the manner described in Example III. The array was operated in the manner of the Examples above and data was acquired from the array for producing a time-dependent thermal map.

The thermal sensing fiber array was heated momentarily using a heat gun. The resulting temperature of the fabric was monitored in real time with the IR camera of the previous examples, while simultaneously the sensed data obtained from the array was processed to produce a corresponding thermal map of the fabric. FIGS. 27A-27E are the IR images of the fabric array, in a quiet state and then over the course of nine seconds after the thermal excitation. FIGS. 28A-28E are the corresponding thermal maps, shown synchronized in time with the thermal images. Very good agreement between the two is observed. The minimum detectable temperature for the IR camera is specified to be 0.08° C. at 30° C. An estimate for the corresponding value for the fibers was found to be 0.03° C. at 30° C. This value was obtained by measuring the maximum fluctuation in the resistance of one of the array fibers maintained at the specified temperature for several minutes.

It was found that the fabric in which the fiber array was woven retained heat, as indicated by the IR camera images. As a result, the thermal excitation lingered at the array. In accordance with the invention, several strategies can be implemented to achieve faster thermal response time. In a first example approach, the solid semiconducting glass core of each fiber can be replaced with one or more thin glass films, as in the configuration of FIG. 29. As shown in FIG. 29, a hollow core 425 is surrounded by one or more semiconducting layers 430, that can be characterized here as hollow rods, with electrodes 432, 434, 436, 438, or other electrode configuration provided for forming an MSM device. This configuration is similar to that of FIG. 16A.

Further improvement can be attained by reducing the overall fiber diameter. The relatively low thermal conductivity that is characteristic of the class of polymers that are well-suited as a fiber insulating material ($\kappa$=0.26 W/m-K for PS) contributes to the slow decay time in the fiber thermal response. A reduction in fiber diameter, with a resulting reduction in insulating material volume, can therefore be employed to enhance the thermal conductivity of the fiber. In addition, the thermal response time can be increased by including metallic elements in contact with the MSM semiconducting material to operate as heat sink locations. The thermal conductivity, $\kappa$=66 W/m-K for tin, and therefore provides excellent heat dissipation in the fiber cross section. The fiber arrangement 210 in FIG. 15B, with MSM devices 230, 232 that include electrodes 240 radially inward of the MSM semiconducting material 238 are examples of metallic elements that can operate as heat sinks to increase fiber thermal response time.

It is to be recognized that although in two of the experimental examples above a source of heat to be detected was in physical contact with one or more thermal sensing fibers, such is not required by the invention. As demonstrated by the last example, the thermal sensing fibers of the invention can detect heat that is transferred to the fibers by any of conduction, radiation, or convection heat transfer mechanisms, or a combination of one or more heat transfer mechanisms. Heat to be detected therefore can be captured by radiation, physical contact conduction, or convection, or a set of mechanisms.

Accordingly, it is to be recognized that for some modes of heating, such as radiative heating, the insulating material of the fiber may not appreciably heat up, i.e., the insulating cladding of the fiber may be transparent to the radiation heating. In this example scenario, the semiconductor element is primarily heated by the radiation, and the insulator is not. While the examples and the discussion herein point out particular aspects of a scenario in which the insulating material of the thermal sensing fiber can be heated, such are not meant to be limiting to a particular heating mode. The thermal sensing fiber of the invention requires only that the semiconducting element of the fiber MSM device be exposed to a mode of heating, for sensing that heating; no heat need be provided at the fiber insulator. As a result, a thermal sensing fiber or array of fibers can be employed in a wide range of applications, and are not limited to applications in which physical contact with a thermal source is possible.

With the above description, the invention provides a thermal sensing fiber design and fiber array configuration system, with the thermal sensing fiber produced by the codrawing of a macroscopic preform containing conducting, semiconducting and insulating materials into very long fiber thyrmistors. The electrical conductivity of the thermal sensing fiber of the invention is modified by heat, producing in the fiber an electrical signal that is delivered to the fiber ends. The fibers are light-weight and flexible, and can, consequently, be incorporated into fabrics or any other host structure. This enables large-area temperature sensing at high spatial resolution.

In addition, the ability of the thermal sensing fiber of the invention to integrate in a single common fiber both optical transport functionality and self-monitoring thermal sensing functionality for failure prediction is particularly important for enabling safe and reliable operation for medical, industrial and defense and space applications. Various optoelectronic devices such as fiber-based tunable mid-infrared attenuators and thermo-optic switches are also enabled by the thermal sensing fiber. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A thermal sensing fiber grid comprising:
a plurality of rows of thermal sensing fibers;
a plurality of columns of thermal sensing fibers;
wherein each thermal sensing fiber includes a semiconducting element having a fiber length and being characterized by a bandgap energy corresponding to a selected operational temperature range of the fiber in which there is produced a change in thermally-excited electronic charge carrier population in the semiconducting element in response to a temperature change in the selected temperature range, at least one pair of conducting electrodes being in contact with the semiconducting element along the fiber length, and an insulator along the fiber length with the semiconducting material, conducting electrodes, and insulator each being characterized by a viscosity that is less than about $10^6$ Poise, while maintaining structural material integrity, at a common temperature; and
an electronic circuit for and connected to each thermal sensing fiber for producing an indication of thermal sensing fiber grid coordinates of a change in ambient temperature.

2. The thermal sensing fiber grid of claim 1 further comprising a frame to which each fiber grid row and fiber grid column is connected for acquiring thermally-excited electronic charge carriers.

3. The thermal sensing fiber grid of claim 1 further comprising an analog-to-digital converter for digitizing outputs of the electronic circuits.

4. The photodetecting fiber grid of claim 1 further comprising a processor for formatting an output of each electronic circuit to wirelessly deliver the output to a processing device.

5. The thermal sensing fiber grid of claim 1 further comprising a multiplexer connected to multiplex outputs of the electronic circuits.

6. The thermal sensing fiber grid of claim 1 further comprising a connection for delivering outputs of the electronic circuits to a processing device.

7. The thermal sensing fiber grid of claim 6 wherein the processing device is programmed to compare the outputs of the electronic circuits and determine a grid row having a maximum thermally-excited electronic charge carrier population and a grid column having a maximum thermally-excited electronic charge carrier population, indicating grid coordinates of maximum temperature change.

8. The thermal sensing fiber grid of claim 1 wherein the plurality of rows and plurality of columns of thermal sensing fibers are in a woven layer of fabric.

9. The thermal sensing fiber grid of claim 1 wherein the thermal sensing fibers are woven in an article of clothing.

10. The thermal sensing fiber grid of claim 1 wherein the plurality of rows and plurality of columns of thermal sensing fibers are interleaved.

11. The thermal sensing fiber grid of claim 1 wherein the thermal sensing fibers are embedded in a fabric sheet.

12. The thermal sensing fiber grid of claim 1 wherein the thermal sensing fibers comprise hollow-core fibers.

13. The thermal sensing fiber grid of claim 1 wherein the plurality of rows and plurality of columns of thermal sensing fibers are disposed in a curved geometric shape.

14. The thermal sensing fiber grid of claim 1 wherein the electronic circuit is connected to each thermal sensing fiber for producing a horizontal coordinate and a vertical coordinate specifying a location of a change in temperature.

15. The thermal sensing fiber grid of claim 1 wherein the semiconductor comprises a semiconducting chalcogenide glass.

16. The thermal sensing fiber grid of claim 1 wherein the semiconductor comprises $Ge_xAs_{40-x}Se_yTe_{60-y}$, where $10<x<20$ and $10<y<15$.

17. The thermal sensing fiber grid of claim 1 wherein the semiconductor comprises $Ge_{17}As_{23}Se_{14}Te_{46}$.

18. The thermal sensing fiber grid of claim 1 wherein the semiconductor band gap energy is on the order of $k_B T_0$, where $k_B$ is Boltzmann constant and $T_0$ is a reference temperature of about 37° C.

19. The thermal sensing fiber grid of claim 1 wherein the semiconductor comprises a semiconducting chalcogenide glass selected from the group consisting of $AS_2S_3$ and $As_{40}Se_{60-x}Te_x$.

* * * * *